United States Patent [19]

Makino

[11] Patent Number: 5,473,559
[45] Date of Patent: Dec. 5, 1995

[54] HARDWARE IMPLEMENTED MULTIPLIER

[75] Inventor: Hiroshi Makino, Hyogo, Japan

[73] Assignee: Mitsubishi Denki Kabushiki Kaisha, Tokyo, Japan

[21] Appl. No.: 168,498

[22] Filed: Dec. 22, 1993

[30] Foreign Application Priority Data

Jan. 14, 1993 [JP] Japan .................................. 5-004964

[51] Int. Cl.$^6$ ......................................................... G06F 7/52
[52] U.S. Cl. ........................... 364/758; 364/754; 364/760
[58] Field of Search .................................. 364/754, 760, 364/761, 768, 784, 786, 788, 758

[56] References Cited

U.S. PATENT DOCUMENTS

| | | | |
|---|---|---|---|
| 4,864,528 | 9/1989 | Nishiyama et al. | 364/754 |
| 4,890,127 | 12/1989 | Darley | 364/786 |

FOREIGN PATENT DOCUMENTS

| | | |
|---|---|---|
| 353041 | 1/1990 | European Pat. Off. . |
| 63-182739 | 7/1988 | Japan . |
| 2-300930 | 12/1990 | Japan . |
| 3-177922 | 8/1991 | Japan . |

OTHER PUBLICATIONS

"High–Speed VLSI Multiplication Algorithm With a Redundant Binary Addition Tree", *IEEE Transactions on Computers*, vol. 34, No. 9, Sep. 1985, Takagi et al., pp. 789–796.
"A VLSI–Oriented High–Speed Multiplier Using a Redundant Binary Addition Tree", *Systems Computers Controls*, vol. 14, No. 4, 1983, Takagi et al., pp. 19–28.
"A Fast Multi–Valued SBNR Multiplier", Brain Arnold et al., pp. 738–742.
"A Fast VLSI Adder Architecture", *IEEE Journal of Solid–State Circuits*, May 1992, No. 5, H. R. Srinivas et al., pp. 761–767.
European Search Report.
"A Suggestion for a Fast Multiplier", by C. S. Wallace, IEEE Trans. Electron. Comput. EC–13:14017.
"A 10–NS 54×54–B Parallel Structured Full Array Multiplier with 0.5–um CMOS Technology", by J. Mori et al., IEE Journal of Solid–State Circuits.
"200 MHz 16–Bit BiCMOS Signal Processor", by M. Yamashina et al., IEEE International Solid–State Circuits Conference.
"High–Speed MOS Multiplier and Divider Using Redundant Binary Representation and Their Implementation in a Microprocessor", by Shigeo Kuniobu et al., IEICE Trans., Electron.

*Primary Examiner*—Roy N. Envall, Jr.
*Assistant Examiner*—Emmanuel L. Moise
*Attorney, Agent, or Firm*—Lowe, Price, LeBlanc & Becker

[57] ABSTRACT

A sign inverting Booth encoder included in an encoding circuit generates a control signal designating a partial product having a sign different from that designated by an output signal generated from a conventional Booth encoder. A partial product generating circuit generates a partial product according to the control signal from the encoding circuit. A partial product having a sign inverted or non-inverted is generated from a shifter/inverter circuit. A converting circuit generates three-value redundant binary numbers using a sign inverted partial product and a sign non-inverted partial product as a set. An intermediate sum generating circuit performs a redundant binary addition of the three-value redundant binary numbers to generate a final redundant binary number. A final adding circuit converts the finally generated three-value redundant binary number into an ordinary binary number to generate a product Z of binary numbers X and Y. As a result, a multiplier performing multiplication at a high speed with a smaller number of elements is implemented.

36 Claims, 35 Drawing Sheets

FIG.2A $$A = a_{n-1} \quad a_{n-2} \quad a_{n-3} \quad \cdots \quad a_0$$
$$-)\ B = b_{n-1} \quad b_{n-2} \quad b_{n-3} \quad \cdots \quad b_0$$
$$A - B = (a_{n-1}\ b_{n-1})\ (a_{n-2}\ b_{n-2})\ (a_{n-3}\ b_{n-3}) \cdots (a_0\ b_0)$$

FIG.2B $$(a_i\ b_i) \equiv a_i - b_i$$

$$= \begin{cases} 1 : a_i = 1,\ b_i = 0 \\ 0 : a_i = b_i \\ -1 : a_i = 0,\ b_i = 1 \end{cases}$$

| $y_{j+1}$ | $y_j$ | $y_{j-1}$ | PARTIAL PRODUCT | CONTROL SIGNAL |
|---|---|---|---|---|
| 0 | 0 | 0 | 0    (0) | $\phi 0$ |
| 0 | 0 | 1 | -X   (X) | $\phi X, \phi IV$ |
| 0 | 1 | 0 | -X   (X) | $\phi X, \phi IV$ |
| 0 | 1 | 1 | -2X  (2X) | $\phi 2X, \phi IV$ |
| 1 | 0 | 0 | 2X   (-2X) | $\phi 2X$ |
| 1 | 0 | 1 | X    (-X) | $\phi X$ |
| 1 | 1 | 0 | X    (-X) | $\phi X$ |
| 1 | 1 | 1 | 0    (0) | $\phi 0$ |

| ai | bi | ei⁺ | ei⁻ |
|---|---|---|---|
| 0 | 0 | 0 | 0 |
| 0 | 1 | 0 | 1 |
| 1 | 0 | 1 | 0 |
| 1 | 1 | 0 | 0 |

FIG.12A
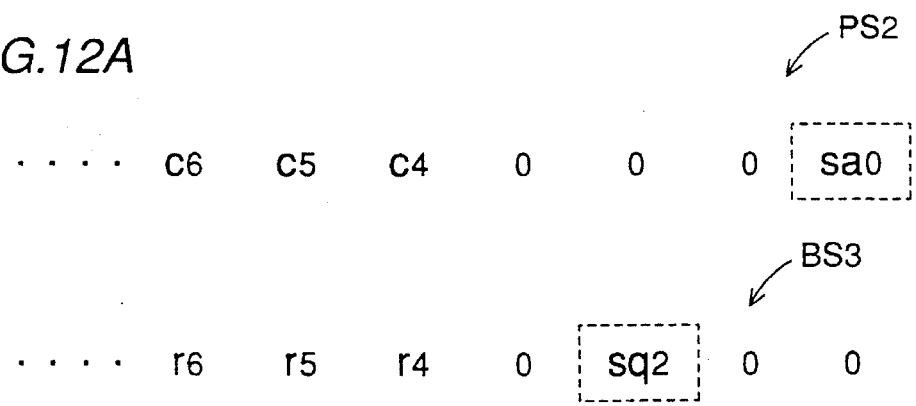
FIG.12B
$$(h_4^+ \quad h_4^-) + (sc4 \quad 0) \rightarrow$$
$$(h_6^+ \quad h_6^-) + (0 \quad sr6) \rightarrow$$
FIG.12C
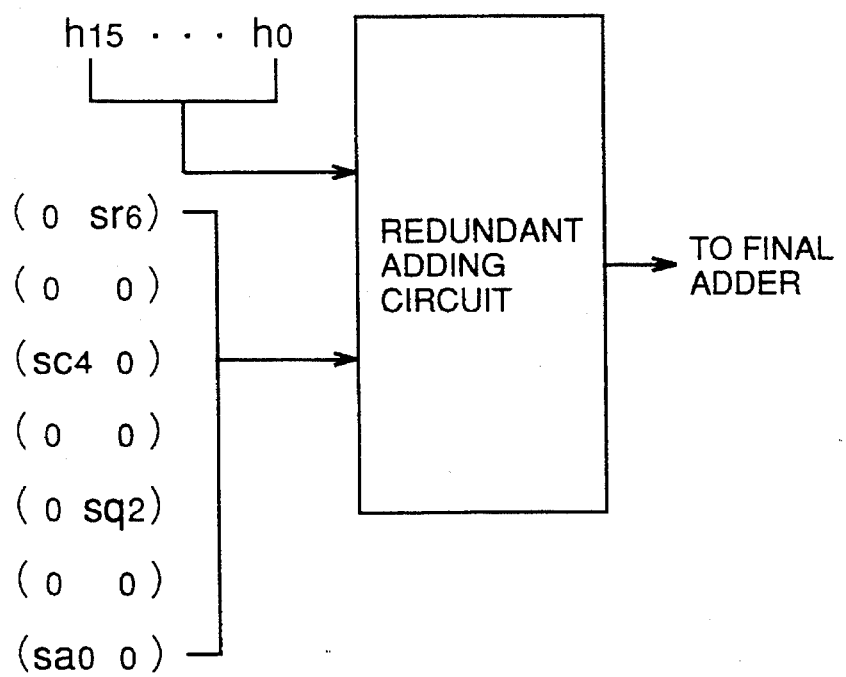

/(IN1 · IN2)=OUT

OUT=/IN

| $y_{2i+2}$ | $y_{2i+1}$ | $y_{2i}$ | PARTIAL PRODUCT |
|---|---|---|---|
| 0 | 0 | 0 | 0 |
| 0 | 0 | 1 | X |
| 0 | 1 | 0 | X |
| 0 | 1 | 1 | 2X |
| 1 | 0 | 0 | -2X |
| 1 | 0 | 1 | -X |
| 1 | 1 | 0 | -X |
| 1 | 1 | 1 | 0 |

*FIG.39* PRIOR ART

HARDWARE IMPLEMENTED MULTIPLIER

BACKGROUND OF THE INVENTION

1. Field of the Invention

The present invention generally relates to multipliers for carrying out multiplication of binary numbers, and more particularly, to a multiplier configured of electronic circuitry including a semiconductor device.

2. Description of the Background Art

When multi-bit binary numbers X and Y are multiplied, a Booth algorithm is often used to reduce the number of partial products to be produced, and to carry out multiplication efficiently. The Booth algorithm is a method for multiplying negative numbers in a complement notation without correction.

In the Booth algorithm, data bits of a multiplier Y are divided into groups. FIG. 30 shows an example of group division of multiplier Y. In FIG. 30, group division with respect to the second order Booth algorithm is shown. Each group includes three data bits. One is shared between adjacent groups (shown by hatching in FIG. 30). One partial product is generated by one group. The number of partial products is approximately one half in the case of the second order Booth algorithm. In general, when one group includes m bits, it is called the (m−1)-th order Booth algorithm, and the number of partial products to be generated is approximately $1/(m−1)$. Description will be given of the Booth algorithm with reference to equations.

Multiplier Y is represented by the following equation (1) in a two's complement format.

$$Y = -y_n \cdot 2^{n-1} \sum_{i=1}^{n-1} y_i \cdot 2^{i-1} \quad (1)$$

In the equation (1), $Y_n$ is a sign bit, which indicates whether multiplier Y is positive or negative. A data bit $y_i$ is a binary value (1 or 0). $2^i$ attached to each bit is binary weighting of each data bit.

In the equation (1), when n is an even number and $y_0=0$, multiplier Y is developed as shown in the following equation (2).

$$\begin{aligned} Y &= -y_n \cdot 2^{n-1} + y_{n-1} \cdot 2^{n-2} + \ldots + y_2 \cdot 2^1 + y_1 \cdot 2^0 \quad (2) \\ &= (y_{n-2} + y_{n-1} - 2 \cdot y_n) \cdot 2^{n-2} + \\ &\quad (y_{n-4} + y_{n-3} - 2 \cdot y_{n-2}) \cdot 2^{n-4} + \\ &\quad \vdots \\ &\quad (y_0 + y_1 - 2 \cdot y_2) \cdot 2^0 \\ &= \sum_{i=0}^{\frac{n}{2}-1} (y_{2i} + y_{2i+1} - 2 \cdot y_{2i}) \cdot 2^i \end{aligned}$$

wherein y=0, and n is an even number.

A product X·Y of multiplier Y and a multiplicand X is given by the sum of partial products:

$$(y_{2i}+y_{2i+1}-2 \cdot y_{2s+2}) \cdot 2^{2i} \cdot X.$$

Therefore, when values of three bits $y_{2i}$, $y_{2i+2}$, and $y_{2i+2}$ are given, the operation required for generation of the partial products is determined. The relationship between the bit values of the three bits $y_{2i}$, $y_{2i+1}$ and $y_{2i+2}$, and the operation to be carried out is shown in FIG. 31.

As is clearly seen from FIG. 31, the operations to be carried out in the second order Booth algorithm are 0, ±X and ±2X. Two times multiplicand X, that is, 2·X, is generated by a shift circuit shifting the multiplicand by one bit in the more significant bit direction. Since multiplicand X is in a two's complement format, the "−" operation is implemented by inverting each bit value and adding one to the least significant bit. Therefore, if the operation to be carried out is determined by the values of three bits of multiplier Y, it is possible to carry out the product operation at a high speed.

FIG. 32 is a diagram showing the entire configuration of a conventional multiplier disclosed in, for example, Japanese Patent Laying-Open No. 3-177922. The multiplier carries out multiplication of 8-bit multiplier Y represented in a two's complement by 8-bit multiplicand X represented in a two's complement according to the second order Booth algorithm.

Referring to FIG. 32, the multiplier includes an encoding circuit 500 generating a control signal designating the operation to be carried out for each group according to bits of each bit group of multiplier Y, and a partial product generating circuit 502 responsive to the control signal from encoding circuit 500 to carry out the designated operation for multiplicand X to generate a partial product group.

Encoding circuit 500 includes Booth encoders 1, 2, 3 and 4 provided for every group of three bits of multiplicand X. The ground potential is applied to the input of Booth encoder 1, since the least significant bit is set to 0 in the second order Booth algorithm.

Partial product generating circuit 502 includes shifter/inverter circuits 9, 10, 11 and 12 including shifters and inverters responsive to control signals applied onto signal lines (bus configuration including a plurality of signal lines) from encoding circuit 500 for respectively carrying out operations for multiplicand X to generate partial products.

The multiplier further includes Wallace tree adding circuit 17 having a Wallace tree type adder arrangement adding four partial products (applied onto buses 13, 14, 5 and 16) generated from partial product generating circuit 502 to generate an intermediate addition result, and a final adder 19 adding a pair of 16-bit data (applied onto a bus 18) showing the intermediate addition result from Wallace tree adding circuit 17. A 16-bit (z0–z15) binary number Z represented in a two's complement showing the product X·Y of multiplier Y and multiplicand X is provided from final adder 19. The operation will now be described.

Multiplier Y is applied to encoding circuit 500, and multiplicand X is applied to partial product generating circuit 502. Each of Booth encoders 1 to 4 included in encoding circuit 500 generates a control signal for designating the operation to be carried out according to the relationship shown in FIG. 31 from given adjacent three bits $y_{y+1}$ $y_j$, and $y_{j-1}$ (where j=1 to 6).

Each of shifter/inverter circuits 9 to 12 provided corresponding to Booth encoders 1 to 4 has a configuration as shown in FIG. 33, and generates a partial product from multiplicand X based on control signals 5 to 8 given.

FIG. 33A shows shifter/inverter circuit 9. Other shifter/inverter circuits 10 to 12 have the same configuration. Shifter/inverter circuit 9 receives control signal 5 applied from corresponding Booth encoder 1. Control signal 5 includes control signals φ0, φX, φ2X, and φIV. A bus and a signal thereon are denoted by the same reference characters.

The control signal φ0 designates the "0 operation". The control signal φX designates the "X operation". The control signal φ2X designates the "2X operation". The control signal φIV designates the "–operation". The Booth encoder selectively brings the control signals φX, φ2X, and φIV into an active state according to the result of the encoding.

When the control signal φ0 is applied, shifter/inverter circuit 9 sets all bits of multiplicand X to "0". When the control signal φX is applied, shifter/inverter circuit 9 does not carry out the operation for multiplicand X. When the control signal φ2X is applied, shifter/inverter circuit 9 shifts multiplicand X by one bit to the more significant bit side to carry out the operation of 2·X. When the control signal φIV is brought into an active state, shifter/inverter circuit 9 inverts each bit value of the intermediate data generated based on the control signal φX or φ2X, and adds 1 to the least significant bit. As a result, the result subjected to any operation of 0, ±X, and ±2X in response to the control signals φ0, φX, φ2X, and φIV is provided from shifter/inverter circuit 9 as a partial product.

FIG. 33B is a diagram showing the functional configuration of shifter/inverter circuit 9. In FIG. 33B, the shifter/inverter circuit includes a 0 generator 610 setting all bit values of multiplicand X to 0, an X generator 612 passing multiplicand X without carrying out any operation, a 2X generator 614 shifting each bit of multiplicand X by one bit in the more significant bit direction to generate 2·X, a logic gate 618 for inverting or non-inverting each bit value of the output of X generator 612 and a logic gate 620 for inverting or non-inverting each bit value of the output of 2X generator 614 in response to the control signal φIV.

Logic gate 618 includes an EXOR gate provided for each bit of the output of X generator 612. Logic gate 620 includes an EXOR circuit provided corresponding to each bit of the output of 2X generator 614. The EXOR circuit serves as an inverter circuit when the control signal φIV is brought into an active state of an "H" level, and serves as a buffer circuit when the control signal φIV is at an "L" level.

Shifter/inverter circuit 9 further includes a 1 generator 616 generating a bit value "1" in response to the control signal φIV, and a selection gate 622 passing the outputs of 0 generator 610, logic gate 618, and logic gate 620 therethrough in response to the control signals φ0, φX, and φ2X, respectively. Selection gate 622 includes a transfer gate 621 passing the output of 0 generator 610 therethrough in response to the control signal φ0, a transfer gate 623 passing the output of logic gate 618 therethrough in response to the control signal φX, and a transfer gate 625 passing the output of logic gate 620 therethrough in response to the control signal φ2X.

1 generator 616 generates the bit value "1" when the control signal φIV is brought into an active state. More specifically, when the "–" operation is carried out, the bit value "1" is generated, which becomes a correction bit at the time of the sign inverting operation. Since the correction bit attains "1" when the "–" operation, that is, the sign inverting operation is carried out, the correction bit also serves as an indication bit indicating coincidence/non-coincidence of signs between multiplicand X and partial products generated therefrom.

Four partial products 13 to 16 generated in partial product generating circuit 502 (cf. FIG. 1) are added in Wallace tree adding circuit 17 having the configuration shown in FIG. 34.

Referring to FIG. 34, Wallace tree adding circuit 17 includes two-stage full adding circuits 17a and 17b. Although full adding circuits 17a and 17b respectively include 3-input/2-output full adders provided corresponding to each digit of a partial product, full adders 21, 22, 23, 24, 25 and 26 provided corresponding to the (i−1)-th digit, the i-th digit, and the (i+1)-th digit of the partial product are shown. Each of full adders 21 to 26 adds three inputs to generate a carry output CO and a sum output S showing the addition result. Full adder circuit 17a of the first stage adds three partial products 13 to 15, and full adder circuit 17b of the second stage adds the output of full adder circuit 17a of the first stage and partial product 16. In FIG. 34, respective bit values of partial products 13 to 15 are shown by aj, bj and cj, and the bit value of fourth partial product 16 is shown by dj.

In the Wallace tree configuration, the carry output of the full adder of the first stage is applied to a first input of the full adder at a one bit more significant digit of the full adding circuit of the second stage, and the sum output is applied to the input of the full adder at the same digit of the full adding circuit of the second stage. For example, full adder 23 provided in the i-th digit adds three bits ai, bi, and ci, provides the carry output CO to the input of full adder 26 of the next stage, and its sum output to the input of full adder 24.

Full adder 24 included in full adding circuit 17b of the second stage receives the sum output S of full adder 23 provided in the i-th digit, the bit di of partial product 16, the carry output CO of full adder 21 in the (i−1)-th digit of full adding circuit 17b of the first stage, to generate the carry output $CO_{i+1}$ and the sum output Si. The operation is carried out with respect to each digit of the partial product to reduce data of four bits ai, bi, ci, and di to two bits of COi and Si. In other words, four partial products 13 to 16 are reduced to two 16-bit data (S and CO).

Two 16-bit data S and CO of the intermediate stage generated as described above are added by a final adder 19 having the configuration shown in FIG. 35, to generate a 16-bit (z15–z0) data Z indicating the product X·Y.

Referring to FIG. 35, final adder 19 includes a carry lookahead unit 19a predetermining whether a carry is produced, and an adding portion 19b adding the carry output of carry look head unit 19a and two 16-bit data S and CO.

Carry lookahead unit 19a includes a first carry lookahead circuit (CLA) 37 provided for least significant four bits CO0 to CO3 and S0 to S3 of two 16-bit data CO and S, a second carry lookahead circuit 38 provided for intermediate four bits CO4 to CO7 and S4 to S7 of two data CO and S, and a third carry lookahead circuit 39 provided for most significant four bits CO8 to CO11 and S8 to S11 of two data CO and S. A carry generation signal G0 is generated from first carry lookahead circuit 37. A carry generation signal G and a carry propagation signal P are generated from second and third carry lookahead circuits 38 and 39.

Carry lookahead unit 19a further includes a fourth carry lookahead circuit 40 receiving outputs of first and second carry lookahead circuits 37 and 38 to generate a carry CC1, and a fifth carry lookahead circuit 41 receiving outputs of first, second and third carry lookahead circuits 37, 38 and 39 to generate a carry $CC_2$.

The specific configuration and operations of a carry lookahead circuit are described in, for example, "PRINCIPLES OF CMOS VLSI DESIGN", N. H. E. Weste, et al., published by Addison-Wesley, Inc., 1985, pp 320 and 321. However, the operational principle will now be described briefly.

In general, the i-th bit carry $C_i$ is represented by the following equations (3) to (5) using two inputs $S_i$ and $CO_i$, and a carry $C_{i-1}$ at a less significant bit (that is, the (i−1)-th digit).

$$C_i = S_i \cdot CO_i + (S_i \oplus CO_i) \cdot C_{i-1} \quad (3)$$
$$= g_i + P_i \cdot C_{i-1}$$

where $$g_i = S_i \cdot CO_i \quad (4)$$

$$P_i = S_i \oplus CO_i \quad (5)$$

In the configuration shown in FIG. 35, the 16-bit data is divided by four bits into four sets. A control signal for finding a carry is generated in each set. By using the generated control signal, carries of up to the fourth bit, the eighth bit, and the twelfth bit are found in a lookahead manner. First carry lookahead circuit 37 generates carries regarding least significant four bits. The carry CC0 generated by carry lookahead circuit 37 is given by the following equation (6) based on the equation (3).

$$\begin{aligned} CC0 &= g3 + p3 \cdot (g2 + p2(g1 + p1(g0 + p0 \cdot C - 1))) \quad (6) \\ &= g3 + p3 \cdot g2 + p3 \cdot p2 \cdot g1 + p3 \cdot p2 \cdot p1 \cdot g0 + \\ &\quad p3 \cdot p2 \cdot p1 \cdot p0 \cdot C_{-1} \\ &= G0 + P0 \cdot C_{-1} \end{aligned}$$

where $$G0 = g3 + p3 \cdot g2 + p3 \cdot p2 \cdot g1 + p3 \cdot p2 \cdot p1 \cdot g0 \quad (7)$$

$$P0 = p3 \cdot p2 \cdot p \cdot p0 \quad (8)$$

In the equations, $C_{-1}$, a carry input for the least significant bit, is 0 here. Therefore,

CC0=G0 (9)

More specifically, first carry lookahead circuit 37 finds the carry output CC0 of the fourth bit according to the equation (7). Second and third carry lookahead circuits 38 and 39 have the same configuration. According to the above-described equations (4), (5), (7) and (8), second carry lookahead circuit 38 generates for inputs S4 to S7 and CO4 to CO7

$$G1 = g7 + p7 \cdot g6 + p7 \cdot p6 \cdot G5 + p7 \cdot p6 \cdot p5 \cdot G4 \quad (10)$$

$$P1 = p7 \cdot p6 \cdot p5 \cdot p4 \quad (11)$$

Similarly, third carry lookahead circuit 39 generates, for inputs S8 to S11 and CO8 to CO11, $$G2 = g11 + p11 \cdot g10 + p11 \cdot p10 \cdot G9 + p11 \cdot p10 \cdot p9 \cdot G8 \quad (12)$$

$$P2 = p11 \cdot p10 \cdot p9 \cdot p8 \quad (13)$$

Fourth carry lookahead circuit 40 generates the carry output CC1 of the eighth bit from the outputs CC0, G1 and P1 of first and second carry lookahead circuits 37 and 38 according to the following equation (14).

$$CC1 = G1 + P1 \cdot CC0 \quad (14)$$

Fifth carry lookahead circuit 41 generates the carry output CC2 of the twelfth bit from the outputs CC0, G1, P1, G2 and P2 of first to third carry lookahead circuits 37 to 39 according to the following equation (15).

$$CC2 = G2 + P2 \cdot G1 + P2 \cdot P1 \cdot CC0 \quad (15)$$

According to such configuration, it is possible to find the carry outputs CC0, CC1 and CC2 for every four bits in parallel.

Adding portion 19b includes four ripple adders (RA) 42 to 45 provided for respective groups of four bits of two inputs S and CO. Ripple adder 42 adds bits S0 to S3 and CO0 to CO3 to generate 4-bit data z0 to z3. Ripple adder 43 receives the carry CC0, and adds bits S4 to S7 to CO4 to CO7 to generate 4-bit data z4 to z7. Ripple adder 44 receives the carry CC1, and adds bits S8 to S11 and CO8 to CO11 to generate 4-bit data z8 to z11. Ripple adder 45 receives the carry CC2, and adds bits S12 to S15 and CO12 to CO15 to generate 4-bit data z12 to z15.

Each of ripple adders 42 to 45 has the same configuration. As is shown in FIG. 36, each of ripple adders 42 to 45 includes four full adders 650-0 to 650-3. In the ripple adder, a carry output $C_{out}$ of the full adder on the side of less significant bits is applied to a carry input C on the side of more significant bit. In other words, in the ripple adder, the carry output Cout of the full adder provided at the least significant bit is sequentially transmitted as a carry input to more significant bits. The carry output of full adder 650-3 provided at the most significant bit position has already been found by carry lookahead portion 19a. Carry propagation can amount to three stages of full adders, whereby delay with carry propagation is reduced and the operation speed is increased.

By ripple adders 42 to 45 as shown in FIG. 35, respective data bits z15 to z0 of the product X·Y are provided in parallel.

One example of the configuration of the full adder included in Wallace tree adding circuit 17 and final adder 19 is shown in FIG. 37. Referring to FIG. 37, the full adder includes an AND circuit 27 receiving inputs A and B, an AND circuit 28 receiving inputs B and C, an AND circuit 29 receiving inputs A and C, a 3-input OR circuit 30 receiving outputs of AND circuits 27 to 29, an XOR circuit 31 receiving inputs A and B, and an XOR circuit 32 receiving the output of XOR circuit 31 and the input C. OR circuit 30 provides the carry Cout, and XOR circuit 32 generates the sum output Sout. The full adder generates the carry and the sum according to the following equation.

$$Cout = A \cdot B + B \cdot C + C \cdot A$$

$$Sout = A \oplus B \oplus C$$

The XOR circuit carries out the operation of V·/W+/V·W for two inputs V and W. More specifically, the XOR circuit carries out the AND operation and the subsequent OR operation equivalently, and the delay time thereof is larger than those of the AND circuit and the OR circuit. Therefore, the delay time of the full adder of the configuration shown in FIG. 37 is determined by the delay time of two stages of XOR circuits. Wallace tree adding circuit has each bit configured of two-staged full adders. Therefore, the delay time in the Wallace tree adding circuit is the delay time of four-stages of XOR circuits.

FIG. 38 is a diagram showing a general configuration of AND circuit. In FIG. 38, the full adder includes p channel MOS transistors Tr1 and Tr2 provided in parallel between a power supply potential Vcc supply node and an internal node ND and receiving inputs B and A at their gates, n channel MOS transistors Tr3 and Tr4 connected in series between the node ND and the ground potential and receiving inputs A and B at their gates, and an inverter circuit configured of complementary-connected p channel MOS transistors Tr5 and Tr6 for inverting the potential on the node ND. More specifically, the AND circuit includes six transistors. The 3-input OR circuit requires six transistors in total as output charging transistors and output discharging transistors. The XOR circuits requires at least two AND circuits and one OR circuit. More specifically, the full adder requires 30 or more transistors when it is configured of MOS transistors.

60 or more transistors in total are required for one bit in the Wallace tree adding circuit because of the two-staged full adders. Therefore, the circuit scale became large, and the delay in the circuit became large, which hampered high speed multiplication.

In particular, multiplication is an important operation element in a computer system. The speed of multiplication determines the operation speed of the entire system in scientific and technological computation, image processing or the like. Therefore, a high speed operation is required for the multiplier. The requirement for the high speed operation is further increased. However, since the delay in the full adder in the structure of the conventional Wallace tree adding circuit and the final adding circuit was large, it was not possible to implement intended high speed multiplication.

In the case of the Wallace tree adding circuit, a 3-input/2-output full adder is used. In this case, as shown in FIG. 34, a signal line transmitting each bit value of a partial product extends over the full adder. When the numbers of bits of a multiplier and a multiplicand to be processed are increased, the number of partial products increases accordingly. In this case, the number of stages of the full adding circuits increases, and little regularity is observed in interconnection when the output of the full adder is connected to the full adder of the next stage (in the case of the 3-input 2-output full adder, the direction in which the output extends is not determined). Since an extremely complicated arrangement of interconnection is required, the time for layout designing is increased.

FIG. 39 is a diagram showing partial products generated at the time of multiplication of multiplier Y and multiplicand X and a product result thereof. Correction bits sa0, sb2, sc4, and sd6 are generated for partial product 13 to 16, respectively. By adding partial products 13 to 16 and correction bits 33 to 36, the product Z is generated. In actual addition, correction bits may be inserted at corresponding bit positions of partial products on the more significant bit side for addition, and the correction bit sd6 may be separately added finally. Data (sd6, 0, sc4, 0, sb2, 0, sa0) generated from correction bits 33 to 36 may be added as one partial product.

As shown in FIG. 39, the same bit values are repeatedly disposed on the upper bits of the partial products. In a two's complement notation, when the most significant bit of the partial product is 1, which indicates a negative number, a bit value of bits higher than the most significant bit must be 1. This is because the negative number must take an inverted value of each bit value in a two's complement notation. For example, when the ninth bit value a8 in partial product 13 is 1, the partial product is a negative number. When partial product 13 is represented in 16 bits, the tenth and more significant bits must be all 1.

Therefore, when the partial product is represented in two's complement, it is necessary to add extra bits toward the upper bits. In order to process the added bits, the full adder is needed in the Wallace tree adding circuit, which causes a scale of the device and an area of layout to increase.

SUMMARY OF THE INVENTION

An object of the present invention is to provide a multiplier which can carry out multiplication at a high speed.

Another object of the present invention is to provide a multiplier having a small number of components.

A still another object of the present invention is to provide a multiplier having a small occupied area.

The main characteristic of the multiplier according to the present invention is a structure in which positive/negative of a part of partial products to be generated is inverted, a redundant binary number is generated from partial product with a sign non-inverted and a partial product with sign inverted, the redundant binary number is added to generate an intermediate sum, and then the redundant binary number representing the intermediate sum is converted into an ordinary binary number to obtain a product.

Specifically, the multiplier according to the present invention includes partial product generating circuitry generating a plurality of partial products from a first multi-bit binary number and a second multi-bit binary number. The partial product generating circuitry inverts signs indicating positive/negative of a part of a plurality of partial products generated, and non-inverts signs of the remaining thereof, to generate final partial products.

The multiplier further includes redundant binary number generating circuitry generating a plurality of multi-bit redundant binary numbers from a plurality of partial products so that one redundant binary number is generated from one sign inverted partial product and one sign non-inverted partial product, redundant adding circuitry redundant binary adding the plurality of multi-bit redundant binary numbers to finally generate one redundant binary number, and final product generating circuitry converting the one redundant binary number finally generated into an ordinary binary number to generate a multi-bit binary number representing a product of the first multi-bit binary number and the second multi-bit binary number.

In the multiplier according to the present invention, a partial product is converted into a redundant binary number to generate an intermediate sum. Since the number of operations to be carried out at the time of generating the intermediate sum is reduced, operations at a high speed multiplication can be implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B are diagrams for explaining a redundant binary number used in the present invention.

FIGS. 12A to 12C are diagrams showing a method of adding a correction bit produced in a sign inverted partial product.

FIG. 39 is a diagram for explaining problems of the conventional multiplier.

DESCRIPTION OF THE PREFERRED EMBODIMENTS

Figure 1:
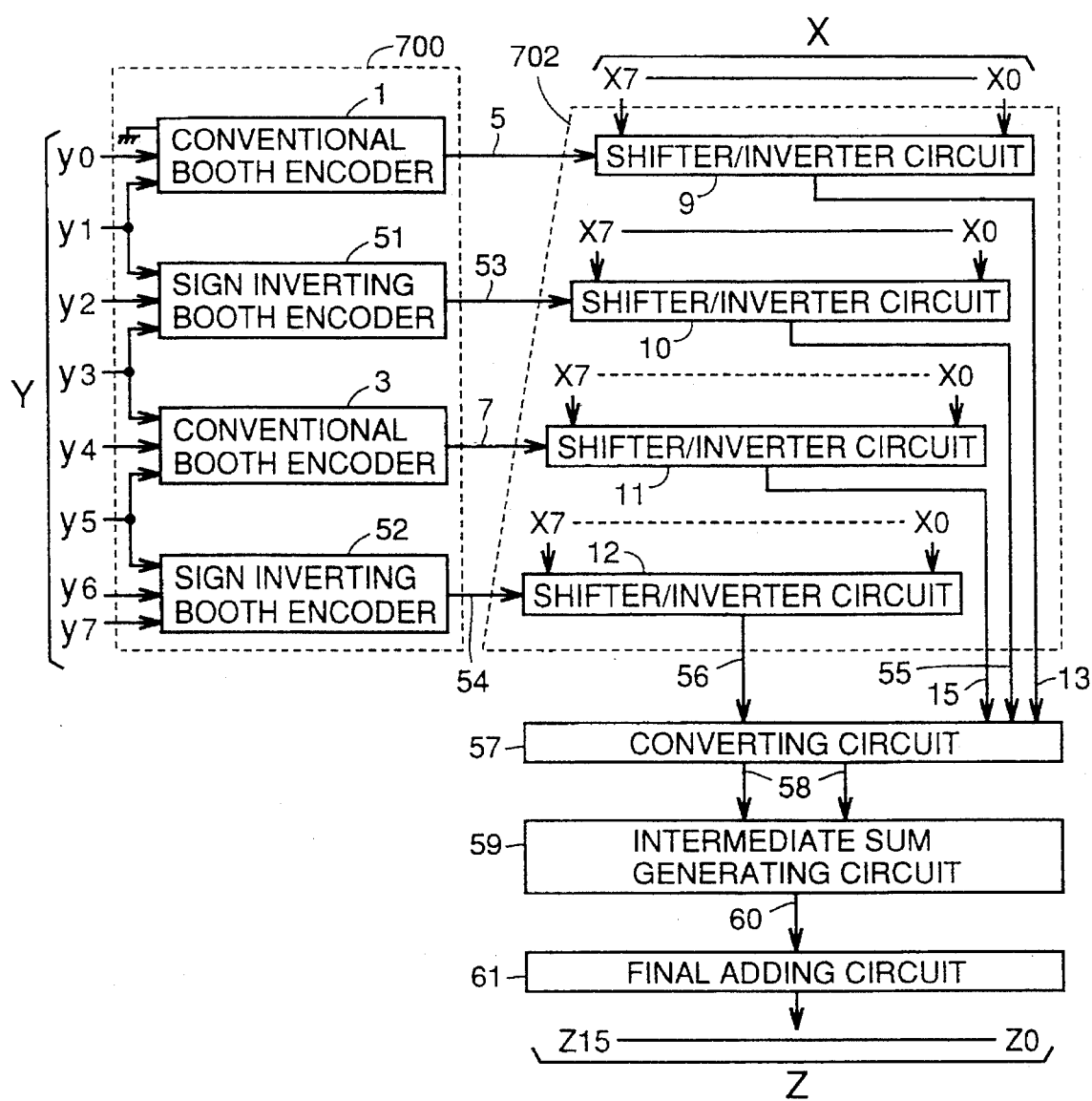
FIG. 1 is a diagram showing the entire structure of a multiplier according to a first embodiment of the present invention.

Before explaining a specific structure of the multiplier according to the present invention, the principle on which the multiplier of the present invention is based will be described.

Consider the difference between an n bit binary number $A=(a_{n-1}, \ldots a_0)$ and an n bit binary number $B=(b_{n-1}, \ldots b_0)$. Generally, the difference is obtained by finding a complement of the binary number B to add the complement to A. Positive/negative of the subtraction result is determined based on presence or absence of a carry from the most significant digit. In the present invention, as shown in FIG. 2A, the difference A–B between the two binary numbers A and B is represented by a bit value pair $(a_i\ b_i)$ of corresponding digits of two binary numbers A and B. If it is defined that $(a_i\ b_i)=a_i-b_i$, as is shown in FIG. 2B, when $(a_i\ b_i)=(0, 1)$, the difference is –1, when $(a_i\ b_i)=(0, 0)$ or $(1, 1)$, the difference is 0, and when $(a_i\ b_i)=(1, 0)$, the difference is 1. More specifically, when the difference A–B is represented by the bit value pairs, as shown in FIG. 2A, the difference can be regarded as a redundant binary number, the each respective bit value of which assumes three values of –1, 0 and 1. In other words, in the difference A–B between the two binary numbers A and B, when pairs of corresponding bits of binary number are formed, and the difference between bits in each pair is considered to be a value of the corresponding bit of the difference, and therefore the difference A–B can be regarded as one redundant binary number. The present invention makes effective use of the concept of a redundant binary number.

Consider four partial products PS0, PS1, PS2, and PS3 generated in the process of multiplication of 8-bit multiplier y and 8-bit multiplicand X. The final goal is to find the sum of PS0+PS1+PS2+PS3.

Invert signs of partial products PS1 and PS3, and then consider sets of the sign inverted partial product and the sign non-inverted partial product, or (PS0, –PS1) and (PS2, –PS3). The product X·Y is given by:

$$X \cdot Y = \{PS0-(-PS1)\}+\{PS2-(-PS3)\}$$

If the sign inverted partial products –PS1 and –PS3 are represented by BS1 and BS3, respectively, the product X·Y is given by the following expression:

(PS0–BS1)+(PS2–BS3)

If the above concept of the redundant binary number is applied, the product X·Y can be obtained by finding the sum of the following two redundant binary numbers W and V.

$$W = PS0 - BS1$$

$$V = PS2 - BS3$$

When the property of the redundant binary number is considered, the following relation is obtained:

$$1\ldots 1111 \qquad 0\ldots 0000$$
$$\Longleftrightarrow$$
$$1\ldots 1111 \quad (=) \quad 0\ldots 0000$$

In the above, the double arrow indicates that the right side and the left side are equal. This is obtained by the relation of $$(1\cdots 1111) - (1\cdots 1111) = (0\cdots 0000) - (0\cdots 0000)$$

The following relation is also obtained $$0\ldots 0000 \qquad 0\ldots 0001$$
$$\Longleftrightarrow$$
$$1\ldots 1111 \quad (=) \quad 0\ldots 0000$$

This is obtained from the relation of $(0\cdots 0000) = (1\cdots 1111) + (0\cdots 0001)$, provided that a carry is ignored. From another standpoint, this is obtained by the relation of $(1\cdots 1111) = -(0\cdots 0001)$ in a two's complement representation.

Based on the similar concept, the following relation is further obtained.

$$1\ldots 1111 \qquad 0\ldots 0000$$
$$\Longleftrightarrow$$
$$0\ldots 0000 \quad (=) \quad 0\ldots 0001$$

Figure 39:
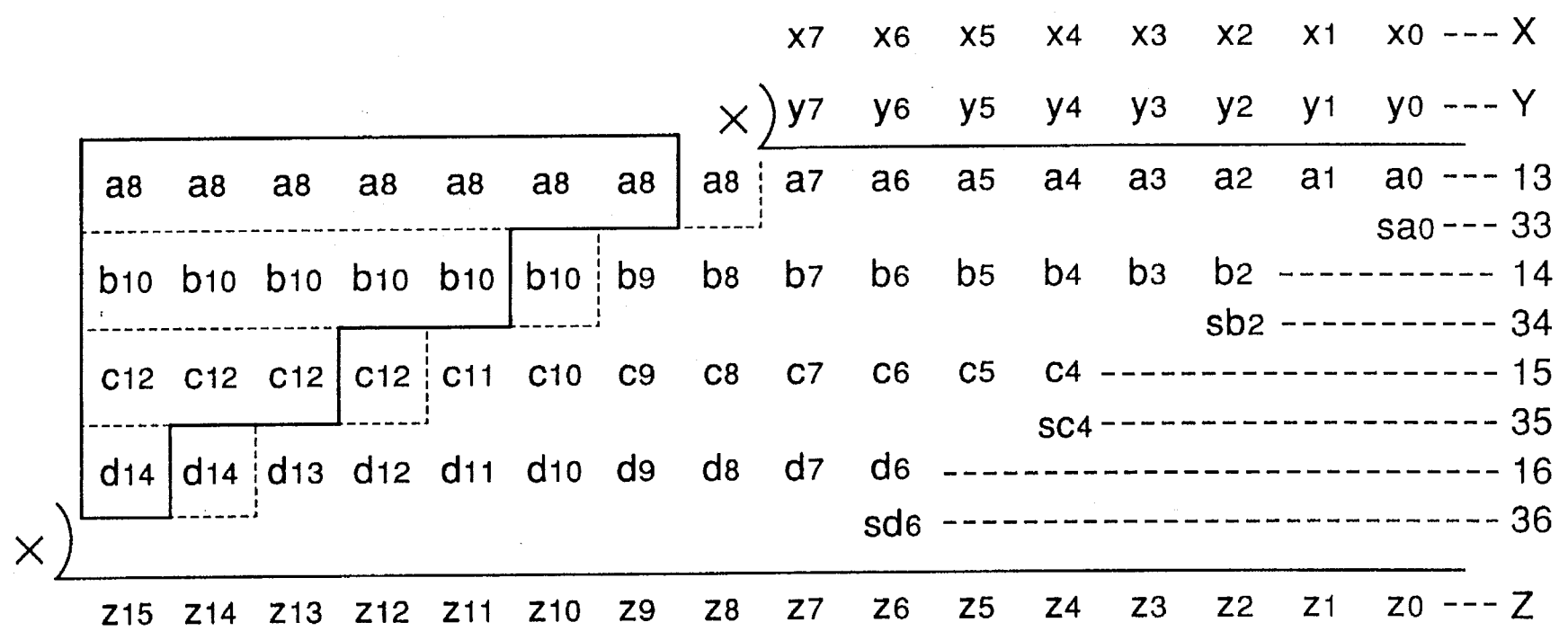

By making use of the concept, it is possible to set values of upper bits to 0 in partial products represented in a two's complement. More specifically, in the partial products shown in FIG. 39, some of most significant bits in which the same value continues can be converted into "0". The numeral value "0" does not affect multiplication at all. Therefore, it is not necessary to provide an adding circuit for this portion.

Then, a redundant binary bit (11) is converted into a redundant binary bit (00). As a result, a three-value redundant binary bit of (00), (10), and (01) is generated as a redundancy binary bit (ai bi). Three-value redundant binary bits ($ei^+$ $ei^-$) and ($fi^+$ $fi^-$) generated as described above are added according to the following equations (21) to (26) to generate a redundant binary number representing an intermediate sum.

$$\begin{cases} hi^+ = \alpha i \cdot \beta_{i-1} \\ hi^- = /\alpha i \cdot /\beta_{i-1} \end{cases} \qquad (21)(22)$$

where, $$\alpha i = \gamma i \oplus l_{i-1} \qquad (23)$$

$$\beta i = (ei^+ + fi^+) \cdot /\gamma i + l_{i-1} \cdot \gamma i \qquad (24)$$

$$\gamma = (ei^+ + ei^-) \oplus (fi^+ + fi^-) \qquad (25)$$

$$li = /(ei^- + fi^-) \qquad (26)$$

As clearly shown from the equations (21) to (26), when redundant binary bits $hi^+$ (referred to as "upper bit") and $hi^-$ (referred to as "lower bit") are generated, only signals transmitted from a one-bit lower redundant binary adding circuit are signal li and signal $\beta i$. These bit values $\beta i$ and li are determined in parallel if redundant binary bits ($ei^+$ $ei^-$) and ($fi^+$ $fi^-$) to be added are applied. Therefore, it is possible to substantially reduce the delay caused by carry propagation, and to generate an intermediate sum at a high speed. In the above equations, the sign "/" denotes inversion of a bit value hereinafter. The sign "/" attached in front of ( ) denotes inversion of the entire operation within ( ).

The algorithm of addition given by the equations (21) to (26) can be confirmed by a truth table. Note that redundant binary bit (11) is converted into (00) and that a carry includes "−1".

When redundant binary bits ($ei^+$ $ei^-$) and ($fi^+$ $fi^-$) are represented by ei and fi, respectively, parameters yi and $\beta i$ assume 1 under the following conditions:

For $\gamma i$, ei=0 and fi=1 or −1; ei=1 or −1 and fi=0.

Parameter $\beta i$ changes according to the value of $\gamma i$. With $\gamma i = 1$, when both $e_{i-1}$ and $f_{i-1}$ are 0 or 1, $\beta i = 1$.

With $\gamma i = 0$, when at least one of ei and fi is 1, $\beta i = 1$.

With $\gamma i = 1$ and $l_{i-1} = 0$ or $\gamma i = 0$ and $l_{i-1} = 1$, parameter $\alpha i$ takes 1. Under the first condition, one of the redundant binary bits ei and fi is ±1, and the other is 0, and at least one of $e_{i-1}$ and $f_{i-1}$ is −1. Under the second condition, ei=fi=0, or ei=±1, and fi=±1, and $e_{i-1}$ and $f_{i-1}$ takes 0 or 1.

Signal ($\beta i$ li) transmitted between adjacent bits can be regarded as a kind of carry in redundant binary representation. When binary bit ($hi^+$ $hi^-$) is found, final addition is carried out.

Setting $H^+ = \{hi\}$ and $H^- = \{hi\}$, the final product $Z = X \cdot Y$ is given by:

$$Z = H^+ - H^-$$

Carry Ci is given by:

$$\begin{aligned} Ci &= hi^+ \cdot /hi^- + (hi^+ \oplus /hi^-) \cdot C_{i-1} \\ &= hi^+ + /hi^- \cdot C_{i-1} \end{aligned} \qquad (27)$$

Since (11) is converted into (00) in a redundant binary bit, the fact that upper bit $hi^+$ and lower bit $hi^-$ do not take 1 simultaneously is used for deriving the equation (27). The equation (27) can be converted into the following equation (28).

$$Ci = hi^+ \cdot /C_{i-1} + /hi^- \cdot C_{i-1} \qquad (28)$$

The equations (27) and (28) both can be confirmed by using a truth table. When carry Ci is generated, bit zi representing the final addition result is found according to the following equation (29):

$$\begin{aligned} Zi &= hi^+ \oplus /hi^- \oplus C_{i-1} \\ &= /(hi^+ + hi^-) \oplus C_{i-1} \end{aligned} \qquad (29)$$

The equation (29) can also be confirmed easily by using a truth table. As a result, the redundant binary number is converted into an ordinary binary representation to obtain the multiplication result Z of binary numbers X and Y.

The multiplier of the present invention generates an intermediate sum by addition of redundant binary numbers according to the above-described algorithm and converts a redundant binary number generated by the intermediate sum into an ordinary binary number to perform multiplication. A specific structure example will now be described in detail.

Embodiment 1

FIG. 1 is a diagram showing a structure of the multiplier according to an embodiment of the present invention. In FIG. 1, a structure is shown in which multiplication of multiplier Y configured of 8-bit data (y7–y0) and multiplicand X configured of 8-bit data (x7–x0) is performed. The numbers of bits of multiplicand X and multiplier Y are arbitrary. Bits y7 and x7 represent the most significant bits.

Referring to FIG. 1, the multiplier includes an encoding circuit 700 generating control signals 5, 7, 53 and 54 designating an operation to be performed (a partial product to be generated) according to values of data bits (y7–y0) of multiplier Y, and a partial product generating circuit 702 generating partial products according to control signals 5, 7, 53 and 54 from encoding circuit 700 and data bits (x7–x0) of multiplicand X.

Figures 30, 31:
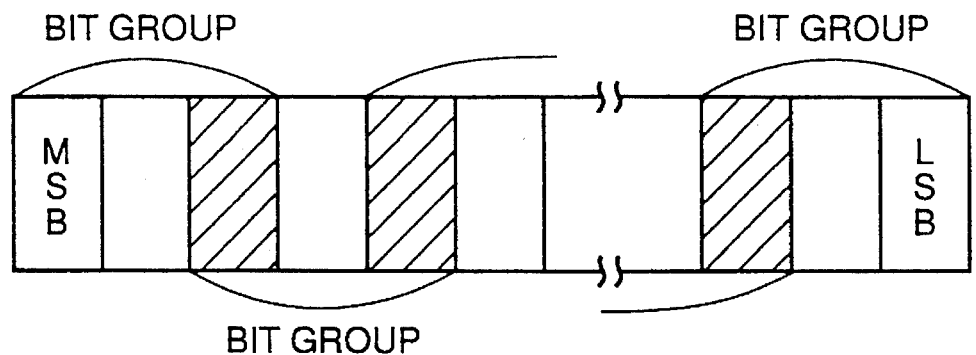
FIG. 30 is a diagram for explaining a Booth algorithm.
FIG. 31 is a diagram for explaining the second order Booth algorithm.
Figure 32:
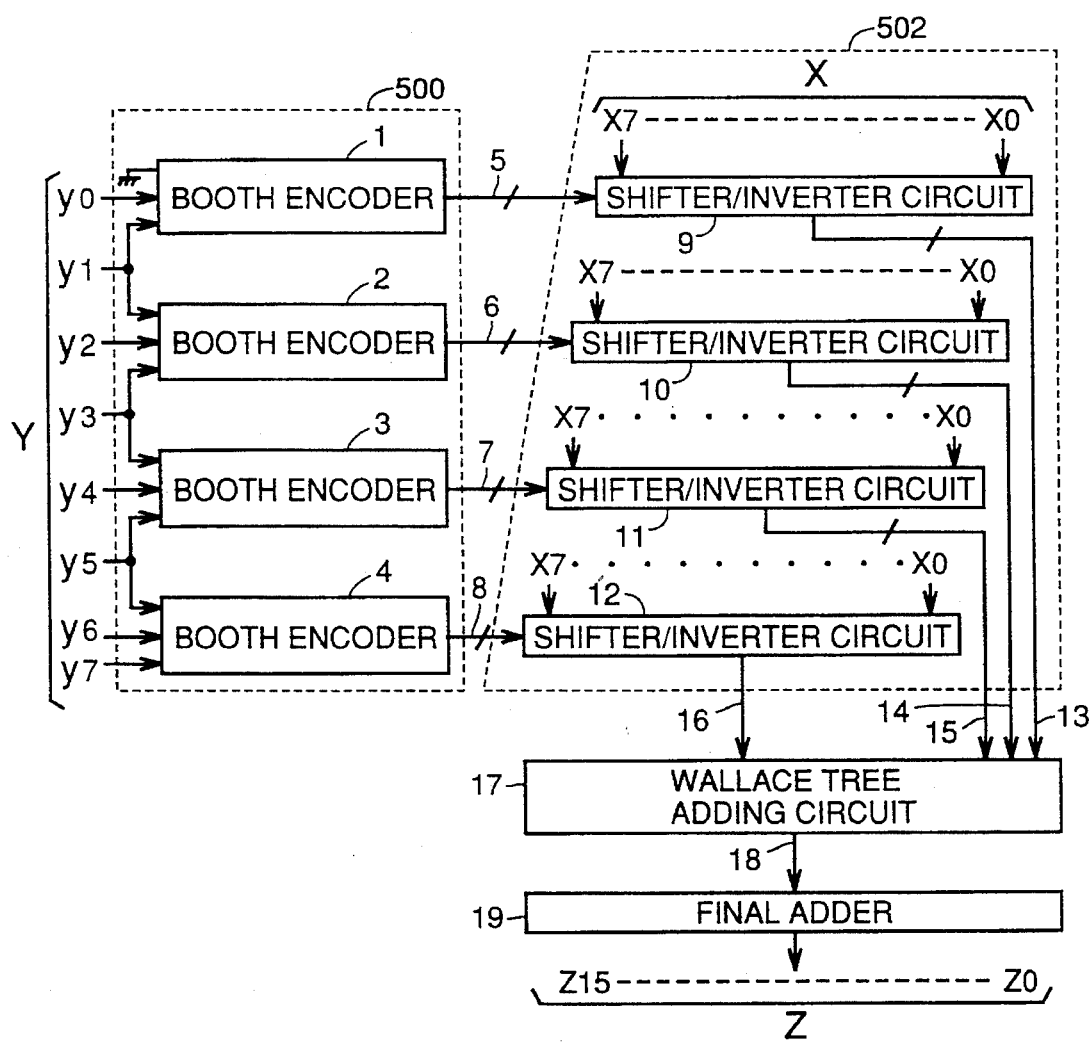
FIG. 32 is a diagram showing the entire structure of a conventional multiplier.

In encoding circuit 700, a Booth encoder 1 provided corresponding to data bits y1, y0 of multiplier Y and a Booth encoder 3 provided corresponding to data bits y5–y3 of multiplier Y, having the same structure as the conventional case, generates control signals 5 and 7, respectively, according to the relation shown in FIG. 31.

Both encoders 51 and 52 provided corresponding to data bits y3–y1 and y7–y5 of multiplier Y generate, unlike the conventional case, control signals 53 and 54 inverting signs of the operations to be performed. More specifically, sign inverting Booth encoders 51 and 52 each generate a control signal representing operations −X and −2X, when a set of applied data bit values designates X and 2X if the second order Booth algorithm is applied. This is true for any other order Booth algorithm. More specifically, sign inverting Booth encoders 51 and 52 generate control signals according to the relation shown in FIG. 3A. The operations in parentheses in the column of partial product in FIG. 3A are those (partial products to be generated) designated by the conventional Booth encoder.

Figures 3A, 3B:
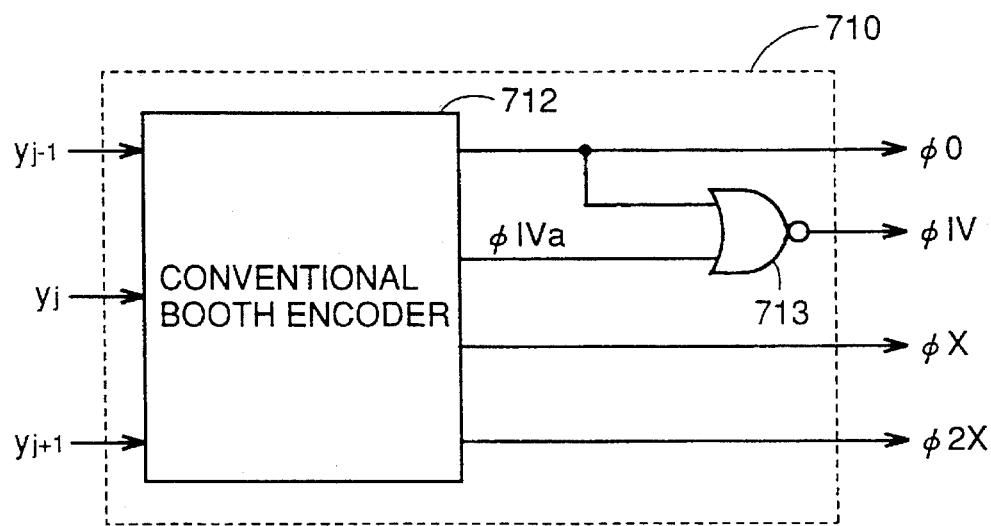
FIGS. 3A and 3B are diagrams showing a logic implemented by a sign inverting Booth encoder shown in FIG. 1 and the structure thereof.
Figure 33A:
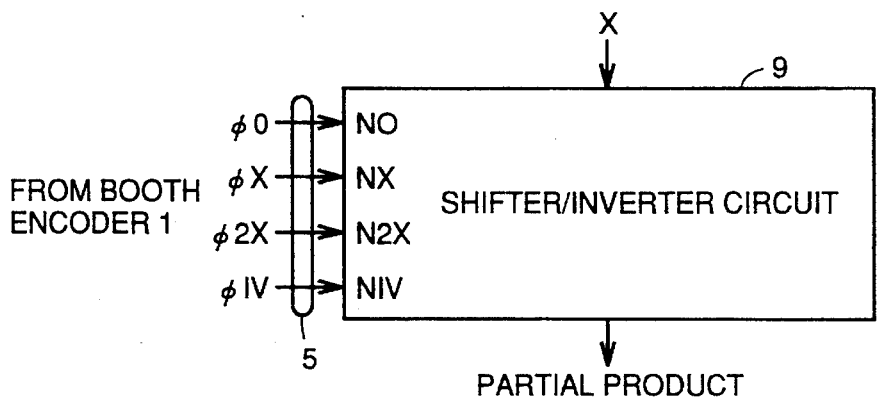
FIGS. 33A and 33B are a diagram showing a structure of a shifter/inverter circuit included in a partial product generating circuit shown in FIG. 32.

FIG. 3B shows a structure of the sign inverting Booth encoder. In FIG. 3B, sign inverting Booth encoder 710 includes a conventional Booth encoder 712 receiving 3-bit data $y_{j-1}$, $y_j$, and $y_{j+1}$ to carry out encoding similar to that of the conventional case and to generate a signal indicating the encoding result, and a 2-input NOR circuit 713 receiving a control signal $\phi 0$ generated by the conventional Booth encoder 712 and a control signal $\phi IVa$ indicating sign inverting operation. Control signals $\phi 0$, $\phi X$ and $\phi 2X$ are the same as control signals generated by the conventional Booth encoder shown in FIG. 33. NOR circuit 713 generates control signal $\phi IV$, when its inputs, that is, control signals $\phi 0$ and $\phi IVa$ are both in an inactive state of an "L" level, more specifically, only when the operation X or 2X is designated. As a result, signs of the partial products designated by the conventional Booth encoder can be inverted.

Partial product generating circuit 702 includes shifter/inverter circuits 9 to 12 generating partial products in response to control signals 5, 53, 7 and 54 from encoding circuit 700. Partial products 13, 55, 15 and 56 are generated from shifter/inverter circuits 9 to 12. The sign of partial products 55 and 56 or the sign of partial products to be generated according to the second order Booth algorithm are inverted. By making effective use of characteristics inherent to a redundant binary number, partial product generating circuit 702 can be configured of reduced components.

Figure 4:
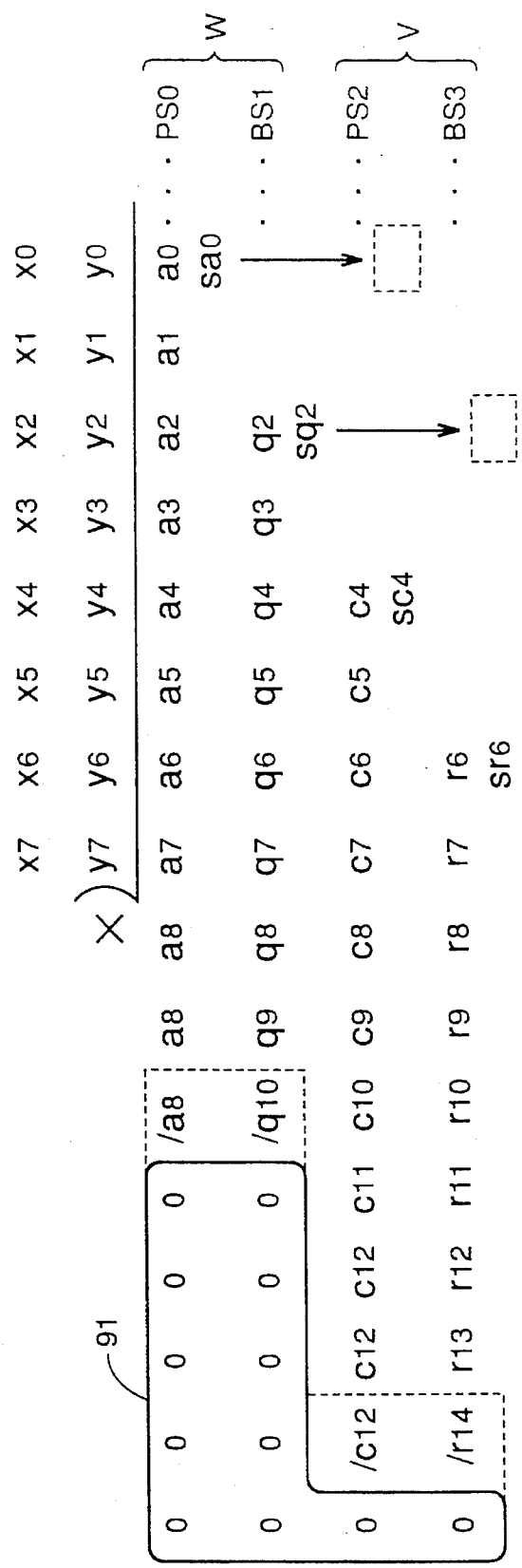
FIG. 4 is a diagram for explaining a method of reducing the number of components of a partial product to be carried out in the present invention.

As is shown in FIG. 4, partial products PS0, BS1, PS2 and BS3 are assumed to be generated by partial product generating circuit 702. A redundant binary number W is generated from partial product PS0 and partial product PS1, and a redundant binary number V is generated from partial product PS2 and partial product BS3. A certain number of bits of same values are continuously disposed toward the most significant bit in a partial product represented in a two's complement. The bit values continuously disposed can be converted according to the previously described equations (7) to (9).

More specifically, in a set of continuous same bit values, a bit value of an arbitrary position can be inverted, and bit values at more significant bit positions than the inverted bit can be all converted into 0.

In FIG. 4, bit values a8 and q10 of the tenth bit are both inverted, and bit values at more significant positions than the inverted bits are all converted into 0.

In redundant binary number V, bit values c12 and r14 of the fourteenth bit are both inverted into 0, and the most significant bits are both converted into 0. Bit values in a region 91 are all 0. Therefore, as for region 91, since it is not necessary to consider addition, provision of an adding circuit for this portion is not required. As a result, the number of elements can be reduced. Partial product generating circuit 702 shown in FIG. 1 is structured so as to implement arrangement of the partial products shown in FIG. 4. In order to easily implement the arrangement shown in FIG. 4, an inverter circuit is provided for a bit to be inverted in redundant binary numbers W and V, and bit values at more significant bits than those to be inverted are ignored without providing interconnection and an adding circuit.

Referring again to FIG. 1, partial products 13, 55, 15 and 56 generated in partial product generating circuit 702 are provided to a converting circuit 57. Converting circuit 57 receives partial products 13 and 15 as one redundant binary number, and partial products 15 and 56 as another redundant binary number. Converting circuit 57 includes a converter provided corresponding to each bit of the redundant binary numbers. The converter includes a function of converting a redundant binary bit (11) into a redundant binary bit (00). As for the converter provided for the redundant binary bit of the i-th bit included in converting circuit 57, the structure and the logical operation thereof are shown in FIGS. 5A and 5B.

Figures 5A, 5B:
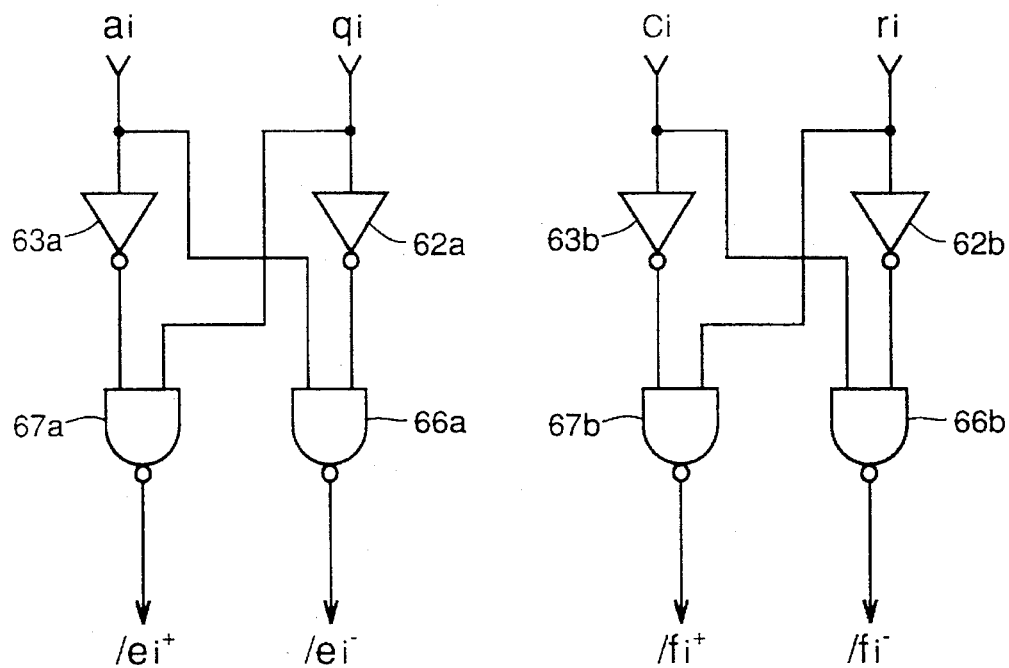
FIGS. 5A and 5B are diagrams showing the structure of a converting circuit shown in FIG. 1 and a logic of the input/output thereof.

Referring to FIG. 5A, the converter includes a converter 710 provided for the i-th bit $a_i$ and $q_i$ of first redundant binary number W, and a converter 712 provided for the i-th bit $c_i$ and $r_i$ of second redundant binary number V. Converters 710 and 712 have the same structure. Converter 710 includes an inverter circuit 63a receiving bit $a_i$, an inverter circuit 62a receiving bit $q_i$, a NAND circuit 67a receiving the output of inverter circuit 63a and bit $q_i$, and a NAND circuit 66a receiving bit $a_i$ and the output of inverter circuit 62a. An inverted value $/ei^+$ of the upper bit of the redundant binary bit after conversion is generated from NAND circuit 67a, and an inverted value $/ei^-$ of the lower bit of the redundant binary bit after conversion is generated from NAND circuit 66a.

Similarly, converter 712 includes inverter circuits 62b, 63b, and NAND circuits 66b, 67b. An inverted value $/fi^-$ of the lower bit of the redundant binary bit after conversion is generated from NAND circuit 66b. An inverted value $/fi^+$ of the upper bit of the redundant binary bit after conversion is generated from NAND circuit 67b. Inverted values of the redundant binary bit are generated from the converting circuit in order to simplify the circuit configuration of the succeeding stages.

The converting circuit shown in FIG. 5A satisfies the logic shown in FIG. 5B. 2-input NAND circuit generates a signal of "0" only when its both inputs attain "1". Logics "1" and "0" here correspond to signal potentials "H" and "L". Therefore, redundant binary bit (11) is converted into redundant binary bit (00) to be provided. Redundant binary bits of combination of other bit values are provided without being converted. As a result of the shown configuration, a three-value redundant binary number is generated, facilitating the configuration of the succeeding adding stages.

Referring again to FIG. 1, a redundant binary number 58 after conversion from converting circuit 57 is added by intermediate sum generating circuit 59. Intermediate sum generating circuit 59 performs redundant binary addition of redundant binary numbers e and f (shown by signal 58) from the converting circuit to generate an intermediate sum. The configuration of intermediate sum generating circuit 57 is shown in FIG. 6.

Figure 6:
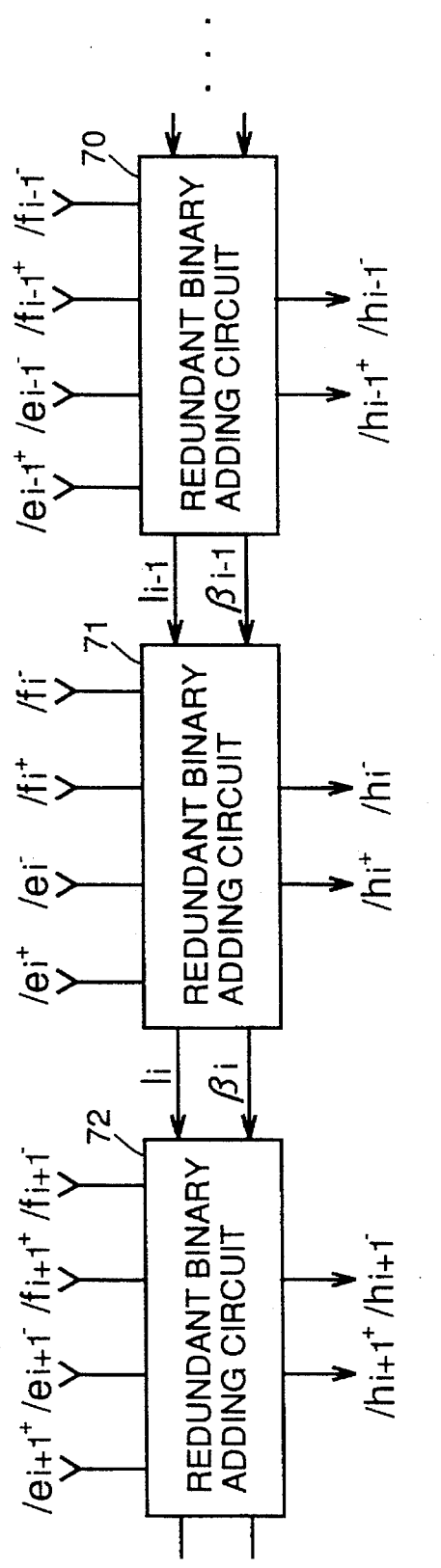
FIG. 6 is a diagram showing a structure of an intermediate sum generating circuit shown in FIG. 1.

In FIG. 6, intermediate sum generating circuit 59 includes redundant binary circuits provided corresponding to respective bits of two redundant binary numbers. Redundant binary adding circuits 70, 71 and 72 provided corresponding to the (i−1)-th digit, i-th digit, and the (i+1)-th digit of the redundant binary number after conversion are shown in FIG. 6. Redundant binary adding circuits 71 and 72 perform the redundant binary adding operation according to the previously described equations (21) to (26) to generate redundant binary numbers indicative of intermediate results, respectively. As is clear from the configuration shown in FIG. 6 and the equations (21) to (26), redundant binary bits $ej^+$, $ej^-$, $fj^+$ and $fj^-$ are all applied to the intermediate sum generating circuit in parallel. Therefore, as is shown in the equations (24) to (26), signals $lj$ and $\beta j$ are generated in parallel. More specifically, it is possible to perform redundant binary addition according to the output of the redundant binary adding circuit of the adjacent lower bit.

Different from the structure in which a carry propagates from the least significant bit to the most significant bit, the carry propagation delay is significantly reduced to make it possible to perform redundant binary addition at a high speed. Different from the structure of the conventional Wallace tree adding circuit, 4-bit data can be compressed into 2-bit data by a redundant binary adding circuit of one stage. More specifically, since one redundant binary number is generated by redundant binary addition of two redundant binary numbers, it is possible to simplify the layout substantially. Since the redundant binary adding circuit (70 to 72) includes a structure of 4 inputs and 2 outputs, the interconnection does not become complicated. If the number of partial products increases, and the number of redundant binary numbers increases, it is possible to design the layout of interconnection easily because of regularity of the interconnection.

Figure 7:
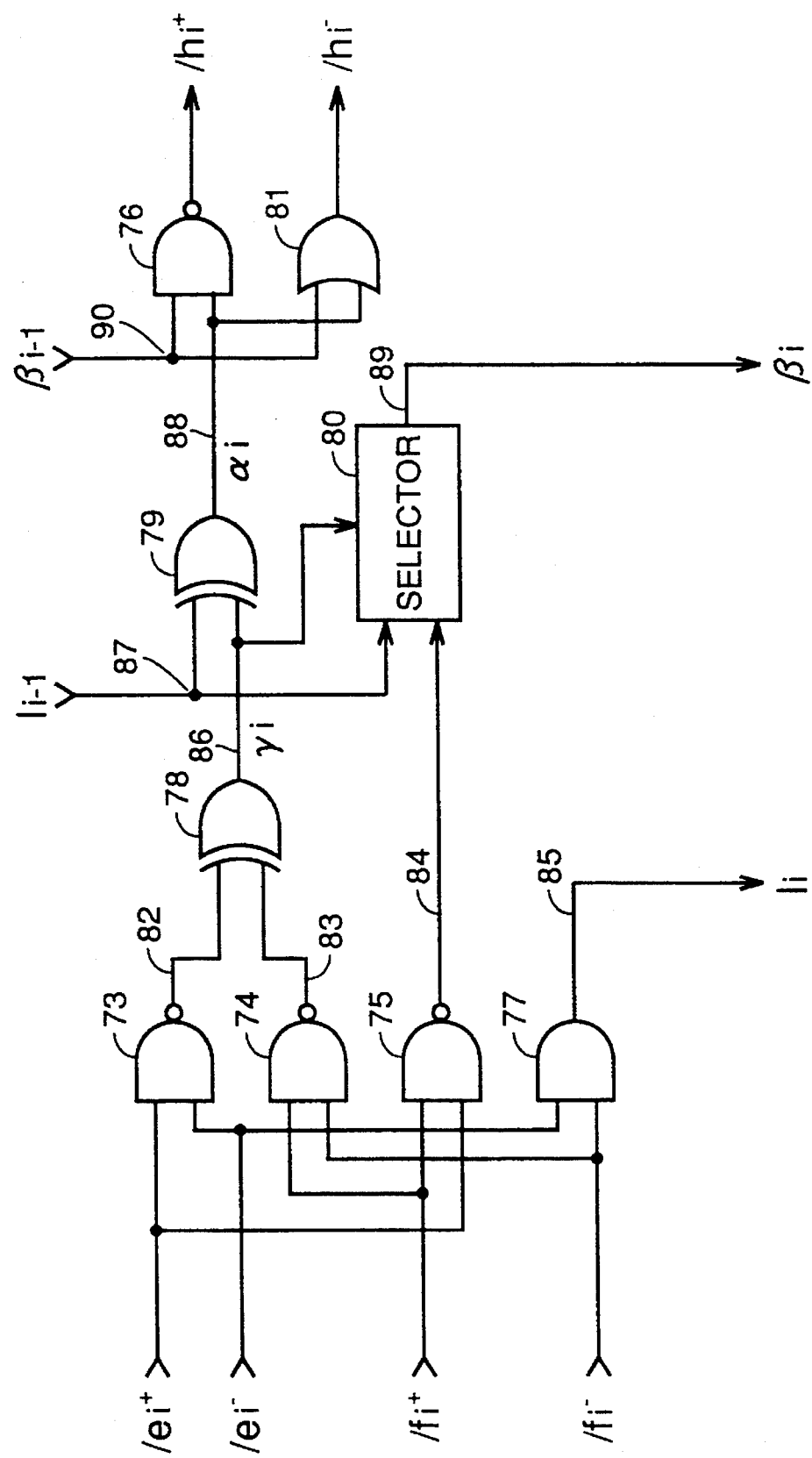
FIG. 7 is a diagram showing a specific structure example of a redundant binary adding circuit shown in FIG. 6.

FIG. 7 shows an example of the structure of the redundant binary adding circuit for the i-th redundant binary bit. Referring to FIG. 7, the redundant binary adding circuit includes a 2-input NAND circuit 73 receiving the inverted value /$ei^+$ of an upper bit and the inverted value /$ei^-$ of a lower bit of a first redundant binary bit, a 2-input NAND circuit 74 receiving the inverted value /$fi^+$ of an upper bit and the inverted value /$fi^-$ of a lower bit of a second redundant binary bit, a 2-input NAND circuit 75 receiving the bits /$ei^+$ and /$fi^+$, a 2-input NAND circuit 77 receiving bits /$ei^-$ and /$fi^-$, and a 2-input XOR circuit 78 receiving outputs 82 and 83 of NAND circuits 73 and 74. A signal $li$ to be transmitted to the next stage (the (i+1)-th digit) is generated from NAND circuit 77.

The redundant binary adding circuit further includes a 2-input XOR circuit 79 receiving a signal $l_{i-1}$ propagated from a lower bit (the (i−1)-th digit) and the output of XOR circuit 78, and a selector 80 selecting one of signal $l_{i-1}$ and the output of NAND circuit 75 according to output 86 of XOR circuit 78. The selector 80 supplies signal $\beta i$ to be transmitted to the redundant binary adding circuit of the next stage.

The redundant binary adding circuit further includes a 2-input NAND circuit 76 receiving signal $\beta_{i-1}$ propagated from the (i−1)-th digit and the output of XOR circuit 79, and an OR circuit 81 receiving signal $\beta_{i-1}$ and the output of XOR circuit 79. An inverted value /$hi^+$ of an upper bit of a redundant binary bit is generated from NAND circuit 76. An inverted value /$hi^-$ of a lower bit of the redundant binary bit is generated from OR circuit 81. The operation thereof will be described.

A signal representing /(/$ei^+$·/$ei^-$)=$ei^+$+$ei^-$ is generated on a signal line 82 from NAND circuit 73. Similarly, a signal representing ($fi^+$+$fi^-$) is provided from NAND circuit 74. A signal representing ($ei^+$+$fi^+$) is provided from NAND circuit 75. A signal representing /$ei^-$·/$fi^-$=/($ei^-$+$fi^-$) is transmitted onto a signal line 85. Signal $li$=/($ei^-$+$fi^-$) on signal line 85 is transmitted to a redundant binary adder for a bit upper by one bit.

XOR circuit 78 performs addition of module 2 for the applied signals. XOR circuit 78 generates a signal indicative of the result of addition of module 2 of ($ei^+$+$ei^-$) and ($fi^+$+$fi^-$), that is, signal $\gamma i$ given by the equation (25). Signal $\gamma$ shown in the equation (23) is generated on signal line 88 by XOR circuit 79 taking exclusive OR of signal $l_{i-1}$ and signal $\gamma i$ (addition of module 2).

Selector 80 selects signal $l_{i-1}$ when signal $\gamma i$ on signal line 86 is "1", and selects the output of NAND circuit 75 when signal $\gamma i$ is '0'. More specifically, selector 80 performs the operation of ($ei^+$+$fi^+$)·/$\gamma i$+($l_{i-1}$)·$\gamma i$, that is, the operation shown in the equation (24), and signal $\beta i$ is generated on a signal line 89.

NAND circuit 76 takes NAND of signal $\alpha i$ on signal line 88 and signal $\beta_{i-1}$ on a signal line 90. More specifically, /($\alpha i$·$\beta_{i-1}$) is generated from NAND circuit 76. OR circuit 81 takes OR of signal $\alpha i$ on signal line 88 and signal $\beta_{i-1}$ on signal line 90. More specifically, $\alpha i$+$\beta_{i-1}$ is provided from OR circuit 81. The outputs of NAND circuit 76 and OR circuit 81 are given by the following equations.

$$/(\alpha i \cdot \beta_{i-1}) = /hi^+ \quad (27)$$

$$\alpha i + \beta_{i-1} = /(/\alpha i \cdot /\beta_{i-1}) = /hi^- \quad (28)$$

More specifically, inverted values of upper bit $hi^+$ and lower bit $hi^-$ of the redundant binary bit are provided.

The delay in the redundant binary adding circuit shown in FIG. 7 is mainly caused by the NAND circuit and the AND circuit at an input stage, the XOR circuits of two stages of an intermediate stage, and the NAND circuit and the OR circuit of an output stage. In general, the NAND circuit, the AND circuit and the OR circuit operate at a speed higher than the XOR circuit operates. In the intermediate sum generating circuit of the multiplier of the present invention, the redundant binary adding circuit is only provided in one row (one stage). The conventional Wallace tree adding circuit includes full adders provided in two rows (two stages), causing the delay time corresponding to four stages of the XOR circuits. Therefore, the intermediate sum generating circuit according to the present invention can generate an intermediate sum at a high speed and compresses 4 inputs to 2 outputs. The multi-bit redundant binary number including a redundant binary number 60 (($hi^+$ $hi^-$)) generated in intermediate sum generating circuit 59 is converted into an ordinary binary number by a final adding circuit 61 (cf. FIG. 1). The conversion is performed according to the equations (27) to (29).

The final adding circuit performs the operation $H^+-H^-$ using the upper bit $hj^+$ and the lower bit $hj^-$ (j=0 to 15) of the multi-bit redundant binary number as separate 16 bit data $H^+$ and $H^-$. More specifically, after inversion of positive/negative (inversion of signs) of the binary number $H^-$, that is, after converting bits $hj^-$ into $/hj^-$, 1 is added to the least significant bit, and then addition of the binary number $H^-$ and the binary number $H^+$ is performed.

However, because of property of the redundant binary number, bits $hj^+$ and $hj^-$ do not assume 1 simultaneously ((11) has already been converted into (00)). Therefore, a carry can be generated according the equation (27), and it is possible to use the circuit configuration which is substantially simplified as compared to the conventional circuit configuration for generation of a carry. The equation (27) can be modified into the equation (28). As is shown in the equation (28), one of the upper bit $hi^+$ and the inverted value $/hi^-$ of the lower bit is selected according to a value of carry $C_{i-1}$. More specifically, by using a selector circuit selecting one of bits $hi^+$ and $/hi^-$ using a carry as a select control signal, a carry generating circuit can be implemented.

Figure 8:
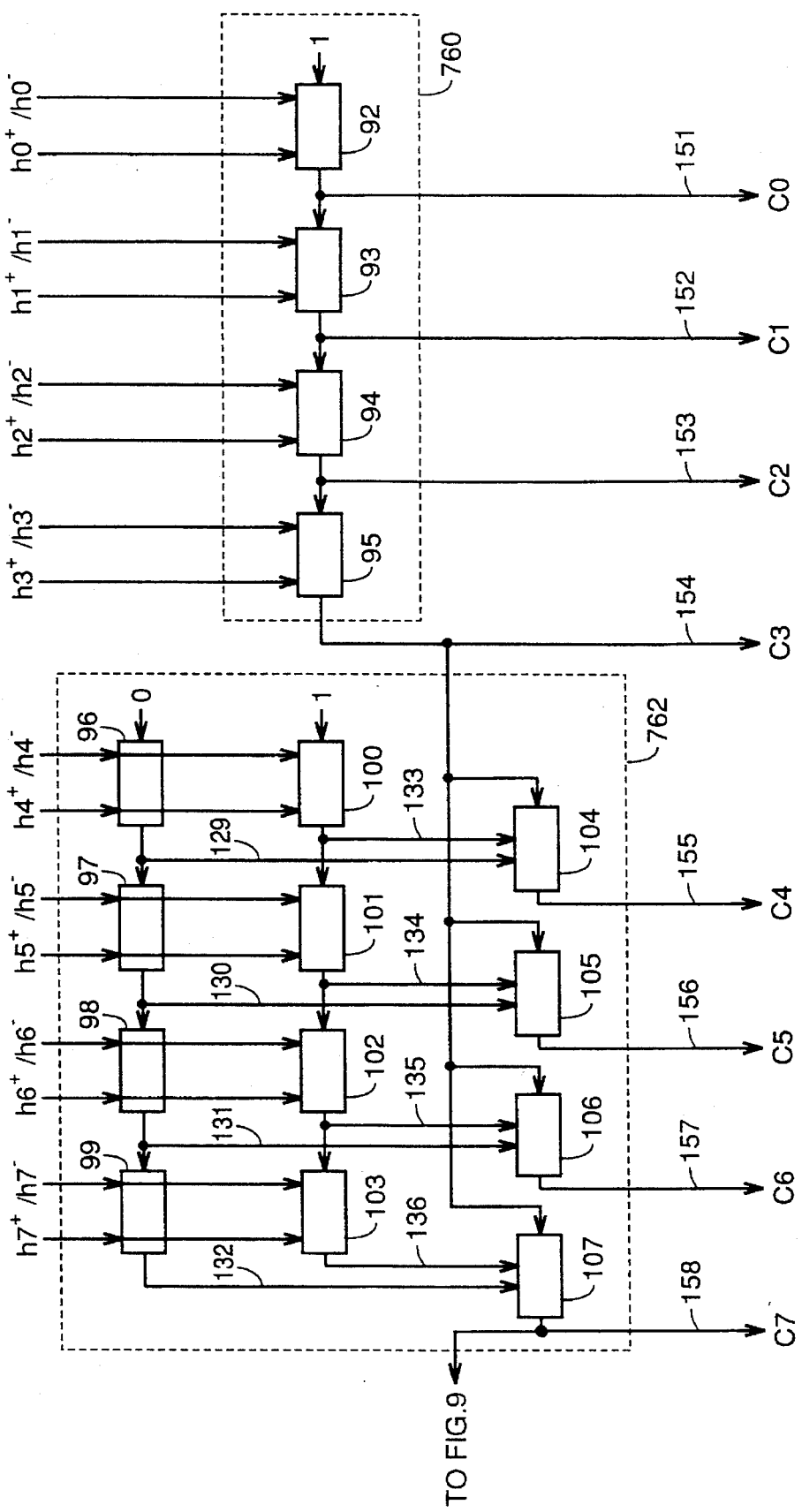
FIG. 8 is a diagram showing a structure of a carry generating portion in a final adding circuit shown in FIG. 1.
Figure 9:
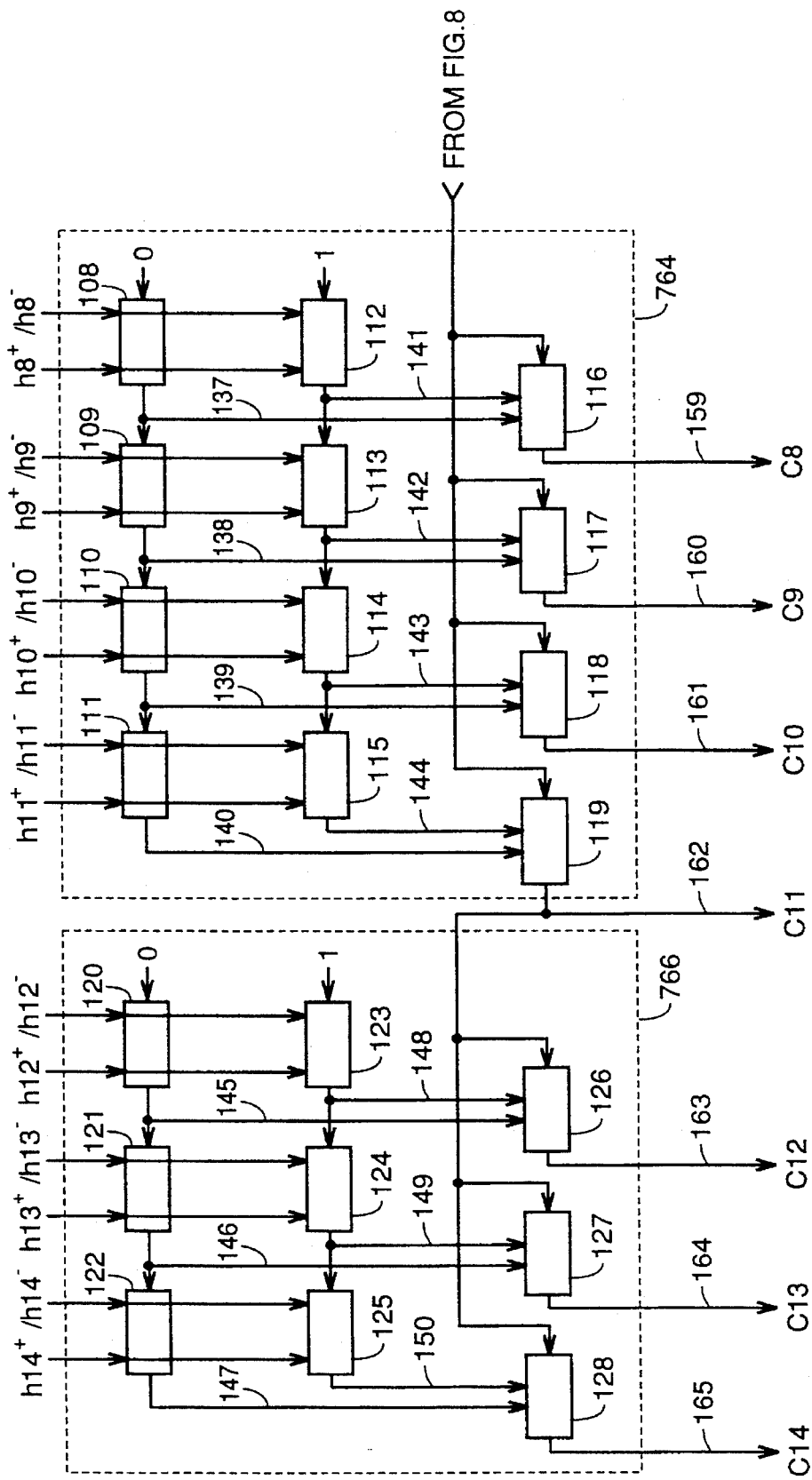
FIG. 9 is a diagram showing a structure of the carry generating portion in the final adding circuit shown in FIG. 1.

FIGS. 8 and 9 are diagrams showing examples of the configuration of a carry generation portion included in final adding circuit 61 shown in FIG. 1. In FIGS. 8 and 9, the 16-bit redundant binary number finally generated is divided into groups each including four bits. The carry generating portion includes carry generating circuits 760, 762, 764 and 766 provided for each group of four bits. Carry generating circuit 760 includes selectors 92 to 95 provided corresponding to redundant binary bits h0 to h3 of the 0-th bit to the third bit. Bit hi here shows the redundant binary bit ($hj^+$ $hj^-$). Each of selectors 92 to 95 passes the upper bit or the inverted value of the lower bit of a corresponding redundant binary bit using a carry provided from a less significant bit side as a select control signal. Selector 92 provided at the least significant position is provided with a fixed value "1" as a select control signal. Carries C0 to C3 are transmitted onto signal lines 151 to 154 from selectors 92 to 95, respectively.

Carry generating circuit 762 includes first selectors 96 to 99 provided corresponding to redundant binary bits h4 to h7, and second selectors 100 to 103. Selectors 96 to 99 provide as a carry any of the upper bit or the inverted value of the lower bit of a corresponding redundant binary bit according to the carry signal from the less significant bit side. For selector 96 of the least significant bit of first selectors 96 to 99, the fixed value "0" is transmitted as a select control signal. Similar to first selectors 96 to 99, the second selectors also selectively pass one of corresponding redundant binary bits $hj^+$ and $/hj^-$ according to a carry provided from the less significant bit side. Selector 100 at the least significant bit of the second selectors receives the fixed value "1" at the carry input.

Carry generating circuit 762 further includes selectors 104 to 107 passing one of carries generated from corresponding first and second selectors, using carry C3 provided from the most significant bit of carry generating circuit 760 as a select control signal. Carries C4 to C7 are transmitted onto signal lines 155 to 158 from selectors 104 to 107.

Carry generating circuit 764 shown in FIG. 9 has the configuration similar to that of carry generating circuit 762. Carry generating circuit 764 includes first selectors 108 to 111 and second selectors 112 to 115 provided respectively corresponding to binary redundant bits h8 to h11. Carry generating circuit 764 further includes selectors 116 to 119 selecting one of output signals generated from corresponding first and second selectors using carry C7 provided from the selector at most significant position in carry generating circuit 762 as a select control signal. Carries C8 to C11 are generated from selectors 116 to 119.

Carry generating circuit 766 includes selectors 120 to 122 and 123 to 125 provided respectively corresponding to three redundant binary bits h12 to h14, and selectors 126 to 128 passing one of output signals of corresponding selectors using carry C11 at the uppermost position of carry generating circuit 764 as a select control signal. Carries C12 to C14 are transmitted onto signal lines 163 to 165 from selectors 126 to 128. Since necessary carries are 15 bits, carry generating circuit 766 uppermost position is provided for three redundant binary bits h12 to h14. This configuration is a carry lookahead configuration. Selectors 92 to 128 have the same configuration.

Figure 10:
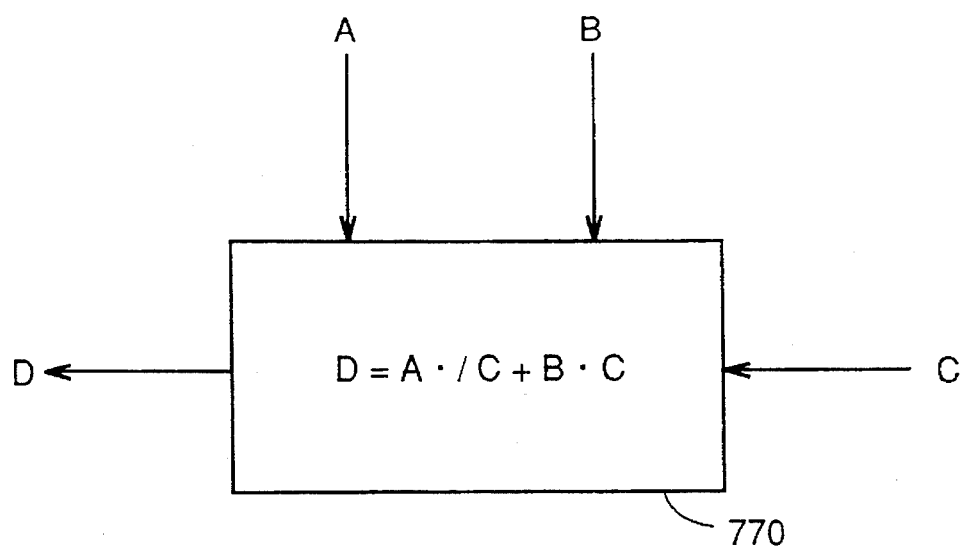
FIG. 10 is a diagram showing a logic implemented by a selector shown in FIGS. 8 and 9.

An example of the configuration of selectors 92 to 128 is shown in FIG. 10. In FIG. 10, selector 770 generates an output signal D by passing one of two inputs A and B in response to a signal C. More specifically, selector circuit 770 passes input B when signal C is "1", and passes input A when signal C is "0". The operation of the carry generating circuit shown in FIGS. 8 and 9 will now be described.

A carry input for selector 92 provided corresponding to the least significant bit of the carry generating circuit always assumes "1" because of addition of "1" to the least significant bit which appears at the time of positive/negative inversion (sign inversion) of binary number $H^-$.

According to the equation (28), for inputs hj and $/hj^-$ (j=0 to 3), carries C0 to C3 of respective digits of up to the fourth digit of binary numbers $H^+$ and $H^-$ are generated by selectors 92 to 95.

For the fourth to the seventh bits, in response to 0 and 1 of carry output C3 of the 0-th to the third bits, carries are generated in advance by first selectors 96 to 99 and second selectors 100 to 103. With the value of carry C3 of the most significant bit from carry generating circuit 760 finally determined, third column selectors 104 to 107 select one of carries generated from first and second selector circuits. More specifically, first selectors 96 to 99 generate carries for carry C3 of "0", and second selectors 100 to 103 generate carries for carry C3 of "1". First and second selectors respectively generate carries simultaneously.

In carry generating circuits 764 and 766 at the more significant bits, carries C8 to C14 are generated similarly.

A method of generating a carry according to the circuit configuration shown in FIG. 8 and 9 can be implemented by using only the selector circuits. A complicated logic circuit such as a conventional carry lookahead circuit which requires a large number of circuit components is unnecessary. Since the number of elements is small and the circuit configuration is simple, it is possible to design the carry generating portion easily with a small occupied area.

The delay time in the carry generating circuit is seven stages' worth of selector circuits at maximum (seven stages in total of selectors 92 to 95, 107, 119 and 128), and it is not necessary to perform the logical operation. Therefore, it is possible to substantially shorten the delay time, as compared to the configuration of the carry lookahead circuit using a complicated logic circuit.

Figure 11:
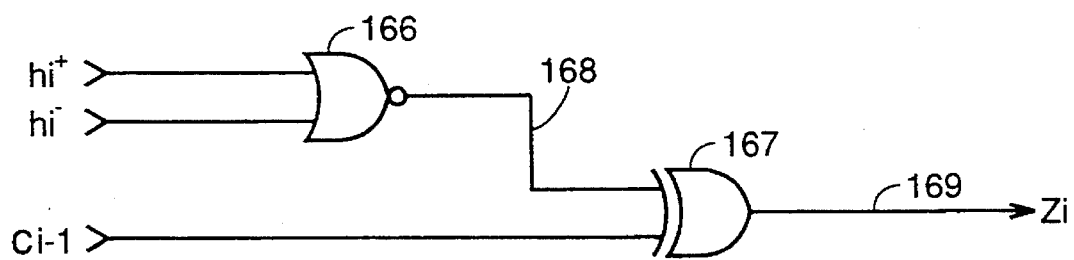
FIG. 11 is a diagram showing a structure of a sum generating circuit in the final adding circuit shown in FIG. 1.

Addition of carries C0 to C14 generated by the circuit configuration shown in FIGS. 8 and 9 and binary numbers $H^+$ and $-H^-$ is performed. The configuration of the adding circuit is shown in FIG. 11. In FIG. 11, the configuration of the adding circuit for the i-th bit is shown. In FIG. 11, the adding circuit includes a 2-input NOR circuit 168 receiving bits $hi^+$ and $hi^-$, and an XOR circuit 167 taking exclusive OR (addition of module 2) of the output of NOR circuit 166 and carry $C_{i-1}$. The adding circuit shown in FIG. 11 performs addition according to the equation (29). More specifically, $/(hi^+ + hi^-)$ is generated onto signal line 168 by NOR circuit 166. Then, exclusive OR of the signal on signal line 168 and carry $C_{i-1}$ is taken.

In the case of the final adder of the conventional ripple adder configuration, at least two stages of XOR circuits are required in order to obtain the sum output. In the configuration shown in FIG. 11, the delay of the adding circuit is substantially reduced as compared to that of two stages of XOR circuits. This is because the delay time by the XOR circuit is substantially longer than the delay time provided by the NOR circuit. As a result, the redundant binary number is converted into an ordinary binary number for each bit in parallel, and 16-bit binary number Z representing the product X·Y of binary numbers X and Y is calculated.

In partial product generating circuit 702, correction bits are produced at the time of sign inversion (cf. FIG. 4). As for addition of correction bits sa0, sq2, sc4 and sr6, it can be performed by the following method. As is shown in FIG. 12A, these correction bits are added to corresponding bit positions of the partial products generated from the most significant bits of multiplier Y. In FIGS. 12A and 4, the state is shown where correction bits sa0 and sq2 are inserted into corresponding bit positions of partial products PS2 and BS3, respectively. Then, as shown in FIG. 12B, using remaining correction bits sc4 and sr6 as redundant binary numbers (sc4 0) and (0sr 6), respectively, addition of the redundant binary numbers (sc4 0) and (0sr 6) and corresponding redundant binary bits ($h4^+ h4^-$) and ($h6^+ h6^-$) is performed. As a result, the correction bits can be reliably added.

Alternatively, as shown in FIG. 12C, it may be configured that a redundant binary number of seven bits of (0 sr6)(0 0)(sc4 0)(0 0)(sq 2)(0 0)(sa0 0) is generated from correction bits sa0, sq2, sc4, and sr6, adding the redundant binary number used as one of partial products to be added to generated redundant binary number H (h15 ... h0) in the redundant binary adding circuit, and that the performing final addition is then performed. Any of the configuration may be used.

Embodiment 2

Figure 13:
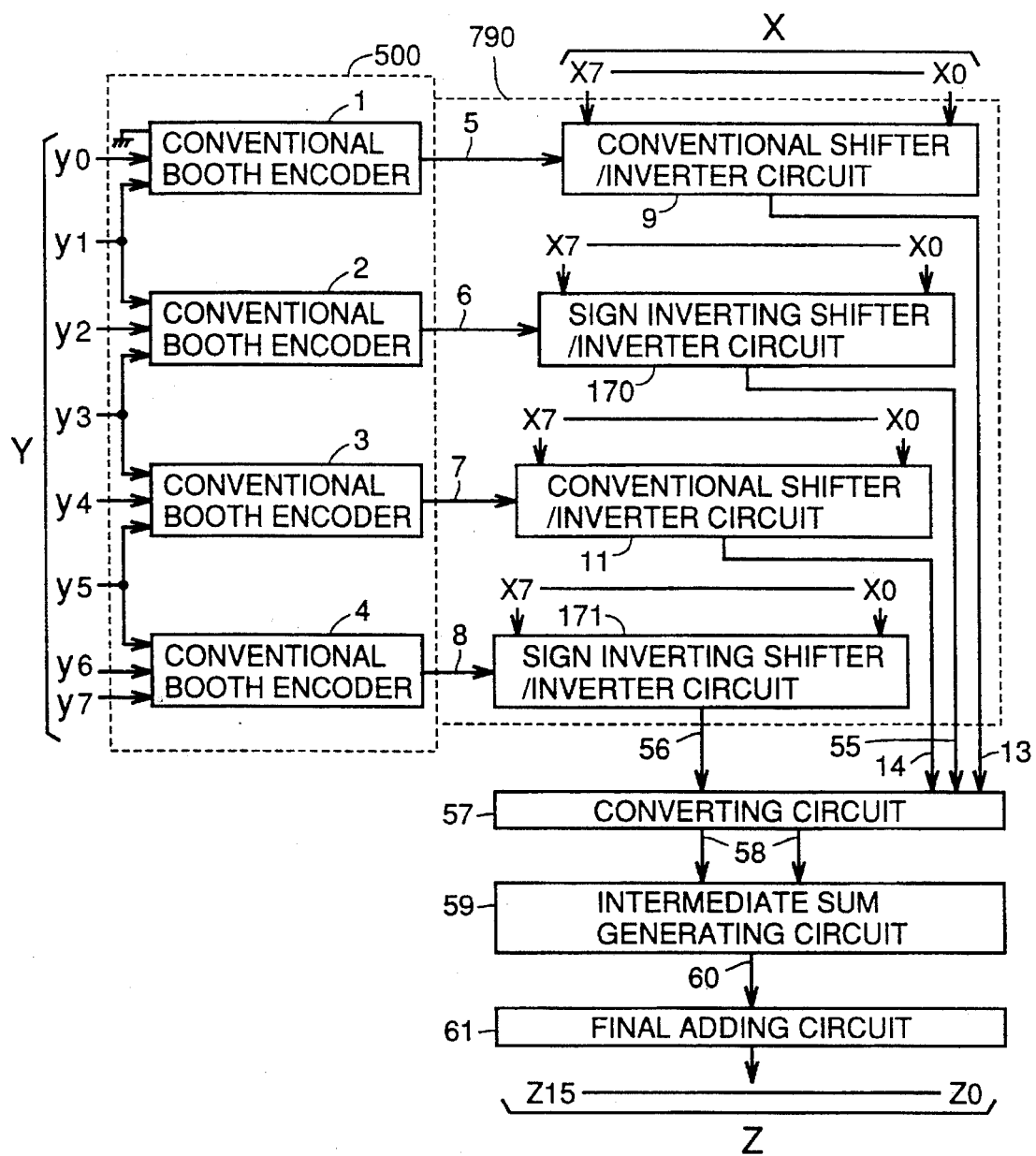
FIG. 13 is a diagram showing the entire structure of a multiplier according to a second embodiment of the present invention.

FIG. 13 is a diagram showing the entire configuration of the multiplier according to the second embodiment of the present invention. In FIG. 13, the multiplier includes an encoding circuit 500 encoding 8-bit multiplier Y to generate control signals 5, 6, 7 and 8, a partial product generating circuit 790 generating partial products 13, 55, 14 and 56 according to control signals 5 to 7 from encoding circuit 500 and 8-bit multiplicand X.

Similar to the conventional configuration shown in FIG. 30, encoding circuit 500 includes Booth encoders 1 to 4 encoding each group of bits of multiplier Y according to the second order Booth algorithm to generate control signals 5 to 8. Booth encoders 1 to 4 generate control signals designating partial products to be generated (or operations to be performed) according to the relation shown in FIG. 31.

Partial product generating circuit 790 includes shifter/inverter circuits 9, 170, 11 and 171 generating partial products 13, 55, 14 and 56 according to control signals 5 to 7 provided from encoding circuit 500 and multiplicand X.

Shifter/Inverter circuits 9 and 11 have a configuration similar to the conventional case. Shifter/Inverter circuits 9 and 11 respectively generate partial products 13 and 14 from multiplicand X according to control signals 5 and 7 from Booth encoders 1 and 3.

Figure 14:
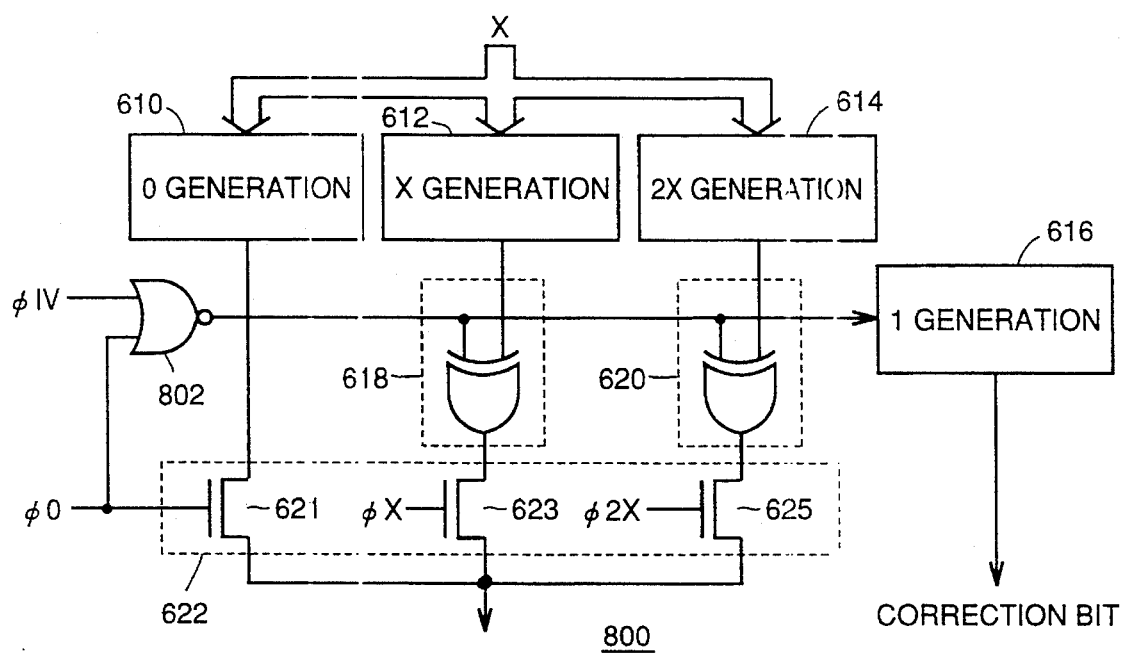
FIG. 14 is a block diagram showing a schematic structure of a sign inverting shifter/inverter circuit shown in FIG. 13.

Sign inverting shifter/inverter circuits 170 and 171 generate partial products obtained by sign inversion of partial products designated by control signals 6 and 8 from Booth encoders 2 and 4. FIG. 14 shows an example of a specific configuration of sign inverting shifter/inverter circuits 170 and 171.

Figure 33B:
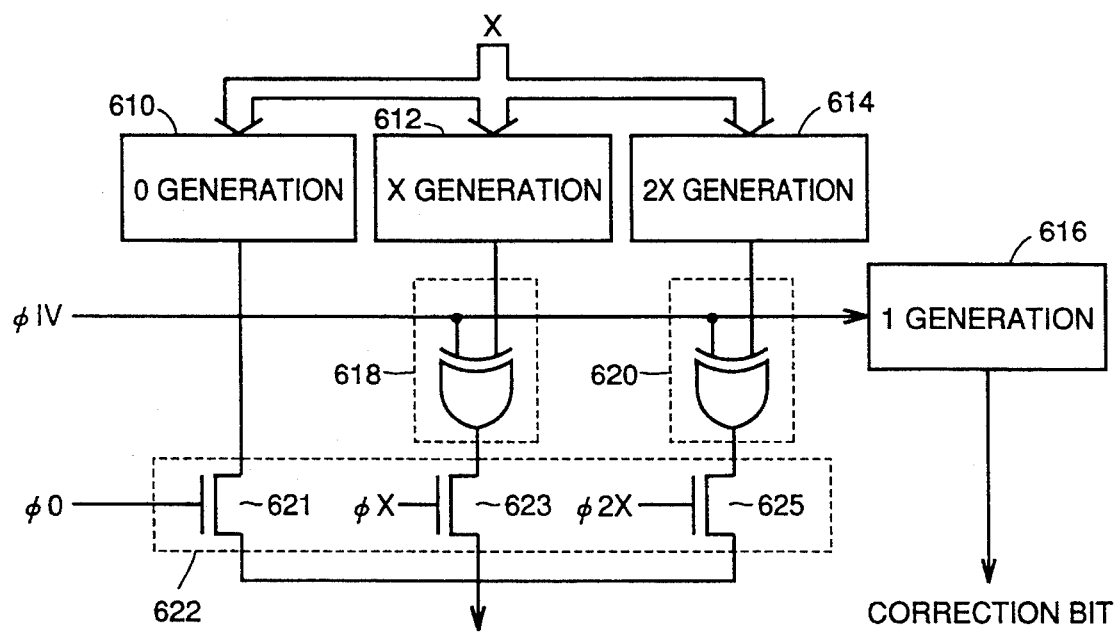
Figure 34:
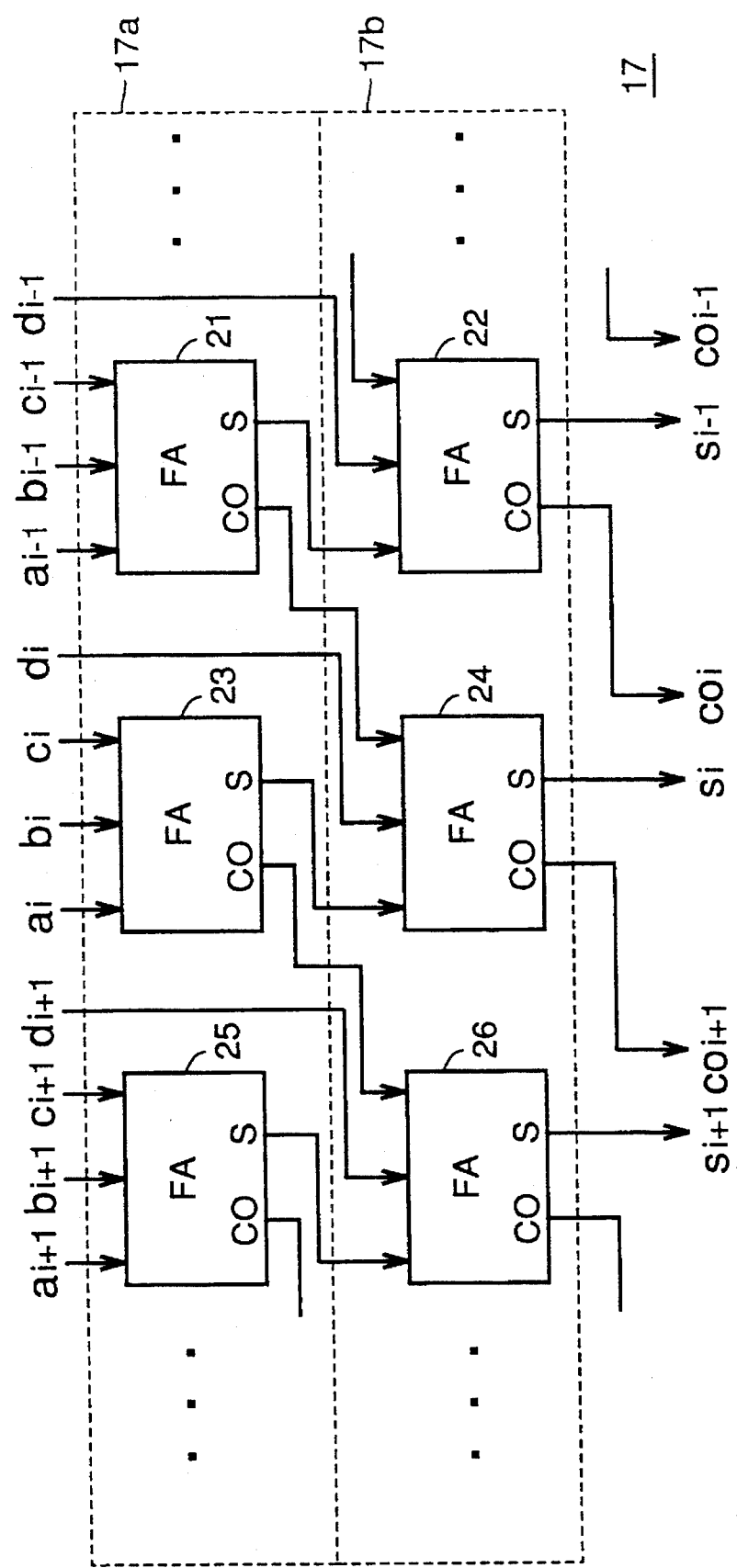
FIG. 34 is a diagram showing a structure example of a Wallace tree adding circuit shown in FIG. 32.
Figure 35:
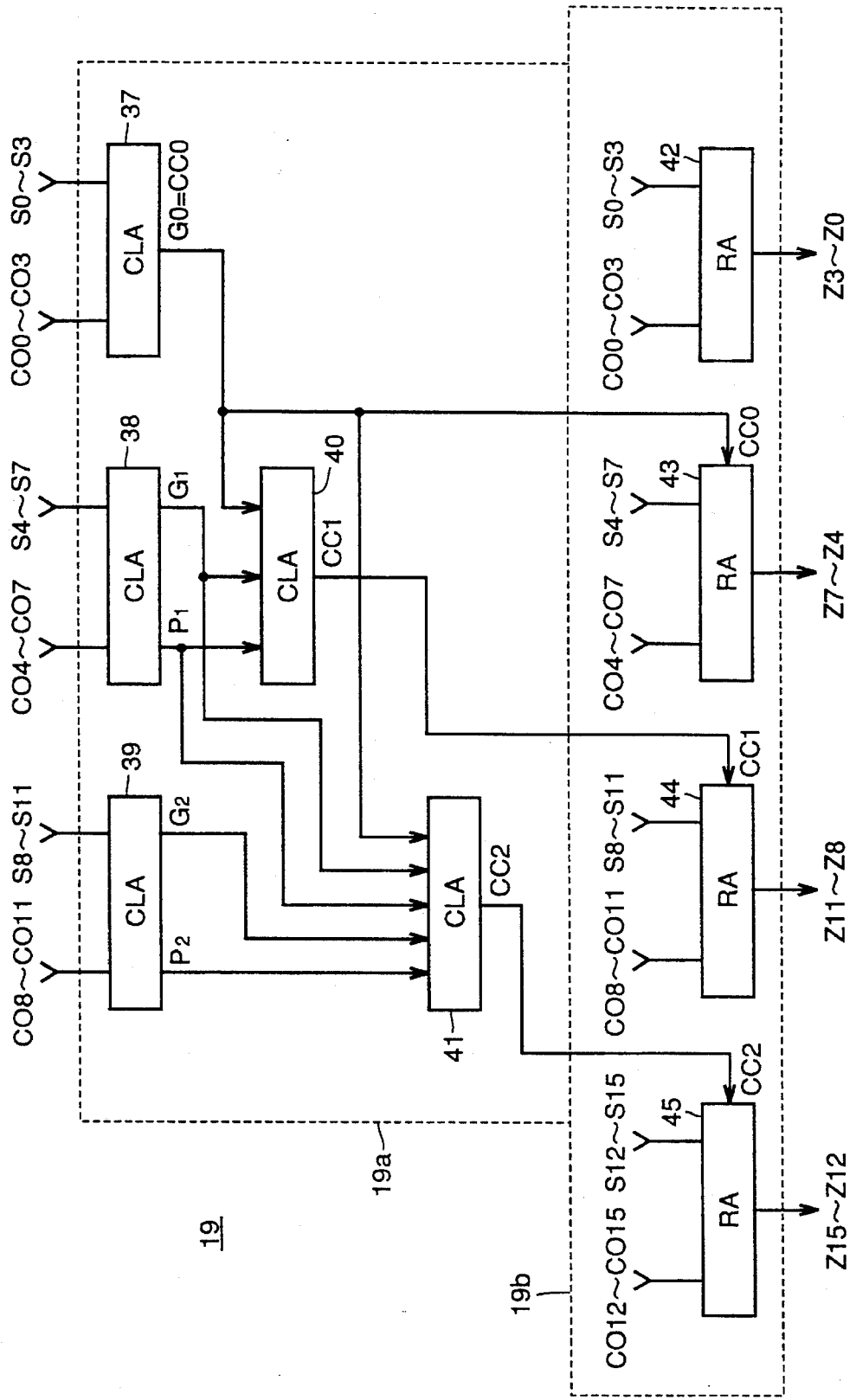
FIG. 35 is a diagram showing a structure example of a final adding circuit shown in FIG. 32.
Figure 36:
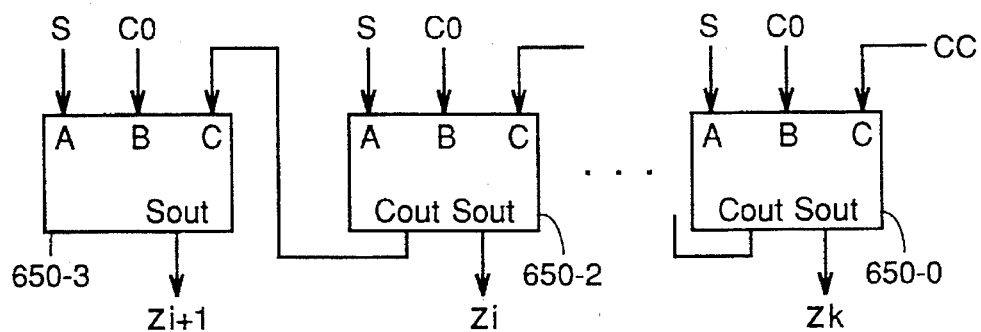
FIG. 36 is a diagram showing a structure of a ripple adder shown in FIG. 35.
Figure 37:
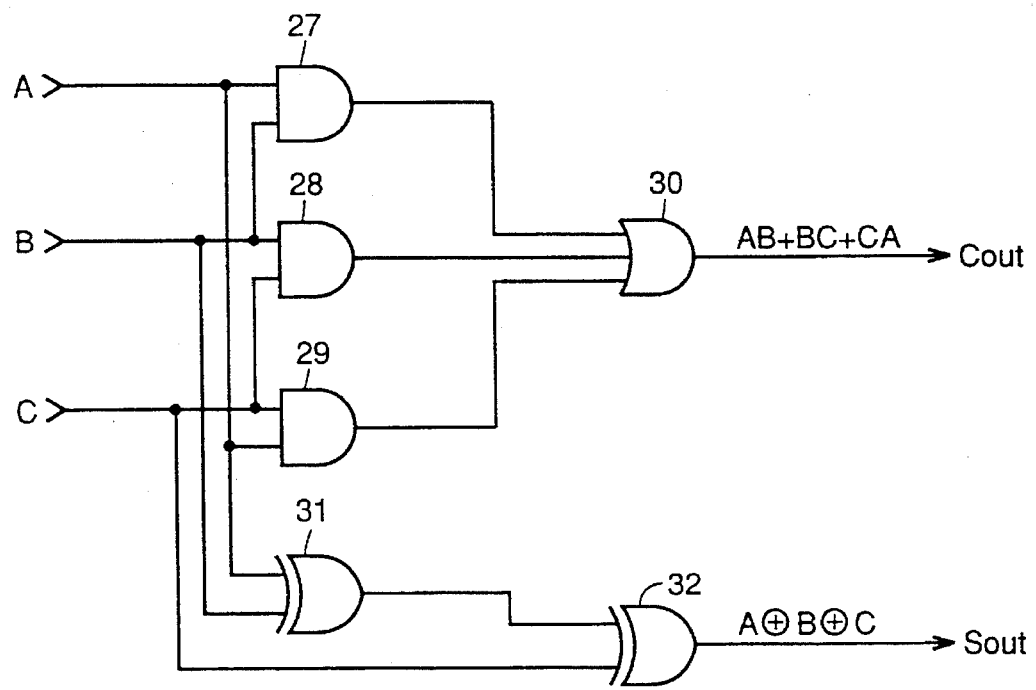
FIG. 37 is a diagram showing a specific structure of a full adder shown in FIGS. 34 and 36.
Figure 38:
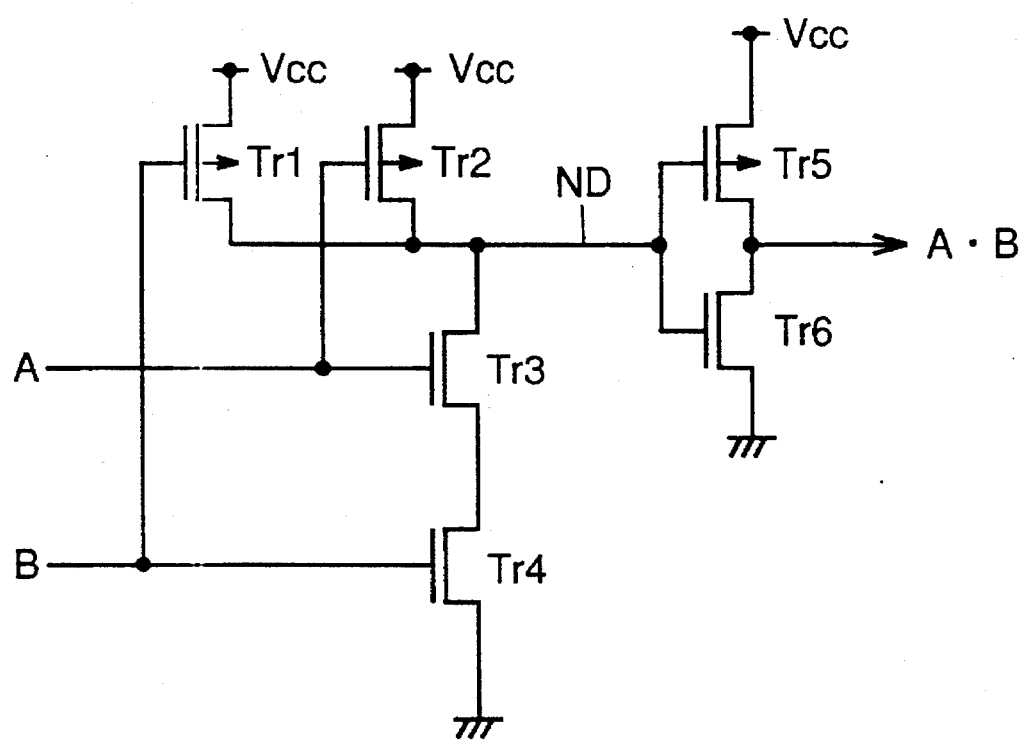
FIG. 38 is a diagram showing a structure of a conventional AND circuit.

Referring to FIG. 14, a sign inverting shifter/inverter circuit 800 (representatively shifter/inverter circuits 170 and 171) includes a 0 generator 610, an X generator 612, a 2X generator 614 and a 1 generator 616, similar to conventional shifter/inverter circuit 9 shown in FIG. 33B.

Sign inverting shifter/inverter circuit 800 further includes a 2-input NOR circuit 802 receiving control signals $\phi IV$ and $\phi 0$, gate circuits 618 and 620 inverting or non-inverting outputs of X generator 612 and 2X generator 614 to pass the same in response to the output of NOR circuit 802, and a selecting circuit 622 selectively passing one of the outputs of 0 generator 610, gate circuits 618 and 620 according to control signals $\phi 0$, $\phi X$ and $\phi 2X$. In FIG. 14, gate circuits 618, 620 and selecting circuit 622 representatively show the configuration in which operations for 1 bit of 0 generator 610, X generator 612 and 2X generator 614 are performed.

Selecting circuit 622 includes a transfer gate 621 passing the output of 0 generator 610 in response to control signal $\phi 0$, a transfer gate 623 passing the output of gate circuit 618 in response to control signal $\phi X$, and a transfer gate 625 passing the output of gate circuit 620 in response to control signal $\phi 2X$. 1 generator 616 generates a correction bit ("1") when the output of NOR circuit 802 is in an active state of "H ("1")".

The operation will now be described in brief. When both control signals $\phi 0$ and $\phi IV$ are in an inactive state of "0" ("L"), partial product X or 2·X is designated in the conventional Booth encoder. In this case, the output of NOR circuit 802 attains an "H" level, and gate circuits 618 and 620 serve as inverter circuits. As a result, each bit of outputs of X generator 612 and 2X generator 614 is inverted. The output of 1 generator 616 attains "1". When the output of the conventional Booth encoder designates partial product X or 2X, control signal $\phi X$ or $\phi 2X$ is generated. Therefore, partial product −X or −2X is provided from sign inverting shifter/inverter circuit 800.

If control signal $\phi IV$ is "1", the output of NOR circuit 802 attains an "L" level. In this case, gate circuits 618 and 620 pass the outputs of X generator 612 and 2X generator 614 without inversion. According to control signal $\phi X$ or $\phi 2X$, the output of gate circuit 618 or 620 is selected to be provided. Therefore, when partial product −X or −2X is designated according to the Booth algorithm, partial product X or 2·X, obtained by sign inversion of partial product −X or −2X is generated.

When control signal $\phi 0$ is "1", the output of 0 generator 610 is selected. In this case, 1 generator 616 does not generate a correction bit, and only provides a bit value of "0". By using the configuration shown in FIG. 14, the sign inverting shifter/inverter circuit can be implemented.

Referring again to FIG. 13, by providing sign inverting shifter/inverter circuits 170 and 171, a sign inverted partial product is generated. By generating one redundant binary number using the sign non-inverted partial product and the sign inverted partial product as a set, the operation similar to the case of the embodiment 1 of FIG. 1 can be performed. At most significant bit positions, conversion similar to the configuration shown in FIG. 4 is carried out.

In FIG. 13, the multiplier further includes converting circuit 57 generating three-value redundant binary number 58 from partial products 13, 55, 14 and 56, intermediate sum generating circuit 59 generating an intermediate sum from the three-value redundant binary number, and final adding circuit 61 adding intermediate sum 60 from intermediate sum generating circuit 59 to generate 16-bit data Z representing the product X·Y. Converting circuit 57, intermediate sum generating circuit 59 and final adding circuit 61 have the same configurations as those shown in FIG. 1.

In the configuration of the multiplier shown in FIG. 13, partial products similar to the case of Embodiment 1 can be obtained, a product can be calculated using the redundant binary number, and the effect the same as Embodiment 1 can be obtained.

Embodiment 3

Figure 15:
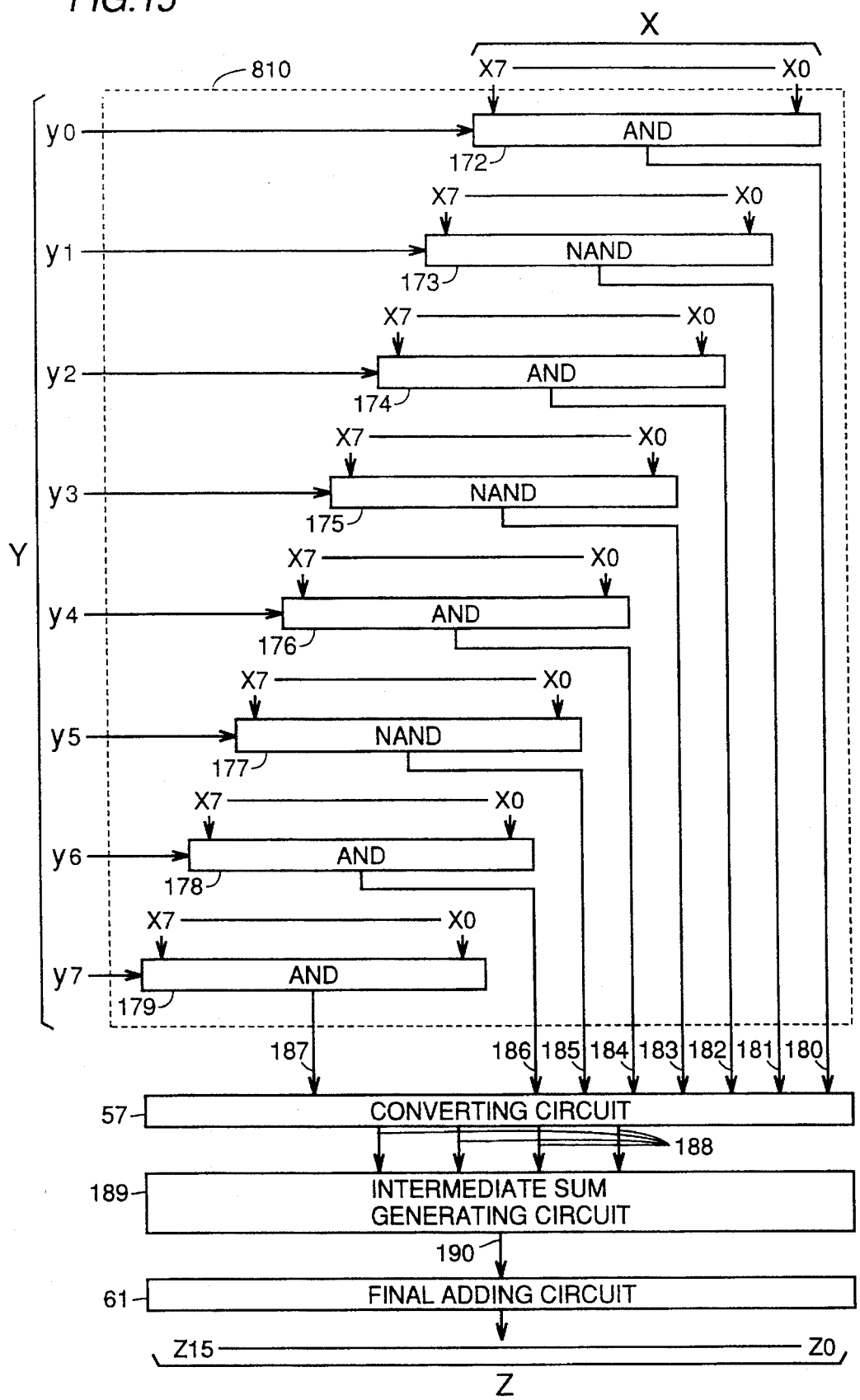
FIG. 15 is a diagram showing the entire structure of a multiplier according to a third embodiment of the present invention.

FIG. 15 is a diagram showing the configuration of the multiplier according to the third embodiment of the present invention. The multiplier shown in FIG. 15 performs multiplication without using the Booth algorithm. More specifically, the multiplier shown in FIG. 15 finds product X·Y according to the operation $\Sigma y_j \cdot X$ (where j=0 to 7). Multiplier Y and multiplicand X are both 8-bit binary numbers represented in a two's complement.

Referring to FIG. 15, the multiplier includes a partial product generating circuit 810 generating partial products from 8-bit multiplier Y and 8-bit multiplicand X. Partial product generating circuit 810 includes AND circuits 172, 174, 176, 178 and 179 provided for bits y0, y2, y4, y6 and y7 of multiplier Y, and NAND circuits 173, 175 and 177 provided for bits y1, y3 and y5 of multiplier Y. AND circuits 172, 174, 176, 178 and 179 generate partial products 180, 182, 184, 186 and 187 by carrying out the AND operation of respectively corresponding multiplier bit yj and each of bits x7 to x0 of multiplicand X.

NAND circuits 173, 175 and 177 carries out the NAND operation respectively of corresponding multiplier bit yj and each of bits x7 to x0 of multiplicand X. At the same time, NAND circuits 173, 175 and 177 adds "1" to the least significant bit to generate partial products 181, 183 and 185. NAND circuits 173, 175 and 177 carry out the NAND operation and adds "1" to the least significant bit. As a result, partial products obtained by inversion of positive and negative signs of partial products are generated.

Both multiplier Y and multiplicand X here are 8-bit data represented in a two's complement format. The most significant bit y7 of multiplier Y represents a negative value if the bit y7 is "1". When multiplication of binary numbers represented in a two's complement is performed and the sign bit y7 of multiplier y is "1", multiplier y is a negative value, and a partial product generated by multiplier bit y7 is a two's complement of multiplicand X. In the present invention, it is necessary to invert the sign of the partial product. Therefore, in the configuration shown in FIG. 15, the circuit generating a partial product for the sign bit y7 of multiplier Y is not a NAND circuit but of an AND circuit. As a result, a sign inverted partial product is generated.

In the configuration shown in FIG. 15, a bit (correction bit) for sign inversion is not added at the least significant bit position for partial product 187 at the most significant position. Therefore, the number of partial products to be generated is reduced. This is an advantage inherent to Embodiment 3.

Since both multiplicand X and multiplier Y are represented in a two's complement, the bit value conversion similar to the arrangement shown in FIG. 4 is carried out on most significant bit side, and reduction of bits of the partial product for most significant bit position is carried out.

Referring to FIG. 15, the multiplier further includes converting circuit 57 receiving partial products 180 to 187 from partial product generating circuit 810 to generate four redundant binary numbers, intermediate sum generating circuit 189 performs the redundant binary addition of four redundant binary numbers from converting circuit 57 to generate an intermediate sum, and final adding circuit 61 receiving intermediate sum 190 from intermediate sum generating circuit 189 to generate the product X·Y.

Converting circuit 57 forms pairs of partial products (sign inverted partial products and sign non-inverted partial products) based on partial products from partial product generating circuit 810. Converting circuit 57 carries out conversions similar to those shown in Embodiment 1 for respective pairs to generate a redundant binary number having three values of (01), (00), (10). As for sets of partial products each forming a redundant binary number are pairs of partial products 180 and 181, partial products 182 and 183, partial products 184 and 185, and partial products 186 and 187 are paired, respectively.

Intermediate sum generating circuit 189 carries out redundant binary addition of four redundant binary numbers 188. The configuration of intermediate sum generating circuit 189 is shown in FIG. 16.

The bits of the i-th digits of four redundant binary numbers generated by converting circuit 57 are represented by $(p_i^+ p_i^-)$, $(u_i^+ u_i^-)$, $(v_i^+ v_i^-)$ and $(w_i^+ w_i^-)$. In FIG. 16, the configuration of the intermediate sum generating circuit of the (i+1)-th digit, the i-th digit, and the (i−1)-th digit is shown.

Figure 16:
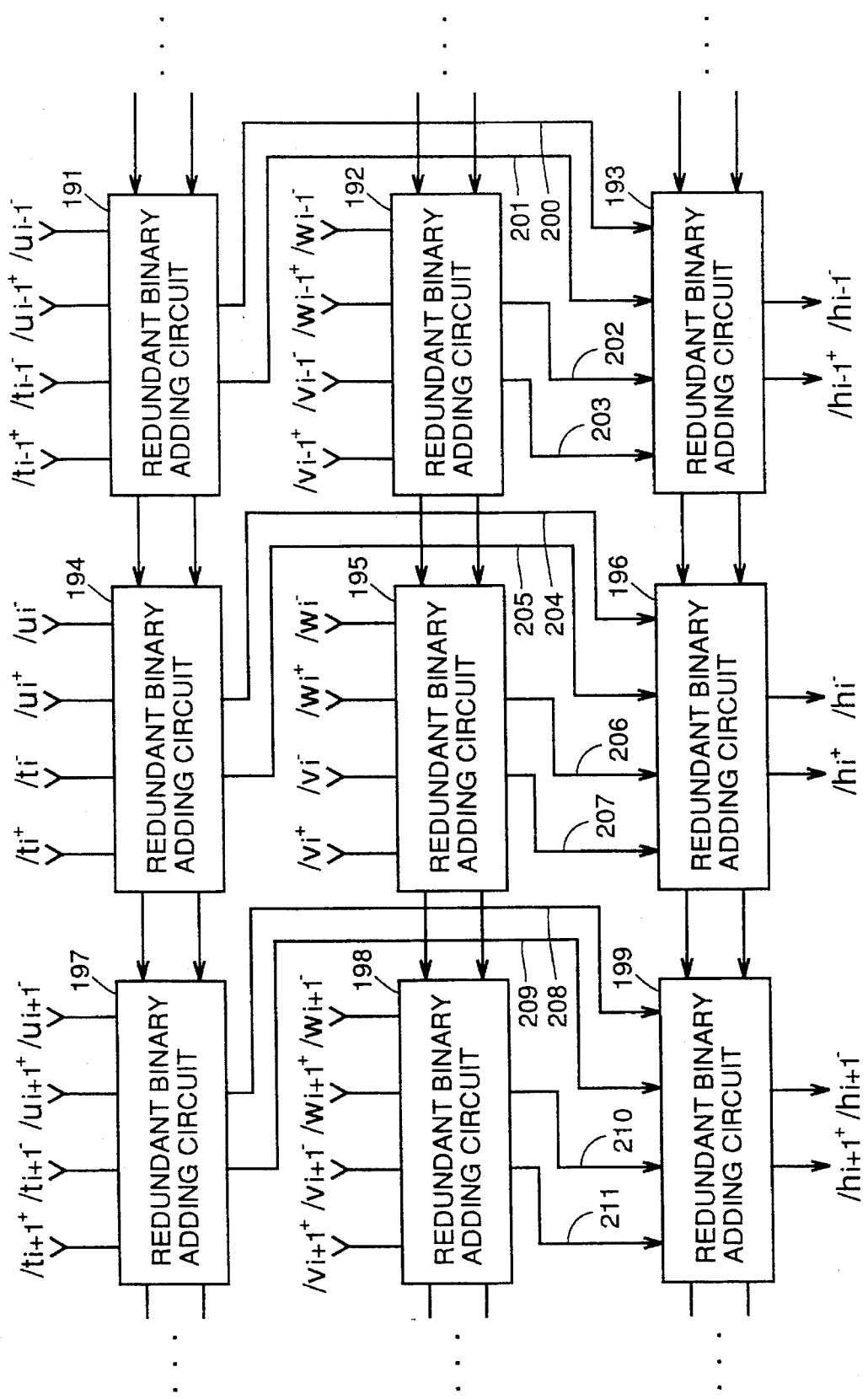
FIG. 16 is a diagram showing a structure of an intermediate sum generating circuit shown in FIG. 15.

Referring to FIG. 16, the intermediate sum generating circuit includes first redundant binary circuits 191, 194 and 197 for carrying out redundant binary addition-of the above-described redundant binary number P $\{(p_j^+ p_j^-)\}$ and second redundant binary number U $\{(u_j^+ u_j^-)\}$, second redundant binary adding circuits 192, 195 and 198 carrying out redundant binary addition of third redundant binary number V $\{(v_j^+ v_j^-)\}$ and fourth redundant binary number W $,+ \{(w_j^+ w_j^-)\}$, third redundant binary adding circuits 193, 196 and 199 carrying out redundant binary addition of outputs of first redundant binary adding circuits 191, 194 and 197 and second redundant binary adding circuits 192, 195 and 198. Redundant binary number H $\{(h_j^+ h_j^-)\}$ is generated from redundant binary adding circuits 193, 196 and 199. In the configuration shown in FIG. 16, redundant binary addition of all inverted values of the redundant binary bits is carried out, and the output is also an inverted value.

Redundant binary adding circuit 193 carries out redundant binary addition of outputs 200 and 201 of redundant binary adding circuit 191 and outputs 202 and 203 of redundant binary adding circuit 192. Redundant binary adding circuit 196 adds outputs 204 and 205 of redundant binary adding circuit 194 and outputs 206 and 207 of redundant binary adding circuit 195. Redundant binary adding circuit 199 adds outputs 208 and 209 of redundant binary adding circuit 197 and outputs 210 and 211 of redundant binary adding circuit 198. As is clearly seen in the configuration shown in FIG. 16, the outputs of each redundant binary adding circuit is aligned for each digit. Because of the regularity, interconnection of the circuits is facilitated.

A method of obtaining product X·Y from redundant binary number /H {(/hj⁺/hj⁻)} generated from redundant binary adding circuits 193, 196,199 is the same as the case of Embodiment 1 shown in FIG. 1, and product X·Y is generated by final adding circuit 61 shown in FIG. 13.

In the configuration of Embodiment 3 shown in FIGS. 15 and 16, although the redundant binary adders in the intermediate sum generating circuit are increased by one-stage, the Booth encoder and the shifter/inverter circuit for generating partial products are not required. Therefore, the circuit configuring can be facilitated, and the chip area for the Booth encoder can be eliminated.

For partial product 187 generated from the sign bit y7 of multiplier Y, it is not necessary to add one to the least significant bit for sign inversion. Therefore, there is an advantage of reducing the number of partial products.

Embodiment 4

Figure 17:
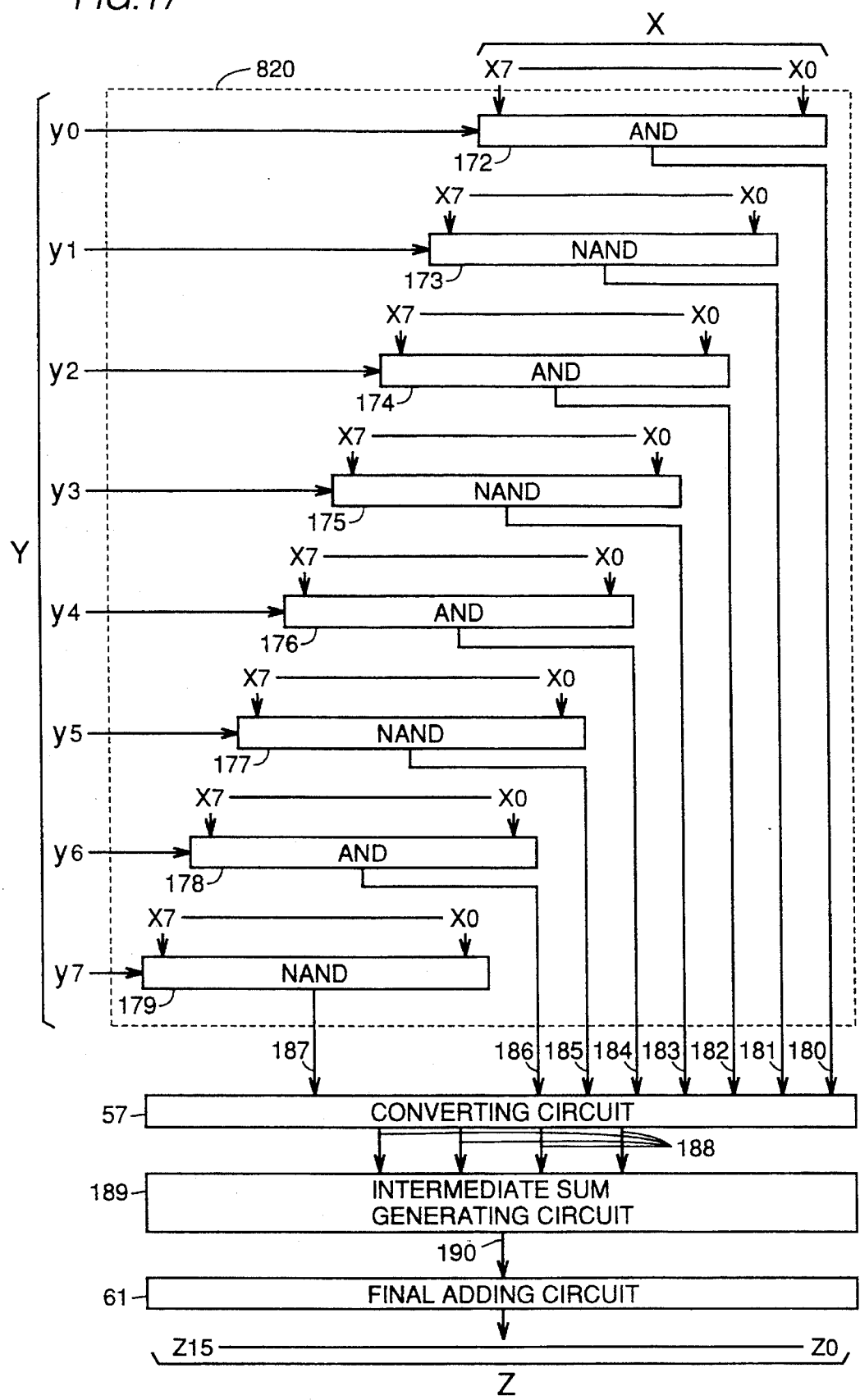
FIG. 17 is a diagram showing the entire structure of a multiplier according to a fourth embodiment of the present invention.

FIG. 17 is a diagram showing the entire configuration of the multiplier according to the fourth embodiment of the present invention. FIG. 17 shows the configuration for multiplying 8-bit binary numbers X and Y represented in an absolute value. In the absolute value representation, both multiplier Y and multiplicand X are positive numbers. Even if the most significant bit y7 of multiplier Y is "1", multiplier Y is a positive number. The multiplier shown in FIG. 17 includes partial product generating circuit 870 generating each bit yj (j=0 to 7) of 8-bit multiplier Y and multiplicand X represented in an absolute value. Partial product generating circuit 870 includes AND circuits 172, 174, 176 and 178 provided corresponding to bits y0, y2, y4 and y6 of multiplier Y to carry out the AND operation of corresponding multiplier bit yj and multiplicand X, and NAND circuits 173, 175, 177 and 179 provided corresponding to bits y1, y3, y5 and y7 of multiplier Y to carry out the NAND operation of corresponding multiplier bit yj and each bit of multiplicand X.

As described above, when the most significant bit y7 of multiplier Y is "1" the partial product to be generated is a positive number in an absolute value representation. Therefore, in order to form a pair of partial products for generating a redundant binary number, it is necessary to invert a sign of a partial product generated by the most significant bit y7 of multiplier Y. For this end, NAND circuit 179 inverting the sign is provided for bit y7 of multiplier Y. NAND circuits 173, 175, 177 and 179 shown in FIG. 17 respectively invert each bit value of the partial product, and add "1" to the least significant bit position. In an absolute value representation, as for the AND circuit, the extra most significant bits of the partial product are all "0", while the extra most significant bits are all "1" for the NAND circuit. In this case, similar to the case of the Embodiment 1, reduction of the number of the partial products, that is, conversion of both bit values of a set of most significant bit into 0, is carried out. Also in this case, using the output of the AND circuit and the output of the NAND circuit as a set, one redundant binary number is generated.

Configurations of converting circuit 57, intermediate sum generating circuit 189, and final adding circuit 61 are the same as those shown in FIG. 17, and the same calculation is carried out.

Also in the configuration shown in FIG. 17, it is possible to obtain the effect similar to that of Embodiment 3 in the product of binary numbers in an absolute value representation.

In the configuration shown in FIG. 17, when multiplier Y and multiplicand X are binary numbers in a signed absolute value representation, the product of parts of absolute values excluding their sign bits may be found by using the configuration shown in FIG. 17. The configuration in which the final sign is generated by match/mismatch of the sign bits of multiplier Y and multiplicand X may be used.

Embodiment 5

In the Embodiment 1 to Embodiment 4, one redundant binary number is generated from two partial products adjacent to each other. In those embodiments, the configuration may be used in which for multiplier bits, partial products are divided into two groups of most significant bit side and least significant bit side, the sign of one group is inverted, and one redundant binary number is generated using one of sign inverted partial products and one of sign non-inverted partial products as a pair. By using combination of arbitrary partial products, one redundant binary number can be generated. Any sign inverted partial product and any sign non-inverted partial product may be paired.

Embodiment 6

Figure 18:
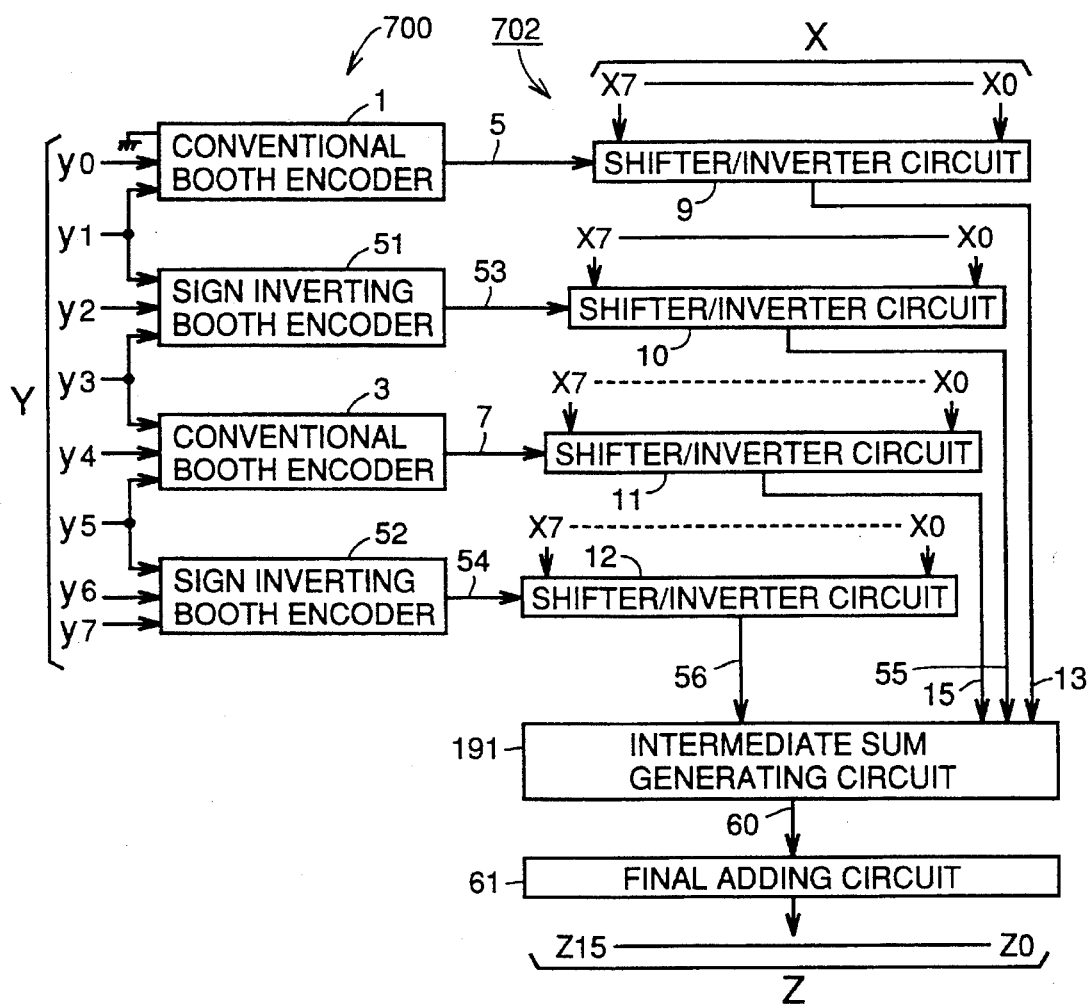
FIG. 18 is a diagram showing the entire structure of a multiplier according to a fifth embodiment of the present invention.
Figure 19:
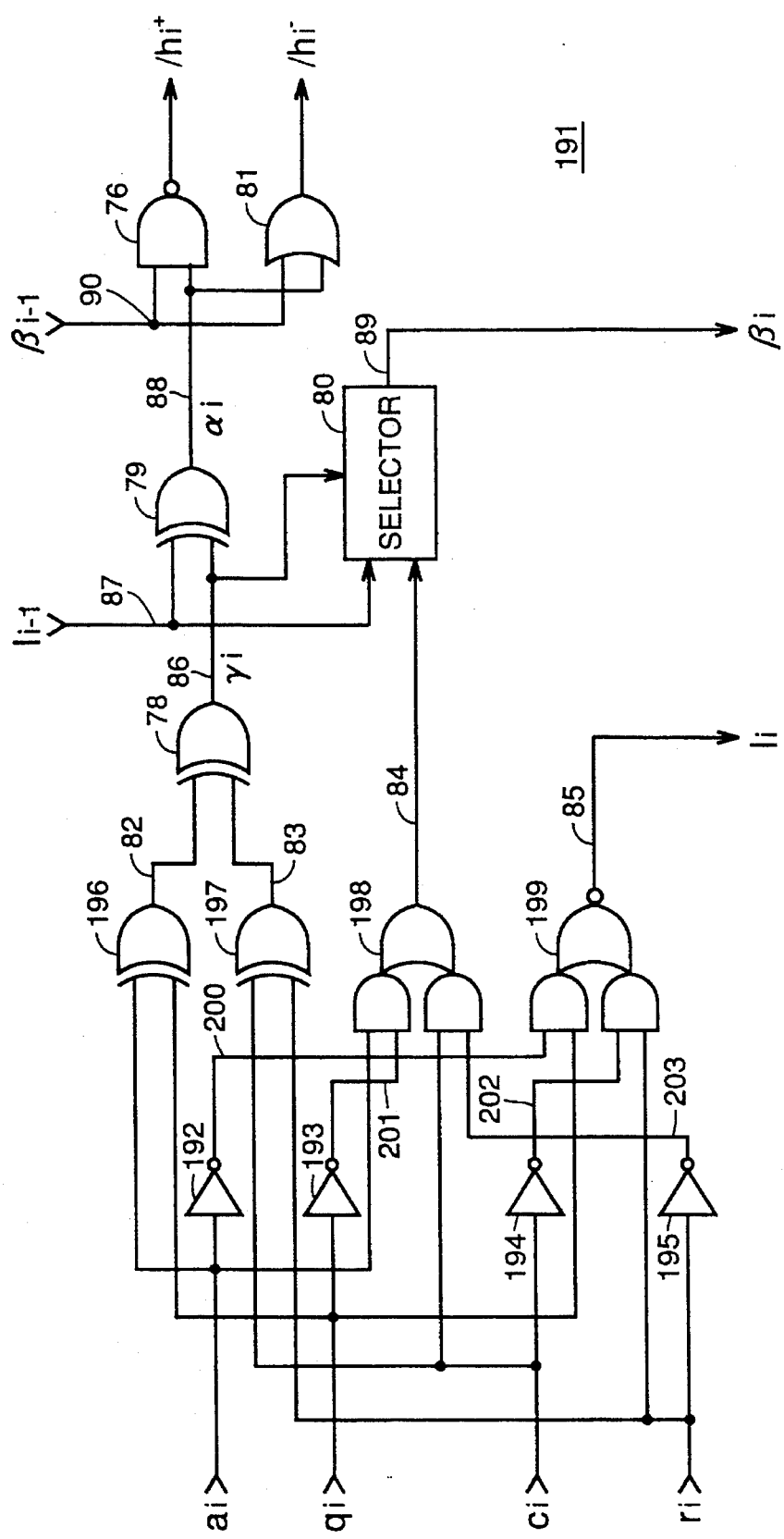
FIG. 19 is a diagram showing a specific structure example of an intermediate sum generating circuit shown in FIG. 18.

FIG. 18 is a diagram showing the entire configuration of the multiplier according to the sixth embodiment of the present invention. In the multiplier shown in FIG. 18, encoding circuit 700 and partial product generating circuit 702 have the same configurations as those of Embodiment 1 shown in FIG. 1. Intermediate sum generating circuit 191 includes both functions of converting circuit 59 and intermediate sum generating circuit 191 shown in FIG. 1. More specifically, intermediate sum generating circuit 191 generates a redundant binary number from partial products 13, 55 and 56 from partial product generating circuit 702, and generates an intermediate sum after generation of a three-value redundant binary number. The specific configuration of intermediate sum generating circuit 191 is shown in FIG. 19. FIG. 19 shows the configuration corresponding to the i-th digit in intermediate sum generating circuit 191. Bits ai, qi, ci and ri shown in FIG. 19 represent bits shown in FIG. 4.

Referring to FIG. 19, the i-th digit redundant binary adding circuit of intermediate sum generating circuit 191 includes inverter circuits 192, 193, 194 and 195 respectively inverting binary number bits ai, qi, ci and the ri, a 2-input XOR circuit 196 receiving bits ai and qi, a 2-input XOR circuit 197 receiving bits ci and ri, an AND/OR composite circuit 198 receiving the output of inverter circuit 193, bits ai, ci, and the output of inverter circuit 195, and an AND/NOR composite circuit 199 receiving the output of inverter circuit 192, bit qi, the output of inverter circuit 194, and bit ri.

AND/OR composite circuit 198 includes a 2-input AND circuit receiving the output of inverter circuit 193 and bit ai, a 2-input AND circuit receiving bit ci and the output of the inverter circuit receiving bit ri, and a 2input OR circuit receiving the outputs of these AND circuits.

AND/NOR composite circuit 199 includes a 2-input AND circuit receiving the output of inverter circuit 192 and bit qi, a 2-input AND circuit receiving the output of inverter circuit 194 and bit ri, and a 2-input NOR circuit receiving the outputs of these AND circuits.

The redundant binary adding circuit shown in FIG. 19 (included in intermediate sum generating circuit 191) further includes, similar to the configuration shown in FIG. 7, 2-input XOR circuit 78 receiving the outputs of XOR circuits 196 and 197, selector 80 selecting one of signal $l_{i-1}$ transmitted onto signal line 87 from the redundant binary adding circuit at one bit less significant bit position and a signal transmitted onto signal line 84 from AND/OR composite circuit 198, 2-input XOR circuit 79 receiving signal $l_{i-1}$ and the output of XOR circuit 78, 2-input NAND circuit 76 receiving signal $\beta_{i-1}$ and the output of XOR circuit 79, and 2-input OR circuit 81 receiving signal $\beta_{i-1}$ and the output of XOR circuit 79. The operation will now be described.

Inverter circuits 192, 193, 194 and 195 generate inverted bits /ai, /qi, /ci and /ri, respectively. 2input XOR circuit 196 provides exclusive AND of bits ai and qi from bits ai and qi (ai·/qi+/ai·qi). 2-input XOR circuit 197 provides exclusive or (ci·/ri+/ci·ri) of bits ci and ri.

AND/OR composite circuit 198 provides (ai·/qi+ci·/ri). AND/NOR composite circuit 199 provides /(/ai·qi+/ci·r2).

The outputs of XOR circuits 196 and 197, AND/OR composite circuit 198, and AND/NOR composite circuit 199 are the same as the outputs of 2-input NAND circuits 73 and 74, NAND circuit 75, and AND circuit 77 shown in FIG. 7, respectively.

The other circuit configurations are similar to those shown in FIG. 7. Similar to the case shown in FIG. 7, the inverted value/$hi^+$ of an upper bit of a redundant binary bit is provided from 2-input NAND circuit 76, and the inverted value/$hi^-$ of a lower bit of a redundant binary bit is provided from 2-input OR circuit 81. More specifically, according to the configuration, similar to the case of FIG. 7, redundant binary bit ($hi^+$ $hi^-$) having one of three values of (01), (00) and (10) can be obtained.

In the configuration of the multiplier shown in FIG. 16, partial products generated from partial product generating circuit 702 can be directly provided to the intermediate sum generating circuit. It is not necessary to pass the partial products through the converting circuit. As a result, it is possible to simplify the circuit configuration.

When the number of bits of the multiplier and the multiplicand is increased and the number of partial products generated from the partial product generating circuit is increased, a plurality of stages of redundant binary adding circuits are required in the intermediate sum generating circuit. In this case, the configuration shown in FIG. 19 is used for the redundant binary adding circuit of the first stage receiving bits of partial products provided from the partial product generating circuit, and the configuration shown in FIG. 7 is used for the redundant binary circuits of the second and subsequent stages.

In the case of the configuration of the multiplier shown in FIGS. 18 and 19, redundant binary bit (11) can be directly provided to the intermediate sum generating circuit without converting the redundant binary bit into bit (00). The bit (11) is internally converted into bit (00) in circuit 191. As a result, even if the number of partial products increases, it is possible to generate the intermediate sum with a simple circuit configuration.

Embodiment 7

Figure 20:
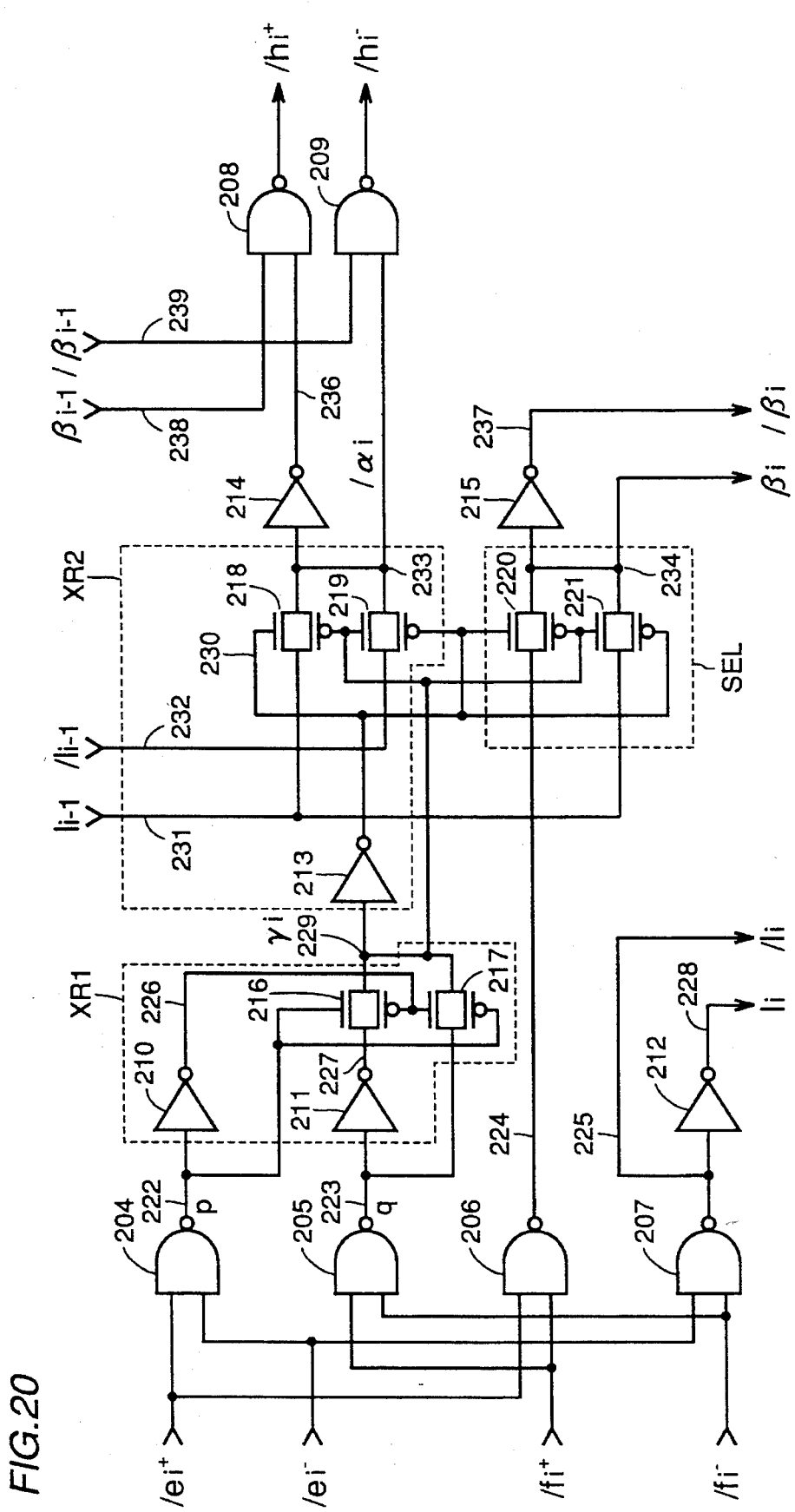
FIG. 20 is a diagram showing a first modification of the intermediate sum generating circuit used in the present invention.

FIG. 20 is a diagram showing the configuration of main portions of the multiplier according to the seventh embodiment of the present invention. FIG. 20 shows a modification of the binary multiplying circuit shown in FIG. 7.

Referring to FIG. 20, the redundant binary adding circuit includes a 2-input NAND circuit 204 receiving the inverted values /$ei^+$ and /$ei^-$ of a redundant binary bit, a 2-input NAND circuit 205 receiving the inverted values /$fi^+$ and /$fi^-$ of a redundant binary bit, a 2-input NAND circuit 206 receiving the inverted values /$ei^+$ and/$fi^+$ of a redundant binary bit, a 2-input NAND circuit 207 receiving the inverted values /$ei^-$ and /$fi^-$ of a redundant binary bit, and inverter circuits 210, 211 and 212 receiving outputs of 2-input NAND circuits 204, 205 and 207. Signals li and /li are generated on signal lines 228 and 225 from inverter circuit 212 and NAND circuit 207.

The redundant binary adding circuit further includes CMOS transmission gates 216 and 217 transmitting to signal line 229 one of the output of inverter circuit 211 and the output of NAND circuit 205 in response to the output of NAND circuit 204 and the output of inverter circuit 210. CMOS transmission gates 216 and 217 are rendered conductive in a manner complementary to each other.

The redundant binary adding circuit further includes an inverter circuit 213 receiving a signal on signal line 229, and CMOS transmission gates 218 and 219 transmitting onto a signal line 233 one of signals $l_{i-1}$ and $/l_{i-1}$ on signal lines 231 and 232 in response to the output of inverter circuit 213 and the signal on signal line 229. CMOS transmission gates 218 and 219 are rendered conductive in a manner complementary to each other.

The redundant binary adding circuit further includes CMOS transmission gates 220 and 221 transmitting onto a signal line 234 one of signal $l_{i-1}$ on signal line 231 and the signal provided from NAND circuit 206 onto signal line 224 in response to the output of inverter circuit 213 and the signal on signal line 229, and an inverter circuit 215 inverting the signal on signal line 234. The output of inverter circuit 215 is transmitted onto a signal line 237. Signal $\beta i$ is generated on signal line 234, and signal /$\beta i$ is generated on signal line 237.

The redundant binary adding circuit further includes an inverter circuit 214 receiving the signal on signal line 233, a 2-input NAND circuit 208 receiving the signal transmitted onto signal line 236 from inverter circuit 214 and signal $\beta_{i-1}$ on signal line 238, and a 2-input NAND circuit 209 receiving the signal on signal line 233 and signal /$\beta_{i-1}$ on signal line 239. The inverted value /$hi^+$ of a redundant binary bit is generated from NAND circuit 208, and the inverted value /$hi^-$ of a redundant binary bit is generated from 2-input NAND circuit 209. The operation will now be described.

When the output of NAND circuit 204 is at an "H" level, CMOS transmission gate 216 is rendered conductive, and CMOS transmission gate 217 is rendered non-conductive. As a result, the signal transmitted from inverter circuit 211 onto signal line 227 is transmitted onto signal line 229. On the other hand, when the signal transmitted from NAND circuit 204 onto signal line 222 is at an "L" level, CMOS transmission gate 216 is rendered non-conductive, and CMOS transmission gate 217 is rendered conductive. As a result, the output (on signal line 223) of NAND circuit 205 is transmitted onto signal line 229. If the output of NAND circuit 204 and the output of NAND circuit 205 are represented by p and q, respectively, the signal transmitted onto signal line 229 is represented by p·/q+p·q. More specifically, inverter circuits 210, 211 and CMOS transmission gates 216 and 217 configure an XOR circuit XR1. Signal $\gamma i$ appears on signal line 229.

If signal $\gamma i$ on signal line 229 is at an "H" level, CMOS transmission gate 219 is rendered conductive, and CMOS transmission 218 is rendered non-conductive, and signal $/l_{i-1}$ is transmitted onto signal line 233. On the other hand, when signal γi on signal line 229 is at an "L" level, CMOS transmission gate 218 is rendered conductive, and CMOS transmission gate 219 is rendered non-conductive, and signal $l_{i-1}$ is transmitted onto signal line 233. More specifically, the signal transmitted onto signal line 233 is $(γi·/l_{i-1})+(/γi·l_{i-1})$. More specifically, inverter circuit 213, CMOS transmission gates 218 and 219 configure an XOR circuit XR2. Signal αi is provided onto signal line 233.

When the output of inverter circuit 213 is at an "H" level, that is, when signal γi is at an "L" level, CMOS transmission gate 220 is rendered conductive, and transmits onto signal line 234 the output of NAND circuit 206 transmitted onto signal line 224. On the other hand, when signal γi is at an "H" level, CMOS transmission gate 221 is rendered conductive, and transmits signal $l_{i-1}$ onto signal line 234. The signal on signal line 234 is signal βi. More specifically, CMOS transmission gates 220 and 221 implement the same function as that of selector 80 shown in FIG. 7.

NAND circuit 208 carries out the NAND operation of the signal on signal line 236 provided from inverter circuit 214 and signal $β_{i-1}$ on signal line 230. The signal on signal line 233 is /αi. Therefore, the output of NAND circuit 208 is $/(αi·β_{i-1})=/hi^+$.

Similarly, the output of NAND circuit 209 is $/(/γi·/β_{i-1})=/hi^-$.

As described above, the XOR circuit can be implemented using the transmission gates, and the number of transistors configuring the redundant binary adding circuit is reduced to 48. Since the number of components can be substantially reduced as compared to the configuration of the conventional binary adding circuit requiring 60 or more transistors, it is possible to substantially reduce the area occupied by the circuit.

As shown in FIG. 20, by internally generating complementary control signal pairs, using one complementary control signal pair as a control signal, and passing selectively the other complementary control signal pair, it is possible to implement easily the function of the XOR circuit using the transmission gates.

Embodiment 8

Figure 21:
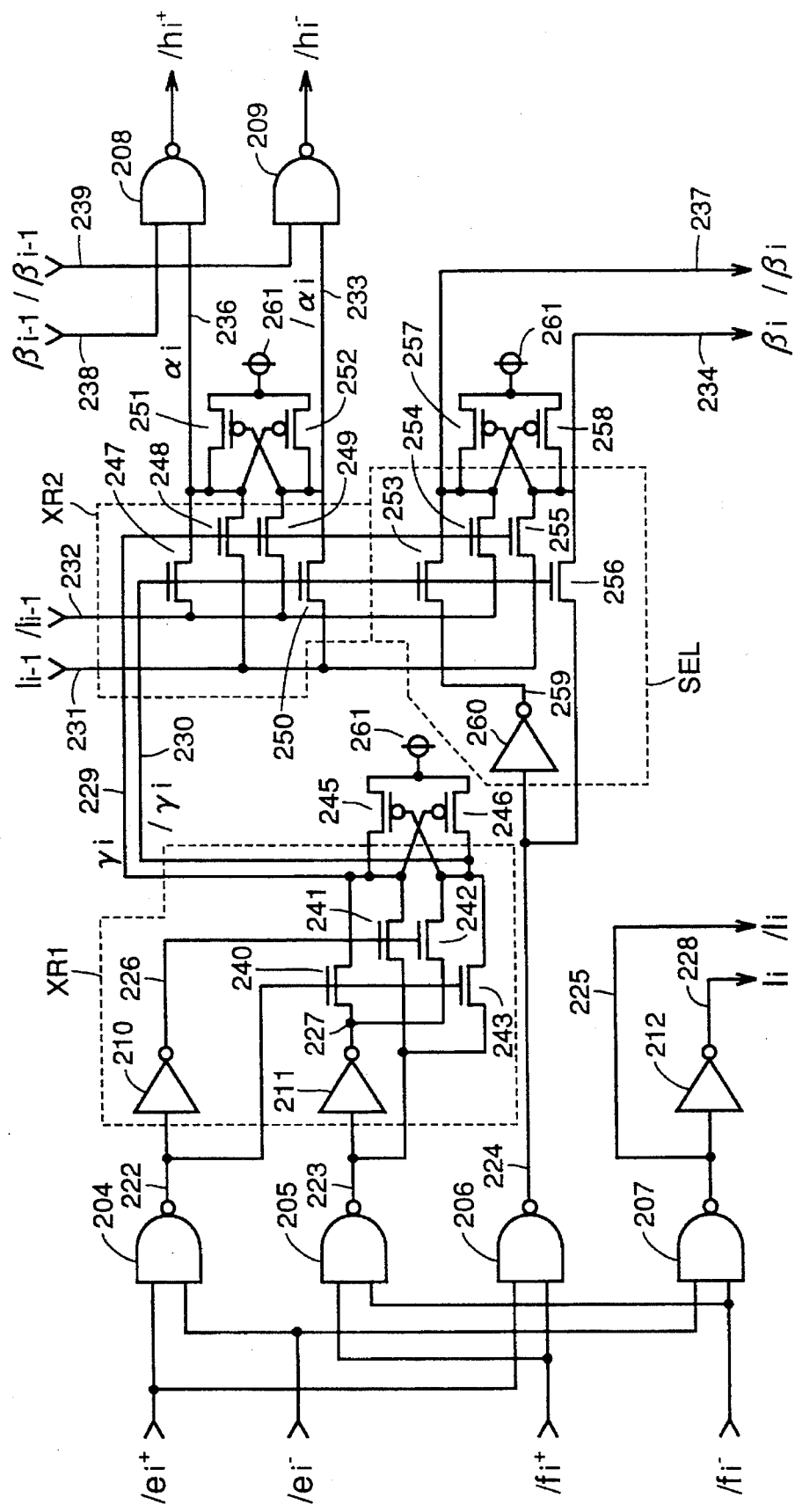
FIG. 21 is a diagram showing a second modification of the intermediate sum generating circuit used in the present invention.

FIG. 21 is a diagram showing the configuration of main portions of the multiplier according to the eighth embodiment of the present invention. The configuration shown in FIG. 21 is a modification of the redundant binary adding circuit shown in FIG. 20. In the redundant binary adding circuit shown in FIG. 21, in place of the CMOS transmission gate shown in FIG. 20, only an n channel MOS (insulating gate type field effect) transistor is used.

XOR circuit XR1 includes n channel MOS transistors 240 and 243 rendered conductive in response to the output of NAND circuit 204, and n channel MOS transistors 241 and 242 rendered conductive in response to the output of inverter circuit 210. Transistors 240 and 242 transmit applied signals onto signal line 229. Transistor 242 and 243 transmit applied signals onto signal line 230. When the signal applied from NAND circuit 204 onto signal line 222 is at an "H" level, transistors 240 and 243 are rendered conductive, and the output of inverter circuit 211 and the output of NAND circuit 205 are transmitted onto signal lines 229 and 230, respectively. When the output of NAND Circuit 204 is at an "L" level, transistors 241 and 242 are rendered conductive, and transmit the output of NAND circuit 205 and the output of inverter circuit 211 onto signal lines 229 and 230, respectively XOR circuit XR1 carries out the exclusive OR operation using the outputs of NAND circuits 204 and 205 as its inputs. A signal representing the XOR operation result is transmitted onto signal line 229, and a signal representing the XNOR operation result is simultaneously transmitted onto signal line 230.

The redundant binary adding circuit shown in FIG. 21 further includes an amplifying circuit differentially amplifying signal potentials on signal lines 229 and 230. The amplifying circuit includes p channel MOS transistors 245 and 246 having the gates and the drains cross-coupled. Transistors 245 and 246 further increase the high potentials of signal lines 229 and 230 up to the power supply potential level by a current from a power supply potential supply node 261. For example, when the signal potential of signal line 230 is lower than that of signal line 229, the conductivity of transistor 245 becomes high, causing the potential of signal line 229 to the power supply potential Vcc level. As a result, loss of the threshold voltage at the time of signal transmission by field effect transistors 240 to 243 is reliably compensated for, which makes it possible to transmit a signal having a sufficient signal level at a high speed.

XOR circuit XR2 includes n channel MOS transistors 248 and 249 rendered conductive in response to the signal potential on signal line 229 to transmit signals $l_{i-1}$ and $/l_{i-1}$ on signal lines 231 and 232 to signal lines 236 and 233, respectively, and n channel MOS transistors 247 and 250 rendered conductive in response to the signal potential on signal line 230 to transmit signals $/l_{i-1}$ and $l_{i-1}$ on signal lines 232 and 231 onto signal lines 236 and 233, respectively. XOR circuit XR2 receives signals on signal lines 231 and 232 as inputs and provides a signal representing the XOR operation result on signal line 233, and provides signal representing the XNOR operation result on signal line 236. More specifically, when the signal on signal line 230 is at an "H" level (the signal potential on signal line 229 is at an "L" level), transistors 247 and 250 are rendered conductive, and signals $/l_{i-1}$ and $l_{i-1}$ are transmitted onto signal lines 236 and 233, respectively. Otherwise, signals $l_{i-1}$ and $/l_{i-1}$ are transmitted onto signal lines 236 and 233, respectively.

For signal lines 233 and 236, provided are p channel MOS transistors 251 and 252 having their gates and drains cross-coupled and their sources connected together to power supply potential supply node 261. Transistors 251 and 252 differentially amplify potentials on signal lines 233 and 236, and reliably compensate for the signal loss of transistors 247 to 250.

A selector SEL includes n channel MOS transistors 255 and 254 rendered conductive in response to the signal potential on signal line 229 to transmit signals $l_{i-1}$ and $/l_{i-1}$ on signal lines 231 and 232 onto signal lines 234 and 237, respectively, and n channel MOS transistors 253 and 256 rendered conductive in response to the signal potential on signal line 230 to transmit the output of NAND circuit 206 and the output of inverter circuit 259 onto signal lines 234 and 237, respectively. When the potential of signal line 229 is at an "H" level, transistor 255 is rendered conductive, and signal $l_{i-1}$ is transmitted onto signal line 234. When the potential on signal line 229 is at an "L" level, the output of NAND circuit 206 is transmitted onto signal line 234 through transistor 256.

In order to differentially amplify signal potentials on signal lines 234 and 237, p channel MOS transistors 257 and 258 having their gates and drains cross-coupled and their sources connected together to power supply potential supply node 261 are further provided. Transistor 257 increases the potential on signal line 237 up to the power supply potential level, and transistor 258 increases the potential on signal line 234 up to the power supply potential level. As a result, the signal loss in transistors 253 to 255 is reliably compensated for.

The operation of the redundant binary adding circuit shown in FIG. 21 is the same as that shown in FIG. 20, since the CMOS transmission gate pair is only replaced with the n channel transistors. In the configuration of the redundant binary adding circuit shown in FIG. 21, as compared to the configuration shown in FIG. 20, XOR circuits XR1 and XR2 and selector circuit SEL generate complementary signal pairs respectively. Therefore, an inverter circuit for generating a complementary signal pair is not required. As a result, as compared to the configuration of the redundant binary adding circuit shown in FIG. 20, the number of stages of gate circuits in the signal propagation path is reduced. Therefore, it is possible to propagate signals at a high speed, resulting in a high speed operation.

Also in the configuration shown in FIG. 21, since the XOR circuit is implemented by four (six including transistors for amplification) transistors, the number of transistors included therein is reduced to 50. It is possible to substantially reduce the number of components as compared to the configuration of the conventional binary adding circuit. The circuit configuration can be simplified, the occupying area thereof can be reduced, and the signals can be propagated at a high speed. In a sense, the cross-coupled transistor pair configuring the amplifying circuit configures a positive feedback circuit, since the transistor pair boosts the signal line of an "H" level up to the power supply potential level.

Figure 22:
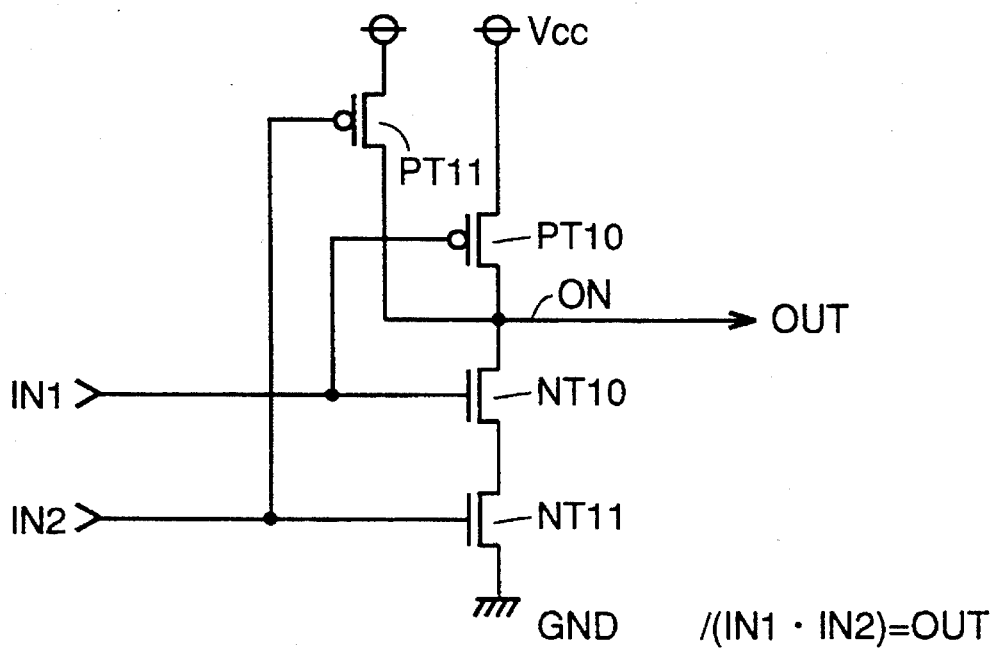
FIG. 22 is a diagram showing one example of a structure of a NAND circuit.
Figure 23:
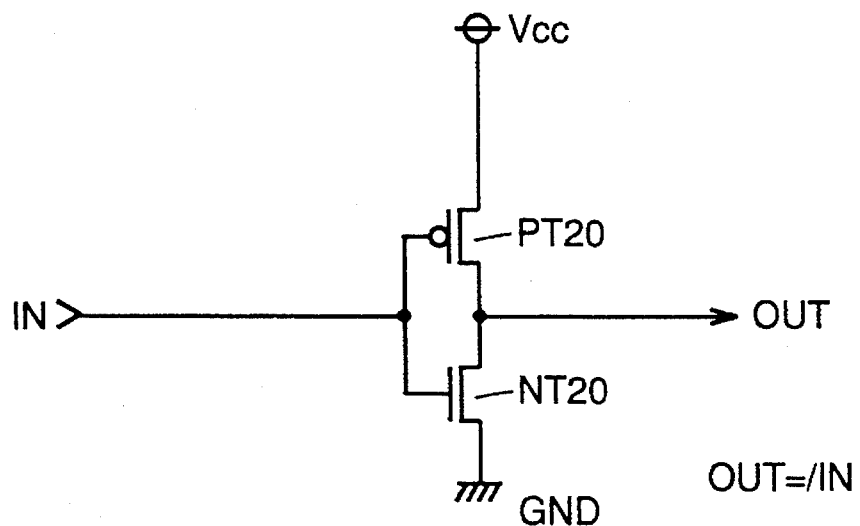
FIG. 23 is a diagram showing one example of a structure of an inverter circuit.

FIGS. 22 and 23 show specific configurations of the NAND circuit and the inverter circuit shown in FIGS. 20 and 21. FIG. 22 shows a configuration of the NAND circuit, and FIG. 23 shows a configuration of the inverter circuit.

In FIG. 22, the NAND gate includes p channel MOS transistors PT10 and PT11 provided in parallel with each other between a power supply node supplying the power supply potential Vcc and an output node ON to receive inputs IN1 and IN2 at their gates, respectively, and n channel MOS transistors NT10 and NT11 connected in series between the output node ON and the ground potential GND to receive inputs IN1 and IN2 at their gates, respectively. In the NAND gate shown in FIG. 22, when both inputs IN1 and IN2 attain an "H" level, transistors NT10 and NT11 are both rendered conductive, transistors PT11 and PT10 are both rendered non-conductive, and an output OUT attains an "L" level. The NAND gate can thus be configured by using four transistors.

Referring to FIG. 23, the inverter circuit includes a p channel MOS transistor PT20 and an n channel MOS transistor NT20 connected in a complementary manner with each other between the power supply potential Vcc supply node and the ground potential GND. Input IN is applied to the gates of transistors PT20 and NT20. The inverter circuit is configured of two transistors. Therefore, the numbers of components of the redundant binary adding circuits shown in FIGS. 20 and 21 are 48 and 50, respectively.

Embodiment 9

Figure 24:
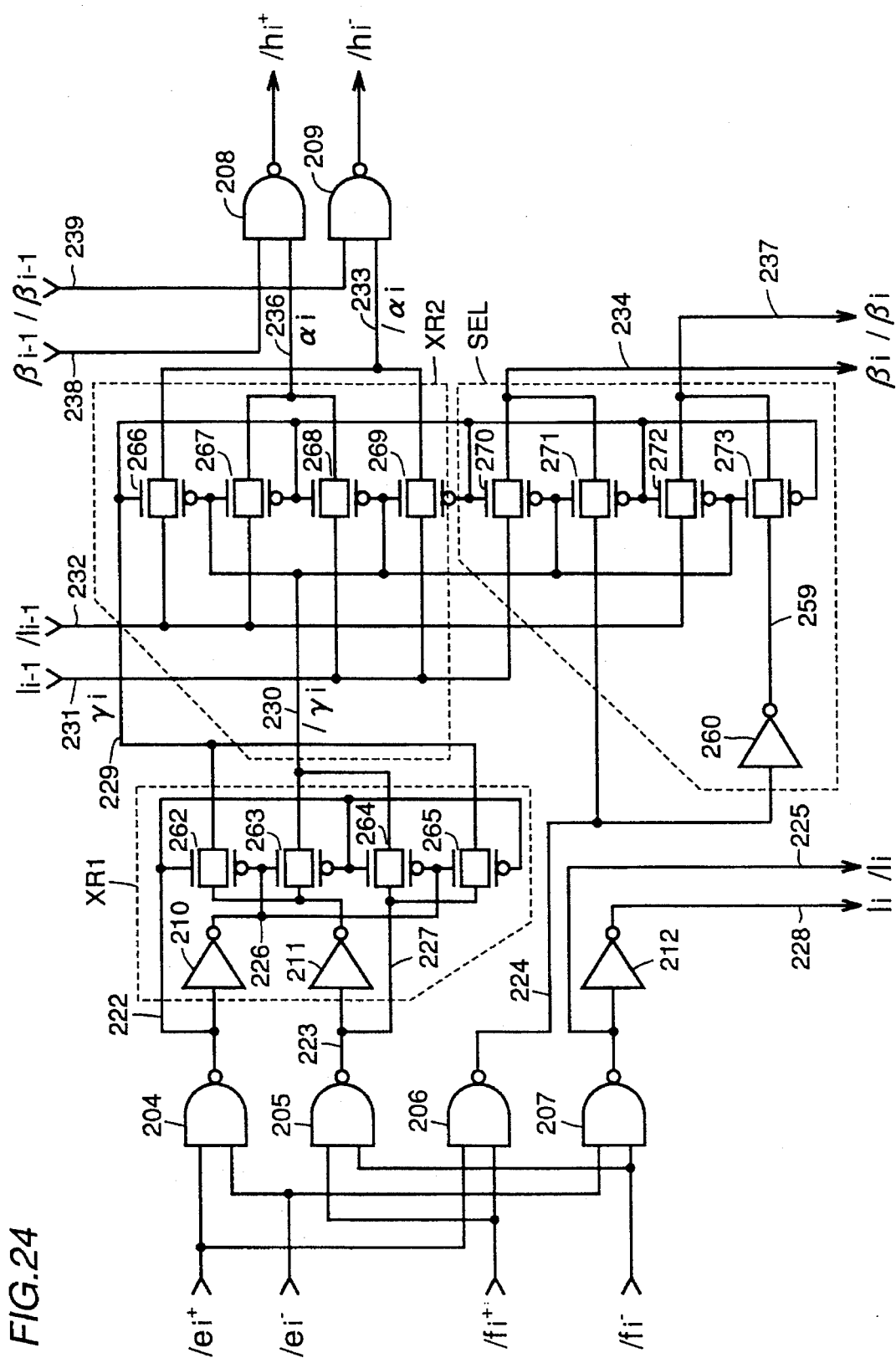
FIG. 24 is a diagram showing a third modification of the intermediate sum generating circuit used in the present invention.

FIG. 24 is a diagram showing the configuration of main portions of the multiplier according to the ninth embodiment of the present invention. FIG. 24 shows a further configuration of the redundant binary adding circuit. The redundant binary adding circuit is equivalent to a circuit in which the field effect transistors configuring the XOR circuit shown in FIG. 21 are replaced with CMOS transmission gates, respectively.

In FIG. 24, XOR circuit XR1 includes an inverter circuit 210 inverting the output of NAND circuit 204, an inverter circuit 211 inverting the output of NAND circuit 205, CMOS transmission gates 262 and 264 rendered conductive when the output of NAND circuit 204 is at an "H" level to transmit the output of inverter circuit 211 and the output of NAND circuit 205 onto signal lines 229 and 230, respectively, and CMOS transmission gates 265 and 263 rendered conductive when the output of NAND circuit 204 is at an "L" level to transmit the output of NAND circuit 205 and the output of inverter circuit 211 onto signal lines 229 and 230, respectively. A signal representing the XOR operation result is transmitted onto signal line 229, and a signal representing the XNOR operation result is transmitted onto signal line 230 using the outputs of NAND circuits 204 and 205 as an input and a control signal.

XOR circuit XR2 includes CMOS transmission gates 266 and 268 rendered conductive when the signal potential on signal line 229 is at an "H" level to transmit signal $/l_{i-1}$ on signal line 230 and signal $l_{i-1}$ on signal line 231 onto signal lines 233 and 236, respectively, and CMOS transmission gates 269 and 267 rendered conductive when the signal potential on signal line 229 is at an "L" level to transmit signal $l_{i-1}$ on signal line 231 and signal $/l_{i-1}$ on signal line 232 onto signal lines 233 and 236, respectively. A signal representing the XOR operation result is transmitted onto signal line 233, and a signal representing the XNOR operation result is transmitted onto signal line 236 using a signal on signal line 229 and signal $l_{i-1}$ on signal line 231 as an input and a control signal.

Selector SEL includes an inverter circuit 260 receiving the output of NAND circuit 206, CMOS transmission gates 270 and 272 rendered conductive when the signal potential on signal line 229 is at an "H" level to transmit signal $l_{i-1}$ on signal line 231 and signal $/l_{i-1}$ on signal line 231 onto signal lines 234 and 237, respectively, and CMOS transmission gates 271 and 273 rendered conductive when the signal potential on signal line 229 is at an "L" level to transmit the signal on signal line 224 and the signal on signal line 259 onto signal lines 234 and 237, respectively.

The operation of the redundant binary adding circuit shown in FIG. 24 is the same as that shown in FIG. 21. In comparison to the configuration shown in FIG. 21, since the transmission gate is configured of the CMOS transistor, the number of components (transistors) included therein is 56. Also in this case, the number of components is smaller than that of the conventional binary adding circuit. Since the CMOS transmission gate is used, the signal loss at the time of signal transmission does not occur. Therefore, it is not necessary to provide a positive fedback circuit (amplifying circuit) as shown in FIG. 21, and it is also unnecessary to consider the time required for signal stabilization by the amplifying circuit, resulting in a high speed operation.

Embodiment 10

Figure 25:
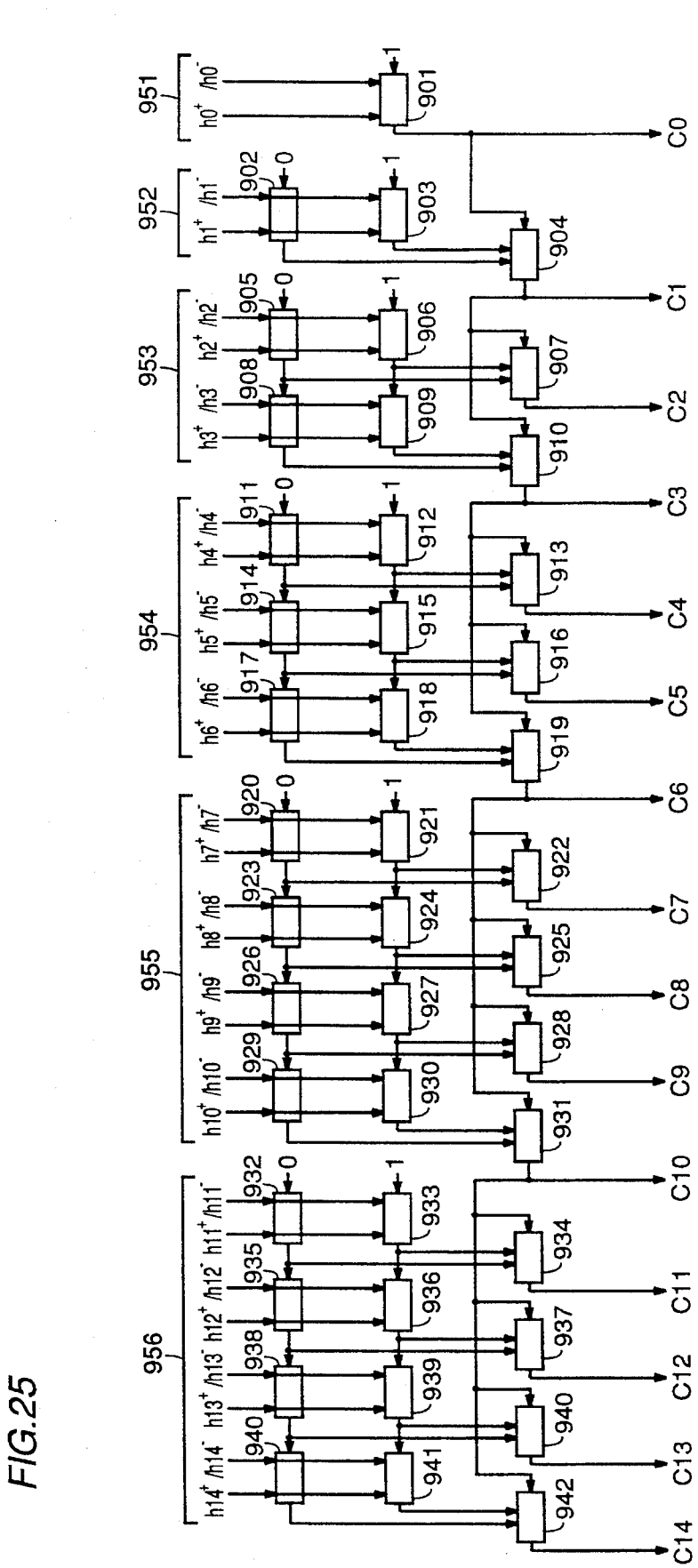
FIG. 25 is a diagram showing a first structure example of the carry generating portion of the final adding circuit used in the present invention.

FIG. 25 is a diagram showing the configuration of main portions of the multiplier according to the tenth embodiment of the present invention. FIG. 25 shows the configuration of the carry generating portion in the final adding circuit. In FIG. 25, the intermediate sum H=(h14$^+$ h14$^-$) ... (h0$^+$ h0$^-$) of redundant binary numbers provided from the intermediate sum generating circuit is divided into six groups 951 to 956. In groups 951 to 956, a more significant bit group includes bits more than that in a less significant bit group. In FIG. 25, groups 951 to 956 are shown, as an example, including one bit, one bit, two bits, three bits, four bits and four bits, respectively.

Group 951 includes a selector 901 selecting and passing one of redundant binary bits $h0^+$ and $/h0^-$ according to the fixed value "1". Selector 901 includes the configuration similar to that shown in FIG. 10. Selector 901 carries out the selecting operation according to the equation (28). Since the carry input is "1", selector 901 selects the inverted value $/h0^-$ to generate carry C0.

Group 952 includes a selector 902 passing one of bits $h1^+$ and $/h1^-$ according to the fixed value "0", a selector 903 passing one of bits $h1^+$ and $/h1^-$ according to the fixed value "1", and a selector 904 selectively passing one of the outputs of selectors 902 and 903 according to carry C0. Since selector 902 receives the fixed value "0" at the carry input, selector 902 passes the bit value $h1^+$. Selector 903 passes the inverted value $/h1^-$ according to the fixed value "1". Carry C1 is generated from selector 904.

Group 953 includes selectors 905 and 906 provided for bits $h2^+$ and $/h2^-$, and selectors 908 and 909 provided for bits $h3^+$ and $/h3^-$. The fixed values "0" and "1" are applied to selectors 905 and 906 as respective carry inputs. Selectors 908 and 909 selectively pass one of applied bits using signals provided from selectors 905 and 906 as select control signals, respectively. Group 953 further includes a selector 907 passing one of the outputs of selectors 905 and 906 to generate carry C2 using carry C1 provided from selector 904 as a select control signal, and a selector 910 passing one of the outputs of selectors 908 and 909 to generate carry C3.

Group 954 includes first selectors 911, 914 and 917, second selectors 912, 915 and 918, and third selectors 913, 916 and 919, provided for bits $h4^+$, $/h4^-\sim h6^+$, and $/h6^-$, respectively. The fixed value "0" is applied to selector 911 at the least significant bit of the first selectors as a select control signal. The fixed value "1" is applied as a select control signal to selector 912 at the least significant bit of the second selectors. According to carry C3 generated from selector 910, third selectors 913, 916 and 919 pass one of signals provided from the selector of a corresponding digit bit to generate carries C4, C5 and C6, respectively.

Group 955 includes first selectors 920, 923, 926 and 929, second selectors 921, 924, 927, 930, and third selectors 922, 925, 928 and 931, respectively provided for bits $h7^+$ and $/h7^-\sim h10^+$ and $/h10^-$. The fixed values "0" and "1" are applied to selector 920 at the least significant position of the first selectors and selector 921 at the least significant position of the second selectors as select control signals, respectively. Using carry C6 generated from selector 919 as a select control signal, third column selectors 922, 925, 928 and 931 selectively pass one of the outputs of first and second selectors of corresponding digit bits to generate carries C7, C8, C9 and C10.

Group 956 has the configuration similar to that of group 955. Group 956 includes selectors 932 to 942. Third selectors 934, 937, 940 and 942 pass one of the outputs of two Selectors of corresponding digit bits to generate carries C11, C12, C13 and C14, using carry C10 generated from selector 931 as a select control signal.

In the configuration of the carry generating portion shown in FIG. 25, the number of stages of selectors required for generation of carry C14 at the most significant position is six (selectors 901, 904, 910, 919, 931 and 942). As compared to seven stages (cf. FIGS. 8 and 9) in the case of Embodiment 1, it is possible to generate a carry at a higher speed.

A bit to be passed by the selector receiving the fixed value "0" or "1" is determined in the configuration shown in FIG. 25. Therefore, in this case, the configuration in which only signal interconnection is disposed without provision of the selector may be used. More specifically, when the fixed value "0" is applied, the selector passes upper bit $hj^+$, and when the fixed value "1" is applied, the selector passes the inverted value $/hj^-$. Therefore, the selector of the first stage in each group can be configured only by interconnection.

Embodiment 11

Figure 26:
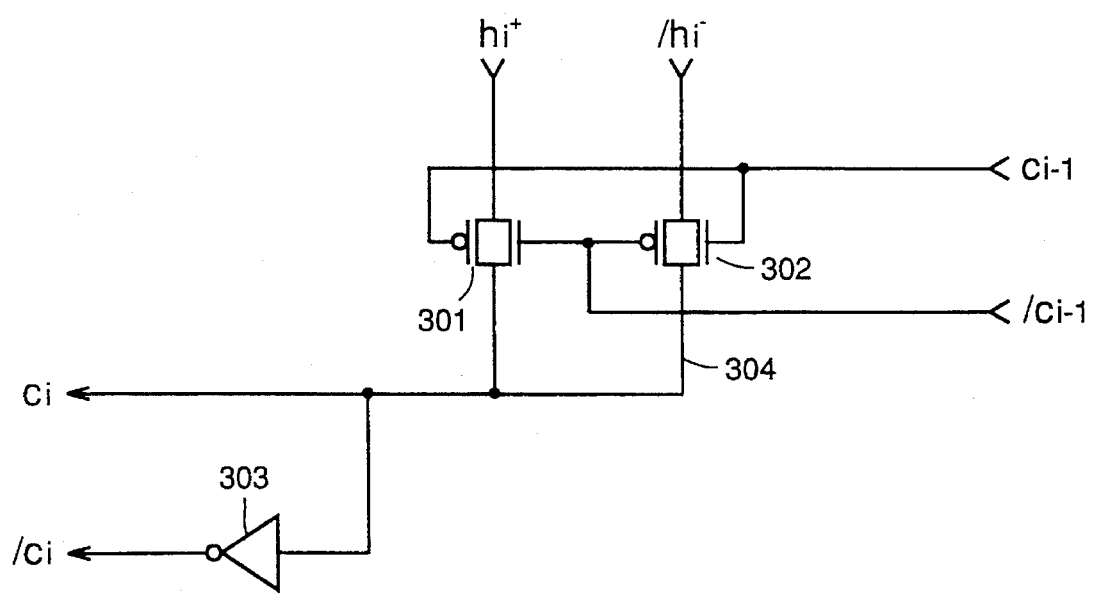
FIG. 26 is a diagram showing a first modification of the carry generating circuit of the carry generating portion used in the present invention.

FIG. 26 is a diagram showing one example of the configuration of the selector used in the carry generating portion included in the final adding circuit. In FIG. 26, the configuration of the selector for the i-th bit is shown. Referring to FIG. 26, the selector includes a CMOS transmission gate 301 transmitting upper bit $hi^+$ to a signal line 304 in response to carries $C_{i-1}$ and $/C_{i-1}$ generated by a selector at a less significant bit, a CMOS transmission gate 302 passing the inverted value $/hi^-$ of the lower bit, and an inverter circuit 303 inverting carry Ci on signal line 304. CMOS transmission gates 301 and 302 are rendered conductive and non-conductive in a manner complementary with each other. When carry $C_{i-1}$ is "1", CMOS transmission gate 302 is rendered conductive, and the inverted value $/hi^-$ is transmitted onto signal line 304 to be carry Ci. When carry $C_{i-1}$ is "0", CMOS transmission gate 301 is rendered conductive, and upper bit $hi^+$ is transmitted onto signal line 304 to be carry Ci. By forming such complementary carries $C_{i-1}$ and $/C_{i-1}$, it is possible to reliably generate a carry without the signal propagation loss.

Embodiment 12

Figure 27:
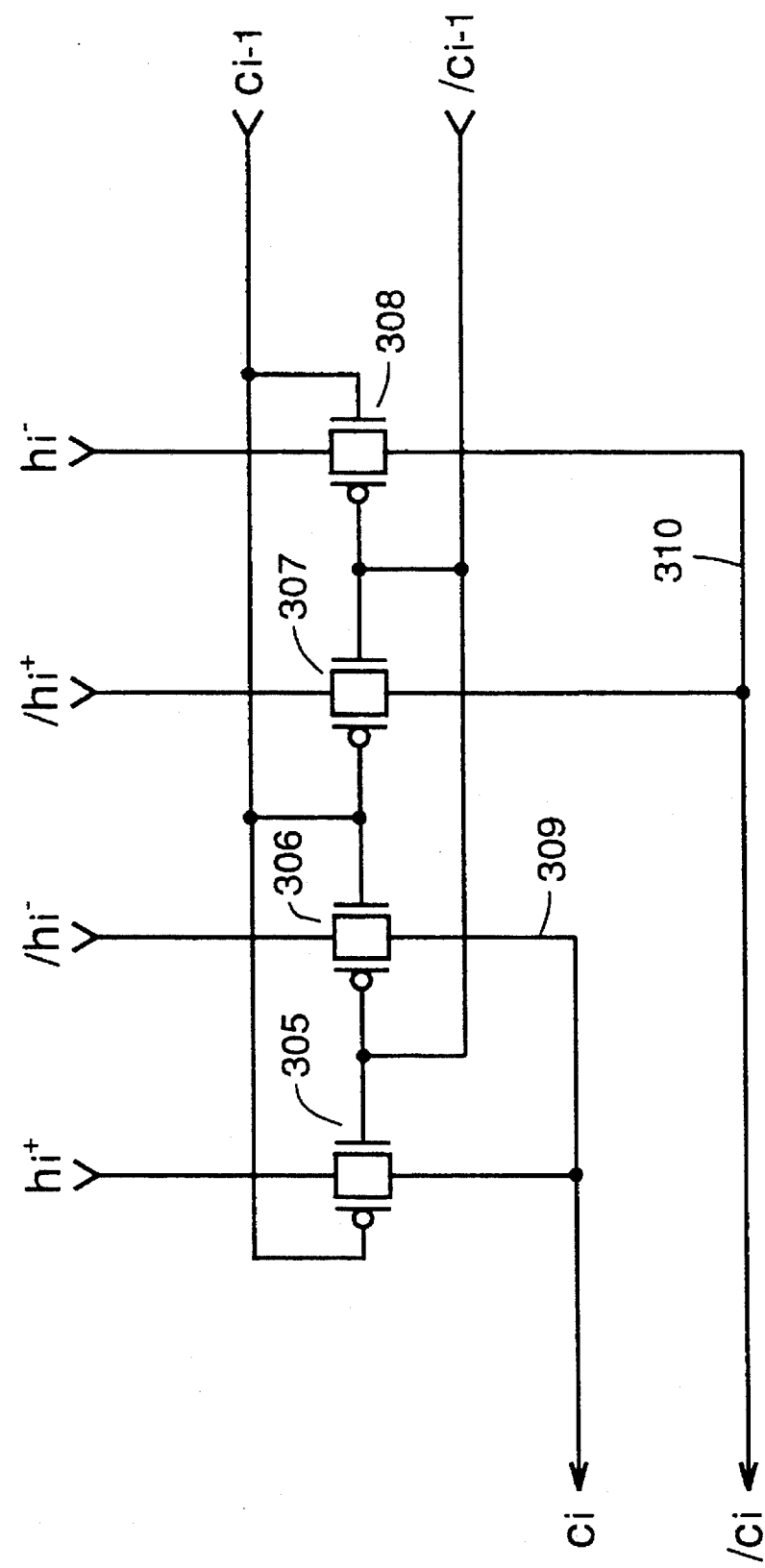
FIG. 27 is a diagram showing a second modification of the carry generating circuit used in the present invention.

FIG. 27 is a diagram showing another configuration of the selector included in the carry generating portion. The selector circuit shown in FIG. 27 includes CMOS transmission gates 306 and 308 rendered conductive when carry $C_{i-1}$ is "1" to transmit inverted value $/hi^-$ and lower bit $hi^-$ onto signal lines 309 and 310, respectively, and CMOS transmission gates 305 and 307 rendered conductive when carry $C_{i-1}$ is "0" to transmit upper bits $hi^+$ and $/hi^+$ onto signal lines 309 and 310, respectively. In the configuration of the selector shown in FIG. 27, the inverter circuit for generating complimentary carries Ci and /Ci is not required. Therefore, it is possible to eliminate the signal propagation delay in the inverter circuit, and it is possible to generate a carry at a high speed, resulting in high speed addition.

Embodiment 13

Figure 28:
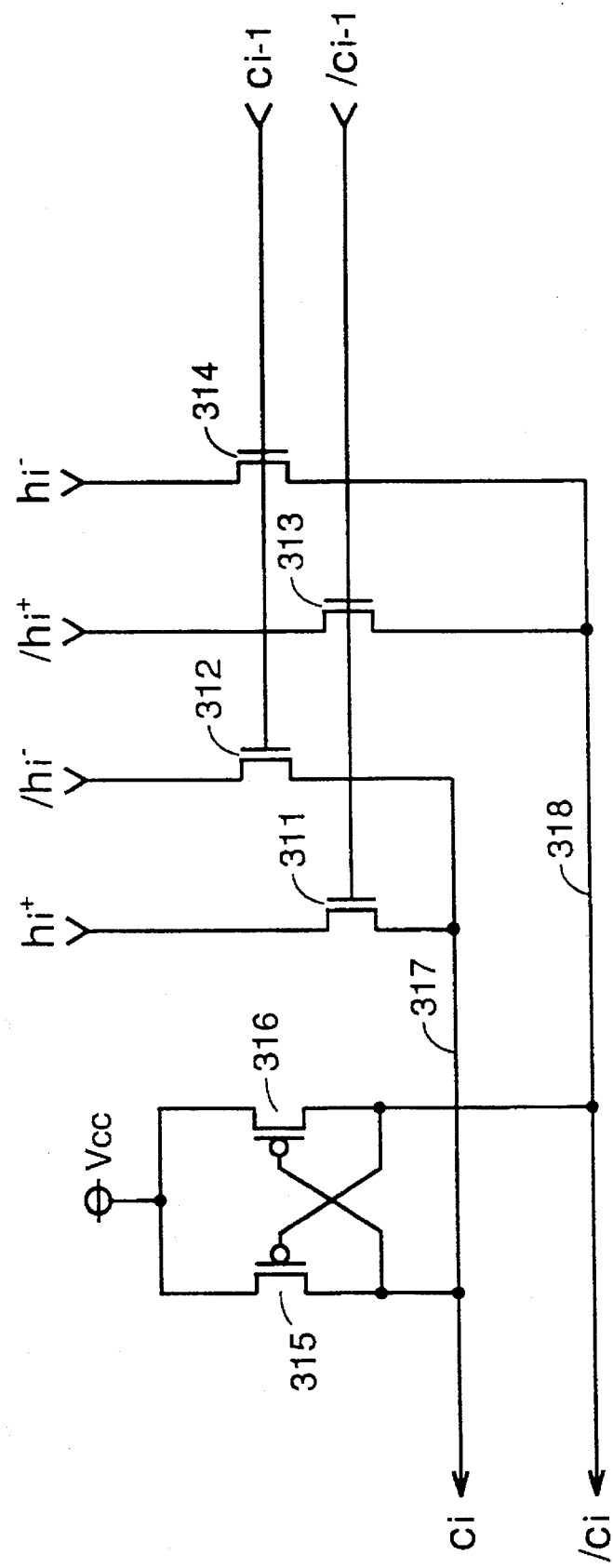
FIG. 28 is a diagram showing a third modification of the carry generating circuit used in the final adding circuit used in the present invention.

FIG. 28 is a diagram showing a still another configuration of the selector included in the carry generating portion. Also in FIG. 28, a configuration of the selector for the i-th digit bit is shown. Referring to FIG. 28, the selector includes n channel MOS transistors 312 and 314 rendered conductive when carry $C_{i-1}$ is "1" to transmit inverted value $/hi^-$ and lower bit $hi^-$ onto signal lines 317 and 318, respectively, n channel MOS transistors 311 and 313 rendered conductive when inverted carry $/C_{i-1}$ is "1" to transmit upper bit $hi^+$ and inverted value $/hi^+$ onto signal lines 317 and 318, respectively, and p channel MOS transistors 315 and 316 having their gates and drains cross-coupled and their sources connected to the power supply potential Vcc supply node, for differentially amplifying signal potential on signal lines 317 and 318. Carry Ci is generated from signal line 317, and inverted carry /Ci is generated from signal line 318. P channel MOS transistor 315 is rendered conductive when the potential on signal line 318 is at an "L" level, and charges the signal line 318 up to the power supply potential Vcc level. When the signal potential on signal line 317 is at an "L" level, transistor 316 charges the signal line 318 up to the power supply potential Vcc level.

In the configuration of the selector shown in FIG. 28, the transfer gate is implemented by one field effect transistor, unlike the configuration shown in FIG. 27. Therefore, the number of transistors included therein is six. It is possible to reduce the number of elements than the configuration in which the CMOS transmission gate is used, the occupied area of the circuit, that is, the occupied area of the carry generation portion in the final adding circuit, can be reduced, and the final adding circuit suitable for high integration can be implemented.

Complementary carries Ci and /Ci are generated in parallel using complementary carries $C_{i-1}$ and $/C_{i-1}$. Therefore, the inverter circuit for generating the complementary carries is not required, and the signal propagation delay in the inverter circuit is not caused. As a result, it is possible to generate a carry at a high speed.

Embodiment 14

Figure 29:
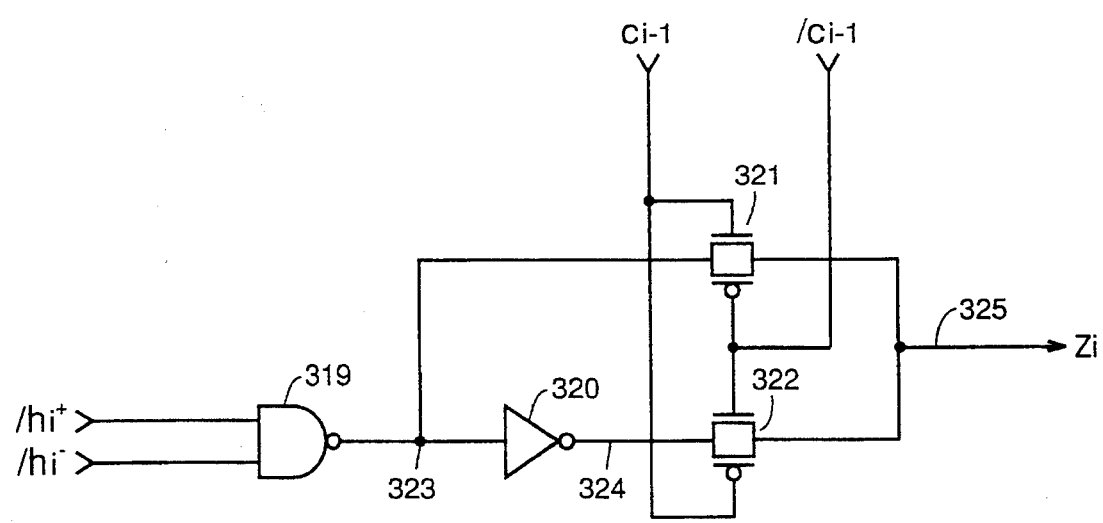
FIG. 29 is a diagram showing a first modification of the sum generating circuit used in the final adding circuit of the multiplier in the present invention.

FIG. 29 is a diagram showing another further configuration of the sum generating circuit shown in FIG. 11. In FIG. 29, the sum generating circuit for the i-th digit bit is shown. Referring to FIG. 29, the sum generating circuit includes a 2-input NAND circuit 319 receiving inverted bits $/hi^+$ and $/hi^-$, an inverter circuit 320 inverting the output of NAND circuit 319, a CMOS transmission gate 321 transmitting the output of NAND circuit 319 onto signal line 325 when carry $C_{i-1}$ is "1", and a CMOS transmission gate 322 rendered conductive when complementary carry $/C_{i-1}$ is "1" to transmit the output of inverter circuit 320 onto signal line 325. Sum zi is provided from signal line 325. The following is a description of the operation.

NAND circuit 319 carries out NAND operation of inverted bits $/hi^+$ and $/hi^-$. Therefore, a signal transmitted onto signal line 323 from NAND circuit 319 is $(hi^+ \cdot /hi^-) = hi^+ + hi^-$. A signal transmitted onto signal line 324 from inverter circuit 320 is $/hi^+ + /hi^-$. When carry $C_{i-1}$ is "1", the output of NAND circuit 319, that is, $hi^+ + hi^-$, is transmitted onto signal line 325. When complementary carry $/C_{i-1}$ is "1", the output of inverter circuit 320, that is, $/hi^+ + /hi^-$, is transmitted. More specifically, $$zi = (hi^+ + hi^-) \cdot C_{i-1} + /(hi^+ + hi^-) \cdot /C_{i-1}$$
$$= /(/(hi^+ + hi^-)) \cdot C_{i-1}$$
$$+ /(hi^+ + hi^-) \cdot /C_{i-1}$$

This is the same as the equation (29), indicating exclusive OR (addition of module 2) of/$(hi^+ + hi^-)$ and carry $C_{i-1}$. More specifically, the sum generating circuit shown in FIG. 29 carries out the operation similar to that of the sum generating circuit shown in FIG. 11. The sum generating circuit shown in FIG. 29 generates sum zi from inverted bits $/hi^+$ and $/hi^-$. In the configuration shown in FIG. 29, inverter circuit 320 and CMOS transmission gates 321 and 322 serve as an XOR circuit. Therefore, it is possible to substantially reduce the signal propagation delay in the XOR circuit, resulting in generation of the sum at a high speed.

In the configuration shown in FIG. 29, the number of transistors required is ten. The sum generating circuit can be implemented with transistors of the number substantially smaller than that of transistors required by the conventional sum generating circuit. As a result, the sum generating circuit suitable for high integration can be obtained.

In the above-described embodiments, a CMOS transmission gate and an MOS transistor are used. In this case, other insulating gate type field effect transistors such as MESFET (Metal-Semiconductor Field Effect Transistor), or a junction type field effect transistor may be used.

In the multiplier according to the present invention, a redundant binary number is formed of a sign inverted (positive/negative inverted) partial product and a sign non-inverted partial product without requiring a special processing, and a product can be obtained by addition and conversion of the redundant binary number. Therefore, a multiplier performing multiplication with ease and at a high speed can be obtained without complicating the circuit configuration.

Because of the property of the redundant binary number, when the same bit value repeats from the most significant bit toward lower bits, it is possible to convert almost all the bit values into 0. Since most significant bits converted into 0 can be ignored, the circuit configuration is simplified, resulting in reduction of the number of elements.

The intermediate sum generating circuit for generating an intermediate sum from partial products can be configured using a 4-input and 2-output redundant binary adder which performs addition with a smaller number of elements and at a high speed. Because of regularity in the interconnection, layout of the interconnection is easy, and a multiplier suitable for a high speed operation and high integration can be obtained.

The carry generating circuit in the final adding portion can be configured using the selector circuit selecting one of inputs, using a carry as a select control signal. The logic gate for carrying out the operational processing is not required, the carry can be propagated at a high speed, the high speed addition can be implemented, and the circuit configuration can be simplified.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multiplier performing multiplication of a first multi-bit binary number and a second multi-bit binary number, comprising:

partial product generating means for generating a plurality of partial products from said first multi-bit binary number and said second multi-bit binary number and inverting a sign indicating positive and negative of a part of the partial products generated and non- inverting a sign of a remaining partial product, to generate final partial products, each said partial product being a non-redundant binary number produced from a signal generated according to a value of at least one digit of said first multi-bit binary number and said second multi-bit binary number;

redundant binary number generating means for generating a plurality of multi-bit redundant binary numbers from said final partial products in such a manner that one multi-bit redundant binary number consists of one sign inverted partial product and one sign non-inverted partial product, in which a digit of said one multi-bit redundant binary number consists of a number at a corresponding digit of said one sign inverted partial product and a number at the corresponding digit of said one sign non-inverted partial product;

redundant binary adding means for redundant binary adding said plurality of multi-bit redundant binary numbers to generate a final redundant binary number; and final product generation means for converting said finally generated multi-bit redundant binary number into an ordinary binary number code in which said first and second multi-bit binary numbers are represented to form a multi-bit binary number representing a product of said first multi-bit binary number and said second multi-bit binary number.

2. The multiplier as recited in claim 1, wherein said partial product generating means includes encoding means for encoding said first multi-bit binary number, using a predetermined number of bits thereof as a unit, to generate a plurality of control signals indicating said plurality of partial products, and means for generating said plurality of partial products from the control signals from said encoding means and said second multi-bit binary number, said encoding means including means for generating the control signals in such a manner that a sign of a part of said partial products is inverted.

3. The multiplier as recited in claim 1, wherein said partial product generating means includes encoding means for encoding said first multi-bit binary number, using a predetermined number bits as a unit, to provide a plurality of control signals representing said plurality of partial products, and shift/inverter means responsive to said plurality of control signals and said second multi-bit binary number for generating said plurality of partial products, said shift/inverter means including means for inverting a sign of a partial product of a part of said control signals to generate a corresponding final partial product.

4. The multiplier as recited in claim 1, wherein said partial product generating means includes means for carrying out a logical product operation of each bit of said first multi-bit binary number and said second multi-bit binary number to generate a partial product, and means for inverting a sign of a partial product for a part of bits excluding the most significant bit in said first multi-bit binary number.

5. The multiplier as recited in claim 1, wherein said partial product generating means includes means for carrying out a logical product operation of each bit of said first multi-bit binary number and a corresponding bit of said second multi-bit binary number, and means for inverting a sign of a partial product for a part of bits including the most significant bit of said first multi-bit binary number.

6. The multiplier as recited in claim 1, wherein said partial product generating means includes means for using as a pair two partial products adjacent with respect to a bit position of said first multi-bit binary number, and inverting a sign of one partial product in each pair.

7. The multiplier as recited in claim 1, wherein said multi-bit redundant binary number includes bits each taking three values of −1, 0 and 1 when a bit pair of the same digit in a pair of partial products is (0, 1), (0, 0) and (1, 1), and (1, 0).

8. The multiplier as recited in claim 7, wherein said redundant binary number generating means includes means for converting a bit of said multi-bit redundant binary number into (0, 0) for a bit pair of combination of bit values (1, 1) and non-converting a bit of said multi-bit redundant binary number for a bit pair of a combination of other bit values for output.

9. The multiplier as recited in claim 1, wherein said redundant binary number generating means includes first logical product means corresponding to each digit of a pair of partial products for carrying out a logical product operation of a corresponding bit of a sign non-inverted partial product and a sign inverted of a corresponding bit of an inverted partial product, and second logical product means for carrying out a logical product operation of an inverted value of a corresponding bit value of the non-inverted partial product and a corresponding bit value of the inverted partial product, outputs of said first logical product means and said second logical product means being paired to correspond to a redundant binary bit representing a bit of a multi-bit redundant binary number.

10. The multiplier as recited in claim 1, wherein each digit of said multi-bit redundant binary number takes one of at least three values of 1, 0, and −1, and said partial product generating means includes means for inverting for at least a part of said plurality of multi-bit redundant binary numbers, a sign of an arbitrary bit excluding the most significant bit out of a plurality of successive redundant binary bits of a same value from the most significant bit toward less significant bits, and converting all redundant binary bit values more significant than the sign inverted arbitrary bit into 0.

11. The multiplier as recited in claim 1, wherein said redundant binary number generating means includes means, when bit values of corresponding digits in successive pairs of bits are the same from the most significant bit pair toward less significant bit pairs in a pair of partial products, for inverting both bit values of any bit pair excluding the most significant bit pair among the successive pairs of bits, and converting all values of bits more significant than the bit having the inverted bit value into a same value.

12. The multiplier as recited in claim 1, wherein said partial product generating means includes means for generating an indication bit indicating for each partial product whether an associated partial product has the same sign as said second multi-bit binary number, and said redundant binary number generating means includes means (FIG. 12) for generating a multi-bit redundant binary number from all or a part of said indication bit.

13. The multiplier as recited in claim 1, wherein each of said plurality of partial products includes an indication bit indicating whether an associated partial product has the same sign as said second multi-bit binary number, and said partial product generating means includes means (FIG. 12A) for adding each indication bit to a corresponding bit position of a partial product generated from a more significant bit of said first multi-bit binary number.

14. The multiplier as recited in claim 1, wherein each bit of said multi-bit redundant binary number is represented by a pair (a, b) of an upper bit a and a lower bit b, said redundant binary number adding means includes a plurality of redundant binary adders provided corresponding to necessary digits of a multi-bit redundant binary number, and a redundant binary adder carrying out redundant binary addition from an i-th bit (ai, qi) of a first multi-bit redundant binary number and an i-th bit (ci, ri) of a second multi-bit redundant binary number to generate an i-th bit ($hi^+$, $hi^-$) of a third redundant binary number includes first logic means for carrying out operation of (ai⊕qi)⊕(ci⊕ri), second logic means for carrying out operation of /{(/ai·qi)+(/ci·ri)}, third logic means for carrying out operation of (ai·/qi+ci·/ri), a logic gate, for carrying out module 2 addition of an output of said second logic means of a redundant binary adder at one bit less significant bit position and an output of said first logic means, selector means responsive to an output of said first logic means for passing one of the output of the second logic means of the redundant binary adder at one bit less significant bit position and an output of said third logic means, logical product gate for carrying out a negative logical product operation of an output of said selector of the redundant binary adder one bit less significant bit position and an output of said logic gate to generate an upper bit $hi^+$ of said third redundant binary bit, and logical sum means for carrying out a logical sum operation of an output of the selector of said redundant binary adder at one bit less significant bit position and the output of said logic gate to generate a lower bit $hi^-$ of said third redundant binary bit.

15. The multiplier as recited in claim 14, wherein at least one of said logic gate and said first logic means includes a transmission gate using one input as a control signal to selectively pass another input to carry said module 2 addition.

16. The multiplier as recited in claim 14, wherein at least one of said logic gate and said first logic means includes a field effect transistor using one input as a control signal to selectively pass another input, and means for compensating for a potential loss of an output of said field effect transistor.

17. The multiplier as recited in claim 14, wherein at least one of said first to third logic means said selector means and said logic gate includes means for generating a pair of signals complementary to each other.

18. The multiplier as recited in claim 1, wherein said redundant binary number generating means includes generating means for generating a multi-bit redundant binary number from each final partial product pair in such a manner that a corresponding bit pair of a final partial product pair represents a corresponding bit of the multi-bit redundant binary number, and converting means for generating a three-value redundant binary bit for each bit of the multi-bit redundant binary number generated by said generating means, in such a manner that a pair ($a^+$, $a^-$) of an upper bit a and a lower bit a is converted in (0, 0) when the pair is (1, 1) and that the pair is non-converted for a remaining bit value combination, said redundant binary adding means includes a plurality of redundant binary adders provided for necessary bits of first and second multi-bit redundant binary numbers generated from said converting means, and a redundant binary adder generating a third redundant binary bit ($h^+$, $h^-$) from a first redundant binary bit ($e^+$, $e^-$) of said first redundant number and a second redundant binary bit ($f^+$, $f^-$) of an i-th digit of said second redundant number includes first logic means for carrying out operation of /(/$e^+$·/$e^-$)⊕/(/$f^+$·/$f^-$)

second logic means for carrying out operation of (/$e^-$·/$f^-$), third logic means for carrying out operation of (/$e^+$·/$f^+$), fourth logic means for carrying out module 2 addition of an output of the second logic means of a redundant binary adder at one bit less significant bit position and an output of said first logic means, a selector responsive to the output of said first logic means for passing one of an output of said third logic means and the output of said second logic means of said bit position redundant binary adder one bit less significant, means for carrying out a negative logical product operation of an output of the selector of said at one bit less significant bit position redundant binary adder and the output of said first logic means to generate an inverted value /$h^+$ of an upper bit $h^+$ of said third redundant binary bit, and means for carrying out a logical product operation of an output of said fourth logic means and the output of said selector of said redundant binary adder at one bit less significant bit position to generate an inverted value /$h^-$ of a lower bit $h^-$ of said third redundant binary bit.

19. The multiplier as recited in claim 18, wherein said second logic means and said selector include means for generating a pair of output signals complementary to each other.

20. The multiplier as recited in claim 19, wherein at least one of said first and fourth logic means includes a transmission gate using one input as a control signal to pass one of the inputs of another complementary input pair to carry out module 2 addition.

21. The multiplier as recited in claim 18, wherein said first to fourth logic means include means for generating a pair of output signals complementary to each other.

22. The multiplier as recited in claim 18, wherein the means for carrying out addition of module 2 included in said first logic means and said fourth logic means includes path gate means using one input as a control signal, for selectively passing another input.

23. The multiplier as recited in claim 1, wherein said redundant binary number generating means includes generating means for generating a multi-bit redundant binary number from each partial product pair such that a corresponding bit pair of a partial product pair represents a corresponding bit of the multi-bit redundant binary number, and converting means for generating a three-value redundant binary bit for each bit of the multi-bit redundant binary bit for each bit of the multi-bit redundant binary number generated by said generating means, in such a manner that a pair ($a^+$, $a^-$) of an upper bit $a^+$ and a lower bit $a^-$ is converted into (0, 0) when pair is (1, 1) and that the pair is non-converted for a remaining bit value combination, said redundant binary adding means includes a plurality of redundant binary adders provided for necessary bits of a pair of first and second multi-bit redundant binary numbers from said converting means, a redundant binary adder generating a third redundant binary bit ($h^+$, $h^-$) from a first redundant binary bit ($e^+$, $e^-$) of an i-th digit of the first redundant number and a second redundant binary bit ($f^+$, $f^-$) of an i-th digit of the second redundant number to generate a third redundant binary bit ($h^+$, $h^-$) includes first logic gate means for carrying out an operation of (/$e^+$·/$e^-$) to generate a pair of signals respectively representing the operation result and an inverted value thereof, second logic gate means for carrying out an operation of (/$f^+$·/$f^-$) to generate a complementary signal pair representing the operation result and an inverted value thereof, third logic gate means for carrying out an operation of/(/$e^+$·/$f^+$) to generate a signal representing the operation result, fourth logic gate means for carrying out an operation of (/$e^-$·/$f^-$) to generate true and complementary signals representing the operation result and an inverted value thereof, first transmission gate means responsive to an output of said first logic gate means for passing one of a pair of true and complementary output signals of said second logic means, said first transmission gate means including means for generating a pair of true and complementary output signals, second transmission gate means responsive to an output of said first transmission gate means for passing one of a complementary pair of output signals of the fourth logic gate means of redundant binary adder a bit less significant at bit position, said second transmission gate means including means for generating true and complementary output signals complementary to each other, third transmission gate means responsive to the output of said first transmission gate means for passing a signal representing a negative logical product operation result from the fourth logic gate means of said redundant binary adder at one bit less significant bit position and the output signal of said third logic gate means, said third transmission gate means including means for generating a pair of true and complementary output signals, a logic gate for carrying out a negative logical product operation of the complementary output signal of said second transmission gate means and the true output signal of the third transmission gate means of said redundant binary adder at one bit less significant bit position to generate an inverted value /$h^+$ of an upper bit $h^+$ of said third redundant binary bit, and a logic gate for carrying out the negative logical product operation of the true output signal of said second transmission gate means and the complementary output signal of said third transmission gate means of said redundant binary adder at one bit less significant bit position to generate an inverted value /$h^-$ of a lower significant bit $h^-$ of said third redundant binary bit.

24. The multiplier as recited in claim 1, wherein said redundant binary number generating means includes generating means for generating a multi-bit redundant binary number formed of each partial product pair such that a corresponding bit pair of a partial product pair represents a corresponding bit of the multi-bit redundant binary number, and converting means for generating a three-value redundant binary bit for each bit of the multi-bit redundant binary number generated by said generating means, in such a manner that a pair ($a^+$, $a^-$) of an upper bit $a^+$ and a lower bit $a^-$ is converted into (0, 0) when the pair is (1, 1) and that the pair is non-converted for a remaining bit value combination, said redundant binary adding means includes a plurality of redundant binary adders provided for necessary bits of a pair of first and second multi-bit redundant binary numbers provided from said converting means, a redundant binary adder generating a third redundant binary bit ($h^+$, $h^-$) from a first redundant binary bit ($e^+$, $e^-$) of an i-th digit of said first redundant number and a second redundant binary bit ($f^+$, $f^-$) of an i-th digit includes a first product gate for carrying out a negative logical product operation of an inverted value /$e^+$ of an upper bit of said first redundant binary bit and an inverted value /$e^-$ of a lower bit of said first redundant binary bit, a second product gate for carrying out the negative logical product operation of an inverted value /$f^+$ of an upper bit of said second redundant binary bit and less significant bit/$f^-$ of said second redundant binary bit, a third product gate for carrying out the negative logical product operation of an inverted value the upper bit of said first redundant binary bit and an inverted value of the upper bit of said second redundant binary bit, a fourth product gate for carrying out the negative logical product operation of the inverted value /$e^-$ of the lower bit of said first redundant binary bit and the inverted value /$f^-$ of the lower bit of said second redundant binary bit, a first inverting gate for inverting an output of said first product gate, a second inverting gate for inverting an output of said second product gate, a third inverting gate for inverting an output of said third product gate, a fourth inverting gate for inverting an output of said fourth product gate, a pair of first field effect transistors responsive to the output of said first product gate for transmitting the output of said second product gate and an output of said second inverting gate onto first and second signal lines respectively, a pair of second field effect transistors responsive to the output of said first inverting gate for transmitting an output of said second inverting gate and the output of said second product gate onto the first and second signal lines, respectively, first amplifying means responsive to potentials on said first and second signal lines for differentially amplifying and latching the potentials on said first and second signal lines, a pair of third field effect transistors responsive to the potential on said first signal line for transmitting the outputs of the fourth product gate bit position redundant binary adder and the fourth inverting gate of a at one bit less significant onto third and fourth signal lines, respectively, a pair of fourth field effect transistors responsive to the potential on said second signal line for transmitting an output of said fourth inverting gate redundant binary adder at of said one bit less significant bit position and the output of said fourth product gate onto said third and fourth signal lines, respectively, second amplifying means for differentially amplifying potentials on said third and fourth signal lines, a pair of fifth field effect transistors responsive to the potential on said first signal line for transmitting the output of said third inverting gate and the output of said third product gate onto fifth and sixth signal lines, respectively, a pair of sixth field effect transistors responsive to the potential on said second signal line for transmitting the output of the fourth product gate and the output of said fourth inverting gate of said one bit less significant redundant binary adder onto said fifth and sixth signal lines, respectively, third amplifying means for differentially amplifying potentials on said fifth and sixth signal lines, a fifth product gate for carrying out the negative logical product operation of a signal on said third signal line and a signal on said sixth signal line of said one bit less significant redundant binary adder to generate an inverted value $/h^+$ of said upper bit of said third redundant binary bit, and a sixth product gate for carrying out the negative logical product operation of a signal on said fourth signal line and a signal on the fifth signal line of said redundant binary adder at one bit less significant bit position to generate the inverted value $/h^-$ said lower bit of said third redundant binary bit.

25. The multiplier as recited in claim 1, wherein said redundant binary number generating means includes generating means for generating a multi-bit redundant binary number from each partial product pair such that a corresponding bit pair of a partial product pair represents a corresponding bit of the multi-bit redundant binary number, and converting means for generating a three-value redundant binary bit for each bit of the multi-bit redundant binary number generated by said generating means, in such a manner that a pair $(a^+, a^-)$ of an upper bit $a^+$ and a lower bit $a^-$ is converted into $(0, 0)$ when the pair is $(1, 1)$ and that the pair is non-converted for a remaining bit value combination, said redundant binary adding means includes a plurality of redundant binary adders provided for necessary bits of a pair of first and second multi-bit redundant binary numbers generated from said converting means, a redundant binary adder generating a third redundant binary bit $(h^+, h^-)$ from a first redundant binary bit $(e^+, e^-)$ of an i-th digit of said first redundant number and a second redundant binary bit $(f^+, f^-)$ of an i-th digit of said second redundant number includes first logic gate means including means for providing a pair of signals complementary to each other, for carrying out a negative logical product operation of the inverted value $/e^+$ of an upper bit of said first redundant binary bit and a lower bit/$e^-$ of said first redundant binary bit, second logic gate means for carrying out a logical product and the negative logical product operations of inverted values $/f^+$ and $/f^-$ of upper and lower bits of said second redundant binary bit to provide the operation results, third logic gate means for carrying out negative logical product and logical product operations of the inverted value $/e^+$ of the upper bit of said first redundant binary bit and the inverted upper bit/$f^+$ of said second redundant binary bit, fourth logic gate means for carrying out the logical product and negative logical product operations of the inverted value of the lower bit of said first redundant binary bit and the inverted value of the lower bit of said second redundant binary bit for output, a first transmission gate responsive to an output of said first logic gate means for transmitting logical product operation result and operation result of said second logic gate means onto first and second signal lines, respectively, a second transmission gate means responsive to the output of said first logic gate means and rendered conductive in a complementary manner to said first transmission gate means for transmitting the negative logical product operation result and an operation result of said second logic gate means onto the first and second signal lines, respectively, a third transmission gate means responsive to signals on said first and second signal lines for transmitting a negative logical product operation result and a logical product operation result of the fourth logic gate means of a one bit less significant redundant binary adder onto third and fourth signal lines, respectively, a fourth transmission gate means responsive to the signals on said first and second signal lines and rendered conductive in a complementary manner to said third transmission gate means for transmitting the logical product operation result and the negative logical product operation result of the fourth logic gate means of said redundant binary adder at one bit less significant bit position onto said third and fourth signal lines, respectively, a fifth transmission gate means responsive to potentials on said first and second signal lines for transmitting the logical product operation result and the negative logical product operation result of the fourth logic gate means of said redundant binary adder at one bit less significant bit position onto fifth and sixth signal lines, respectively, a sixth transmission gate means responsive to the potentials on said first and second signal lines and rendered conductive in a complementary manner to said fifth transmission gate means for transmitting the negative logical product operation result and a logical product operation result of said third logic gate means onto fifth and sixth signal lines, respectively, fifth logic gate means for carrying out a negative logical product operation of a signal on the fifth signal line of said redundant binary adder at one bit less significant bit position and a signal on said third signal line to generate the inverted value $/h^+$ of an upper bit of said third redundant binary bit, and sixth logic gate means for carrying out a negative logical product operation of a signal on the sixth signal line of said redundant binary adder at one bit less significant bit position and a signal on said fourth signal line to generate the inverted value $/h^-$ of a lower bit of said third redundant binary bit.

26. The multiplier as recited in claim 1, wherein said redundant binary number generating means includes means each in a bit pair partial product pair, for converting a bit value pair of (1, 1) into (0, 0) to generate a redundant binary bit of three values of (0, 0), (1, 0), and (0, 1) to generate a redundant binary number, said final product generating means includes carry generating means for generating a carry for each digit of said finally generated redundant binary number, and product calculating means for calculating a product of said first multi-bit binary number and said second multi-bit binary number from the carry generated from said carry generating means and said finally generated redundant binary number, said carry generating means including a selector selecting one of inverted values of upper and lower bits of each bit of said finally generated redundant binary number according to a carry signal provided from a less significant bit to generate a carry for said each bit.

27. The multiplier as recited in claim 26, wherein said carry generating means includes a first carry generator provided for a predetermined number of less significant bits of said finally generated redundant binary number, and a plurality of second carry generators provided corresponding to each group formed by division of the remaining more significant bits, said first carry generator includes a predetermined number of first selectors provided corresponding to each bit of said predetermined number of less significant bits and responsive to a carry provided from an adjacent less significant bit for selecting one of inverted values of the upper and lower bits of a corresponding redundant binary bit to generate a carry output, a first selector provided at the least significant bit of said plurality of first selectors receiving a signal of a first fixed value as a carry input, each of said second carry generators includes a plurality of second selectors for each redundant binary bit of a corresponding group and each responsive to a carry output provided from an adjacent less significant bit for selecting one of inverted values of upper and lower bits of the corresponding redundant binary bit to generate a carry output, a second selector provided at the least significant bit of said plurality of second selectors receiving a signal of a second fixed value as a carry input, a plurality of third selectors provided corresponding to each redundant binary bit of a corresponding group and each responsive to a carry provided from an adjacent less significant bit for selecting one of inverted values of upper and lower bits of the corresponding redundant binary bit to generate a carry output, a third selector provided corresponding to the least significant bit in the corresponding group receiving a signal of the first fixed value as a carry input, and a plurality of fourth selectors provided for respective bits of a corresponding group and each responsive to a carry output of the most significant bit of an adjacent less significant carry generator for selecting one of the carry output of said second selector and the carry output of said third selector to generate a carry output for a corresponding redundant binary bit.

28. The multiplier as recited in claim 27, wherein said remaining significant bits are divided into groups so that, the number of bits in a group at a more significant bit side is no less than the number of bits in a group at a less significant bit side.

29. The multiplier as recited in claim 27, wherein each of said first to fourth selectors includes means for inverting an associated carry output to generate an inverted carry.

30. The multiplier as recited in claim 26, wherein said selector includes a first transmission gate responsive to a carry output from an adjacent less significant bit to transmit an inverted value of a lower bit of a corresponding redundant binary bit as a carry output, a second transmission gate responsive to an inverted value of the carry output from said adjacent less significant bit to transmit an upper bit of the corresponding redundant binary bit as the carry output, and an inverter for inverting said carry output.

31. The multiplier as recited in claim 26, wherein said selector includes a first transmission gate means responsive to a carry output from an adjacent less significant bit to transmit an inverted value of a lower bit and the lower bit of a corresponding redundant binary bit to an associated carry output and an associated inverted carry output, respectively, and a second transmission gate means responsive to the inverted value of the carry output from the adjacent less significant bit and rendered conductive in a complementary manner to said first transmission gate means for transmitting the upper bit and the inverted value thereof of the corresponding redundant binary bit to said associated carry output and said associated inverted carry output, respectively.

32. The multiplier as recited in claim 26, wherein said selector includes a pair of first field effect transistors responsive to a carry output from an adjacent less significant bit for transmitting an inverted value of a lower bit and a value of the lower bit of a corresponding redundant binary bit to a carry output and an inverted carry output, respectively, a pair of second field effect transistors responsive to the inverted carry output from the adjacent less significant bit for transmitting an upper bit and an inverted value thereof of said corresponding redundant binary bit to the carry output and the inverted carry output, respectively, and amplifying means for differentially amplifying signals at said carry output and said inverted carry output.

33. The multiplier as recited in claim 26, wherein said product calculating means includes a sum circuit provided corresponding to each bit of said finally generated redundant binary number, said sum circuit includes first logic means for carrying out a negative logical sum operation of an upper bit and a lower bit of a corresponding redundant binary bit, and second logic means for carrying out the exclusive logical sum operation of an output of said first logic means and a carry output from an adjacent less significant bit to generate a sum output of the corresponding redundant binary bit.

34. The multiplier as recited in claim 26, wherein said selector includes means for generating true and complementary carries complementary to each other, and said product calculating means includes a sum circuit provided corresponding to each bit of said finally generated redundant binary number, said sum circuit includes first logic means for carrying out a negative logical product operation of an inverted value of an upper bit and an inverted value of a lower bit of a corresponding redundant binary bit, second logic means for inverting an output of said first logic means, first transmission gate means responsive to a true carry output from a less significant bit for transmitting an output of said first logic means to a sum output, and second transmission gate means responsive to a complementary carry output from said less significant bit for transmitting an output of said second logic means to said sum output.

35. The multiplier of claim 1, wherein said signal indicates a value of a digit of said first multi-bit binary number.

36. The multiplier of claim 1, wherein said signal is generated according to Booth decoding of said first multi-bit binary number.

* * * * *